US010451467B2

(12) United States Patent
Otagaki et al.

(10) Patent No.: US 10,451,467 B2
(45) Date of Patent: Oct. 22, 2019

(54) LEVEL SENSOR AND METHOD

(71) Applicant: SEMICONDUCTOR COMPONENTS INDUSTRIES, LLC, Phoenix, AZ (US)

(72) Inventors: Takayasu Otagaki, Ota (JP); Kazuyoshi Ishikawa, Oizumi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 86 days.

(21) Appl. No.: 15/516,122

(22) PCT Filed: Aug. 27, 2015

(86) PCT No.: PCT/US2015/047248
§ 371 (c)(1),
(2) Date: Mar. 31, 2017

(87) PCT Pub. No.: WO2016/057131
PCT Pub. Date: Apr. 14, 2016

(65) Prior Publication Data
US 2017/0299417 A1    Oct. 19, 2017

Related U.S. Application Data

(60) Provisional application No. 62/061,144, filed on Oct. 8, 2014.

(51) Int. Cl.
*G01F 23/26* (2006.01)
*H01L 21/00* (2006.01)

(52) U.S. Cl.
CPC .......... *G01F 23/266* (2013.01); *G01F 23/265* (2013.01); *G01F 23/268* (2013.01); *H01L 21/00* (2013.01)

(58) Field of Classification Search
CPC .... G01F 23/268; G01F 23/284; G01F 23/263; G01F 23/265; G01F 25/0061;
(Continued)

(56) References Cited

U.S. PATENT DOCUMENTS 2,990,543 A * 6/1961 Rod .................... G01F 23/2961
340/621
3,777,257 A * 12/1973 Geisselmann ........ G01F 23/265
324/609
(Continued)

FOREIGN PATENT DOCUMENTS

JP      02036314 A  *  2/1990
JP      2000121410 A *  4/2000
WO      2008143588 A1   11/2008

OTHER PUBLICATIONS

Machine translation of JP 2000-121410 A which originally published in Apr. 2000.*
(Continued)

*Primary Examiner* — David A Rogers
(74) *Attorney, Agent, or Firm* — Ramey & Schwaller, LLP

(57) ABSTRACT

In accordance with an embodiment, a method for detecting a fluid level, includes providing a fluid container having a cavity and coupling a first sensor to the fluid container, the first sensor protected from a fluid in the cavity and positioned at a first vertical level of the fluid container. The method further includes causing movement of either the first sensor or the fluid container. The first sensor is used to detect the fluid level upon causing the movement of either the first sensor or the fluid container.

19 Claims, 40 Drawing Sheets

(58) Field of Classification Search
CPC ........ G01F 23/26; G01F 23/00; G01F 23/243; G01F 23/29; G01F 23/241; G01F 23/247; G01F 23/248; G01F 23/2845; G01F 23/0007; G01F 23/2921; G01F 23/74
See application file for complete search history.

(56) References Cited

U.S. PATENT DOCUMENTS

| | | | | |
|---|---|---|---|---|
| 3,939,360 | A * | 2/1976 | Jackson | G01F 23/265 307/118 |
| 4,002,996 | A * | 1/1977 | Klebanoff | A61M 5/1684 137/392 |
| 4,201,085 | A * | 5/1980 | Larson | G01F 23/263 361/284 |
| 4,280,126 | A * | 7/1981 | White | G01F 23/2965 340/621 |
| 4,417,473 | A | 11/1983 | Tward et al. | |
| 4,553,434 | A * | 11/1985 | Spaargaren | G01F 23/263 340/620 |
| 5,017,909 | A | 5/1991 | Goekler | |
| 5,043,707 | A * | 8/1991 | Heinze | A61M 1/3624 128/DIG. 13 |
| 5,103,368 | A | 4/1992 | Hart | |
| 5,121,631 | A * | 6/1992 | Koon | G01F 23/268 340/620 |
| 5,142,909 | A * | 9/1992 | Baughman | G01F 23/247 338/38 |
| 5,223,819 | A * | 6/1993 | Marsh | G01F 23/226 200/61.21 |
| 5,565,977 | A * | 10/1996 | Rosinko | G01N 15/05 250/573 |
| 6,305,235 | B1 * | 10/2001 | Geurian | G01F 23/0007 73/290 R |
| 6,490,920 | B1 * | 12/2002 | Netzer | G01C 9/06 324/687 |
| 6,761,067 | B1 * | 7/2004 | Capano | G01F 23/265 340/620 |
| 6,823,730 | B2 * | 11/2004 | Buck | G01F 23/265 324/658 |
| 7,068,467 | B2 | 5/2006 | Urquidi | |
| 7,258,005 | B2 * | 8/2007 | Nyce | G01F 23/263 73/304 C |
| 7,640,876 | B2 * | 1/2010 | Memory | A01C 7/105 111/170 |
| 7,805,991 | B2 * | 10/2010 | Usui | B41J 2/17513 73/290 R |
| 8,201,446 | B2 * | 6/2012 | Kingdon | G01F 23/2962 73/290 V |
| 8,789,414 | B2 * | 7/2014 | Park | G01F 23/268 73/149 |
| 8,810,260 | B1 * | 8/2014 | Zhou | G01N 27/226 324/658 |
| 8,813,561 | B2 * | 8/2014 | Kataoka | B60K 15/03 73/304 C |
| 8,931,340 | B2 * | 1/2015 | Wiederkind-Klein | G01F 23/268 73/304 C |
| 8,933,789 | B1 * | 1/2015 | Fink | G06K 19/07758 340/10.1 |
| 9,336,421 | B1 * | 5/2016 | Fink | G06K 19/07749 |
| 9,832,927 | B2 * | 12/2017 | Moutton | A01F 12/44 |
| 2001/0037680 | A1 * | 11/2001 | Buck | G01F 23/265 73/304 C |
| 2008/0053202 | A1 * | 3/2008 | Rohklin | G01F 23/265 73/61.41 |
| 2008/0134779 | A1 * | 6/2008 | Tung | G01F 23/24 73/304 C |
| 2008/0202231 | A1 | 8/2008 | Sohn et al. | |
| 2011/0120218 | A1 * | 5/2011 | Aldridge | G01F 23/292 73/290 R |
| 2013/0257455 | A1 | 10/2013 | Ahne et al. | |
| 2016/0209259 | A1 * | 7/2016 | Edwards | G01F 23/0007 |
| 2016/0320221 | A1 * | 11/2016 | Chou | G01F 23/265 |

OTHER PUBLICATIONS

The International Search Report for counterpart application No. PCT/US2015/047248, dated Dec. 7, 2015, 4 pages.

* cited by examiner

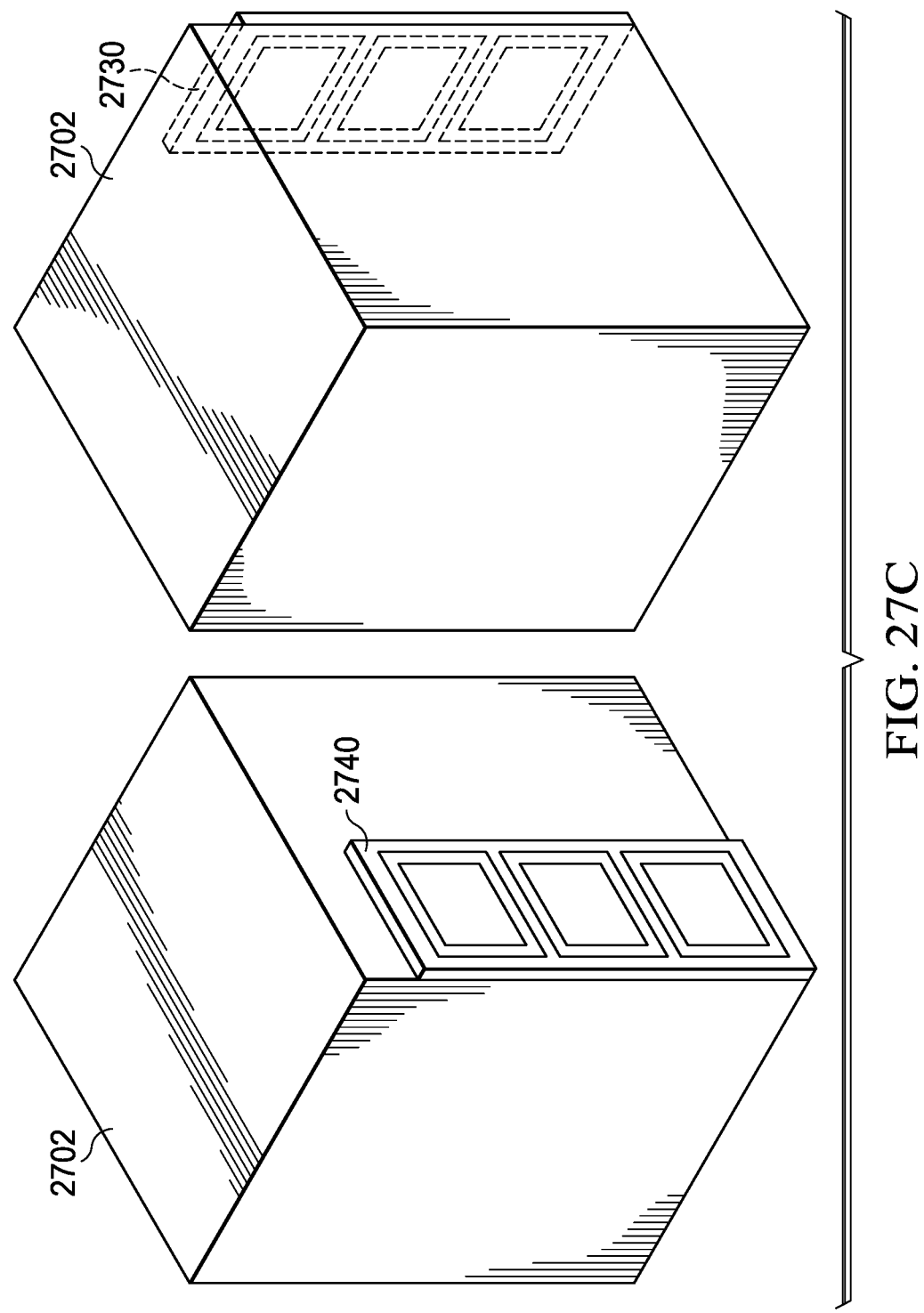

LEVEL SENSOR AND METHOD

CROSS-REFERENCE TO RELATED APPLICATION(S)

This application claims priority to U.S. Provisional Application No. 62/061,144, filed Oct. 8, 2014, the entire contents of which are incorporated by reference herein.

BACKGROUND

The present invention relates, in general, to electronics and, more particularly, to integrators and methods of forming semiconductor devices.

In the past, the semiconductor industry used various methods and sensors for detecting changes in physical attributes and generating a signal indicative of those changes. Sensors are useful in mechanical systems, chemical systems, and biological systems, among others. For example, in mechanical systems sensors are useful in providing output information based on velocity, position, movement, temperature, altitude, etc.; in chemical systems sensors are used to provide information about the chemical composition of their environment; and in biological systems sensors provide information about analytes present in a biological environment. In the electronics industry touch tensors have been used as input device for electronic devices such as mobile phones, portable audio devices, portable game consoles, televisions, and personal computers. An example of a prior electrostatic capacity type of touch sensor was disclosed in U.S. Pat. No. 8,618,818, titled "Electrostatic Capacity Type Touch Sensor" by Takayasu Otagaki et al. and published on Mar. 15, 2012. A drawback with sensors is that they are limited to uses in environments that do not corrode or otherwise damage the sensor.

Accordingly, it would be advantageous to have a sensor and method of sensing or detecting physical attributes or changes in the physical attributes. It would be of further advantage for the structure and method to be cost effective to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 27C illustrates partial perspective views of the sensor board and container.

Figure 1:
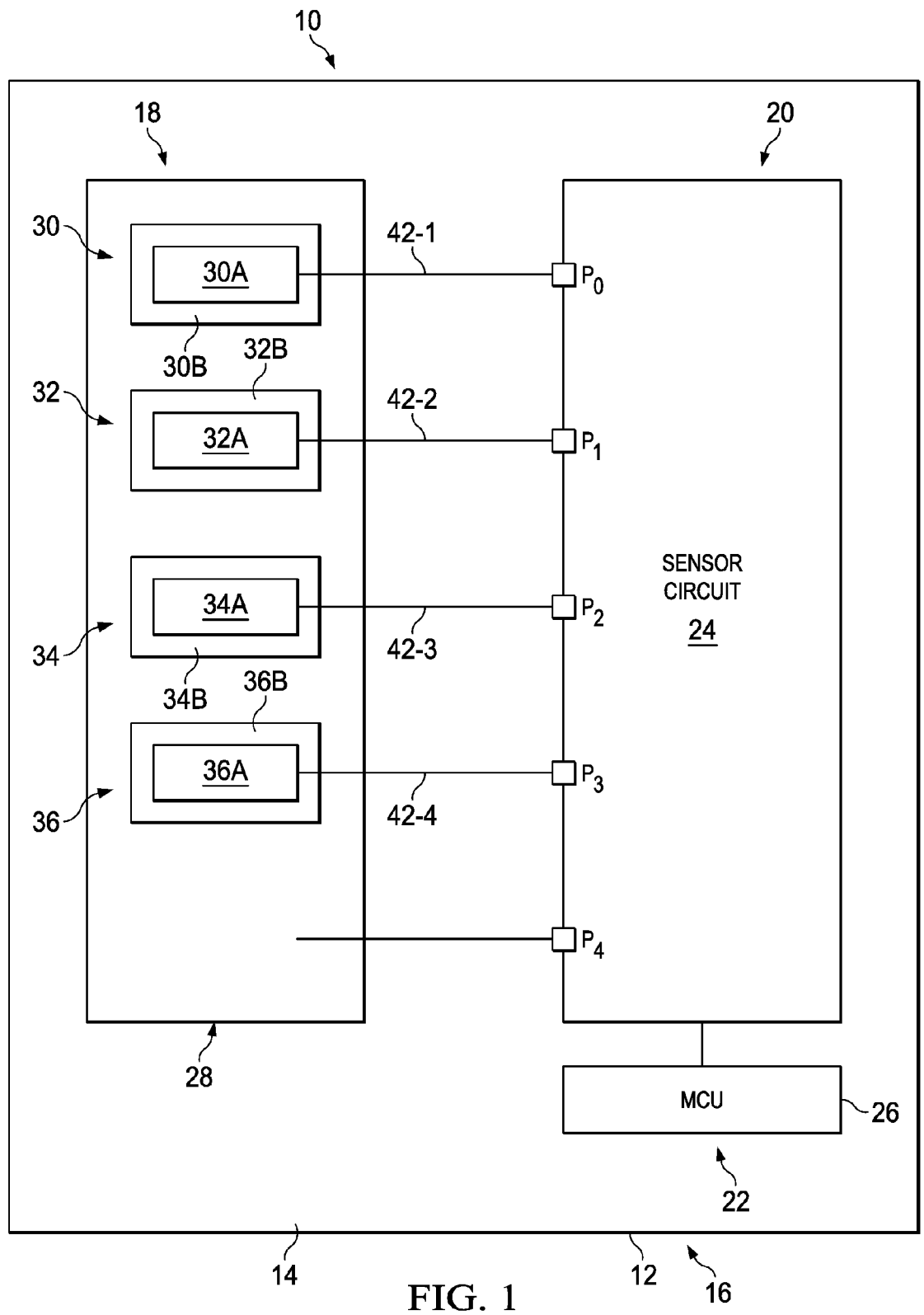
FIG. 1 is a top view of a sensor suitable for use in detecting a fluid level in a cavity of a fluid container in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage or logic low voltage level and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level, a logic high voltage, or a logic one voltage and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally, sensors in accordance with embodiments of the present invention provide structures and methods for detecting a fluid level in a container using techniques that avoid placing a sensor such as, for example a capacitive sensor in the fluid container. An advantage of determining the fluid level without placing the sensor in the container is that fluid levels of corrosive or caustic fluids in a container may be determined without damaging the sensor. For example, immersing a sensor in a tank containing bioethanol may corrode the sensor, which degrades the useful lifetime of the sensor.

In accordance with an embodiment, a capacitive sensor array may be placed on an outside of a container or tank, wherein the container is manufactured from a polymer or a nonmetallic material. The capacitive sensor array may contactlessly detect a level of a fluid surface in the container.

In accordance with another embodiment, the sensor array placed on the outside of the tank includes a drive pad and an input pad. The surface of the fluid changes an electric line of force between the drive pad and the input pad, which change is used to determine a level of the fluid.

In accordance with another embodiment, the sensor includes circuitry with storage registers. The storage registers are initialized to an initial value. Then the sensor determines fluid levels in response to movement of the fluid surface. In response to the movement being greater than one or more threshold values, the sensor determines the level of the fluid.

In accordance with another embodiment, the sensing elements are configured to detect fluids with dielectric constants different from that of air.

In accordance with another embodiment, the sensors can be configured in two or more rows to increase sensor resolution.

In accordance with another embodiment, a first electrode is attached to an outer surface of a fluid container or to the outer surface of a tank, a second electrode is attached to an outer surface of the fluid container and a third electrode is attached to the outer surface of the tank. An alternating current generator (AC) applies an AC voltage to the first electrode, the second electrode, and the third electrode, wherein the first electrode may be called a drive electrode, the second electrode an input electrode, and the third electrode a reference electrode. A first voltage occurs across a capacitance between the input electrode and the drive electrode in response to the AC voltage and a second voltage occurs across a capacitance between the reference electrode and the drive electrode in response to the AC voltage. An Analog-to-Digital converter converts the voltage difference between the first voltage and the second voltage into a digital signal, which is stored in a memory device. A digital counter is available to counts if the digital value of the voltage difference is larger or greater than a pre-set value.

In accordance with another embodiment, multiple sensors are attached vertically along the outer surface of the container. Optionally, the sensors may be spaced apart equally.

In accordance with another embodiment, the sensor has registers that are initialized in response to the sensor being powered up.

In accordance with another embodiment, the values of the sensors are adjusted in response to changes in capacitance values.

In accordance with one embodiment, an apparatus for detecting a fill level includes: a container having a cavity; a first sensor positioned at the container exterior to the cavity; a variable capacitor configured to adjust a capacitance according to a capacitance of the first sensor; a differential amplifier having an input coupled to receive a value representative of a difference between the capacitance of the variable capacitor and the capacitance of the first sensor; and a processor configured to detect the fill level of the container based on the capacitance of the variable capacitor being equal to the capacitance of the first sensor.

The variable capacitor may be further configured to adjust the capacitance of the variable capacitor to be equal to the capacitance of the first sensor. The processor may be further configured to detect the fill level further based on a comparison of the capacitance of the variable capacitor against a reference value. The reference value may be equal to the capacitance of the first sensor when the cavity of the container is empty.

The apparatus may further include a second sensor having a capacitance independent of the fill level of the container, where the reference value is equal to a capacitance of the second sensor. The second sensor may be positioned above a ceiling of the container. The second sensor may be positioned below a ceiling of the container and positioned to not face any sidewalls of the container. The first sensor may be disposed on a first surface of a sensor board, and the second sensor may be disposed on a second surface of the sensor board opposite the first surface.

The fill level may correspond to a level of a fluid or a solid material present in the cavity of the container.

According to one embodiment, an apparatus for detecting a fill level includes: a touch circuit; a first plurality of sensors coupled to the touch circuit; a first drive pad corresponding to the first plurality of sensors; a second plurality of sensors coupled to the touch circuit; a second drive pad corresponding to the second plurality of sensors; and a processor operable to activate driving of the first drive pad by the sensor circuit and to activate driving of the second drive pad by the touch circuit.

FIG. 1 is a top view of a sensor 10 suitable for use in detecting fluid levels in, for example, a cavity of a fluid container in accordance with an embodiment of the present invention. Sensor 10 comprises a substrate 12 having a top surface 14, a bottom surface 16, a sensing element area 18, and a sensor circuit receiving area 20. Substrate 12 may have a microprocessor receiving area 22. By way of example, substrate 12 is made using printed circuit board materials and manufacturing techniques. One or more sensing elements are formed in a portion of sensing element region 18, a sensor circuit 24 is mounted to sensor circuit receiving area 20, and a microprocessor 26 is mounted to microprocessor receiving area 22. In accordance with an embodiment, each sensing element includes an electrode surrounded by a dielectric material (e.g., a clearance, air, etc.) which is surrounded by an electrode. More particularly, a sensing element 30 includes an electrode 30A surrounded by dielectric material 30B (e.g., a clearance, air, etc.), which is surrounded by electrode 28, a sensing element 32 includes an electrode 32A surrounded by dielectric material 32B (e.g., a clearance, air, etc.), which is surrounded by electrode 28, a sensing element 34 includes an electrode 34A surrounded by dielectric material 34B (e.g., a clearance, air, etc.), which is surrounded by electrode 28, and a sensing element 36 includes an electrode 36A surrounded by dielectric material 36B (e.g., a clearance, air, etc.), which is surrounded by electrode 28. Thus electrode 28 is common to sensing elements 30, 32, 34, and 36. Center electrodes 30A, 32A, 34A, and 36A may be referred to as input pads Cin0, Cin1, Cin2, and Cin3, respectively, and electrode 28 may be referred to as drive pad.

Electrodes 30A, 32A, 34A, and 36A connected to sensor input terminals $P_0$, $P_1$, $P_2$, and $P_3$, respectively, of sensor circuit 24 through electrical conductors 42-1, 42-2, 42-3, and 42-4, respectively. Electrode 28 is electrically connected to input terminal $P_4$. Sensor circuit 24 is connected to microcontroller (MCU) 26.

Figure 2:
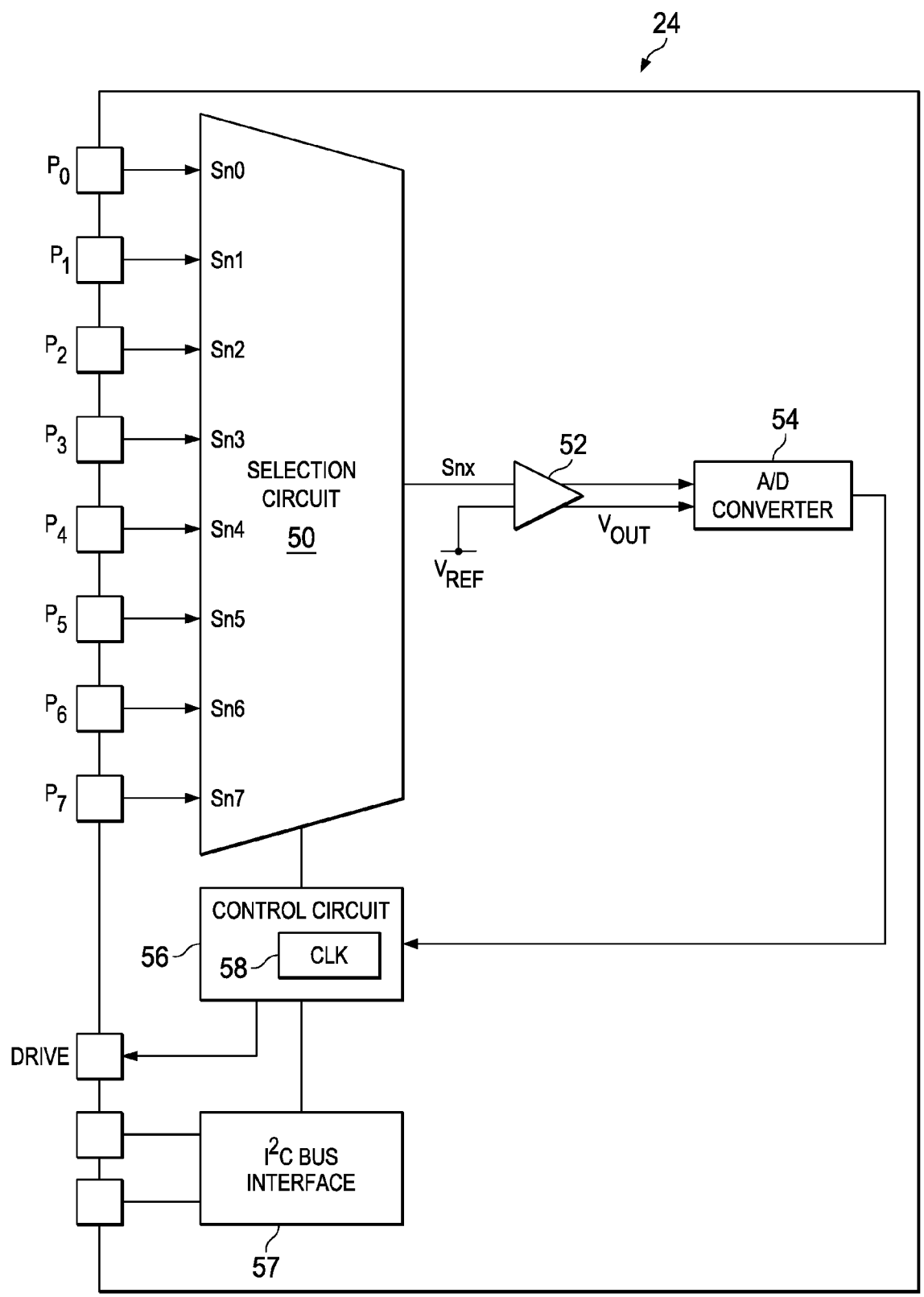
FIG. 2 is a circuit schematic of a portion of a sensor in accordance with an embodiment of the present invention.

Referring now to FIG. 2, sensor circuit 24 includes terminals $P_0$, $P_1$, $P_2$, $P_3$, $P_4$, $P_5$, $P_6$, and $P_7$, a selection circuit 50, an electric charge amplifier 52, an Analog-to-Digital converter (ADC) 54, a control circuit 56, an I²C bus interface circuit 57, and a clock source 58. More particularly, selection circuit 50 has inputs Sn0, Sn1, Sn2, Sn3, Sn4, Sn5, Sn6, and Sn7 that are connected to terminals $P_0$, $P_1$, $P_2$, $P_3$, $P_4$, $P_5$, $P_6$, and $P_7$, respectively, and an output terminal Snx. The I²C bus interface may include a serial peripheral interface (SPI). Differential amplifier 52 has an input terminal connected to output terminal Snx, an input terminal coupled for receiving a reference voltage $V_{REF}$, and a pair of differential output terminals connected to a differential input of ADC 54. The output of ADC 54 is connected to an input of control circuit 56. In addition, control circuit 56 has an output connected to an I²C Bus interface circuit 57, an output connected to selection circuit 50, and an output connected to a Drive pad.

Figure 3:
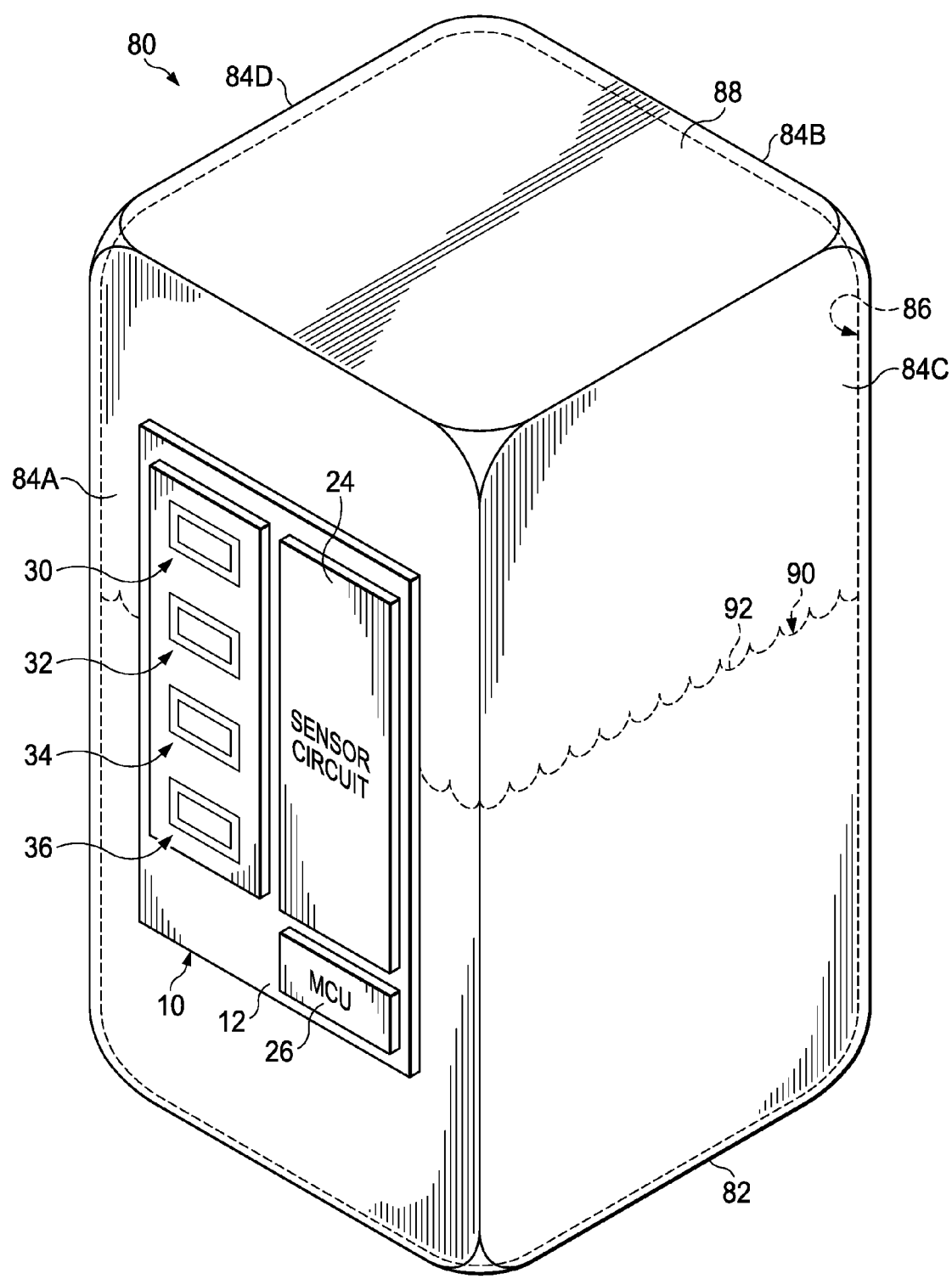
FIG. 3 is a perspective view of a fluid container having a sensor mounted thereto in accordance with an embodiment of the present invention.

FIG. 3 is an isometric view of a fluid container 80 having a floor 82, sidewalls 84A, 84B, 84C, and 84D, wherein sidewalls 84A and 84B may be substantially parallel to each other and sidewalls 84C and 84D may be substantially parallel to each other and substantially perpendicular to sidewalls 84A and 84B. Fluid container 80 is configured to have a cavity or a hollow 86 bounded by floor 82 and sidewalls 84A-84D. Fluid container 80 may have a top or ceiling 88. Fluid 90 having fluid surface 92 is shown in fluid container 80. In accordance with the embodiment of FIG. 3 sensor 10 is mounted to sidewall 84A.

Figure 4:
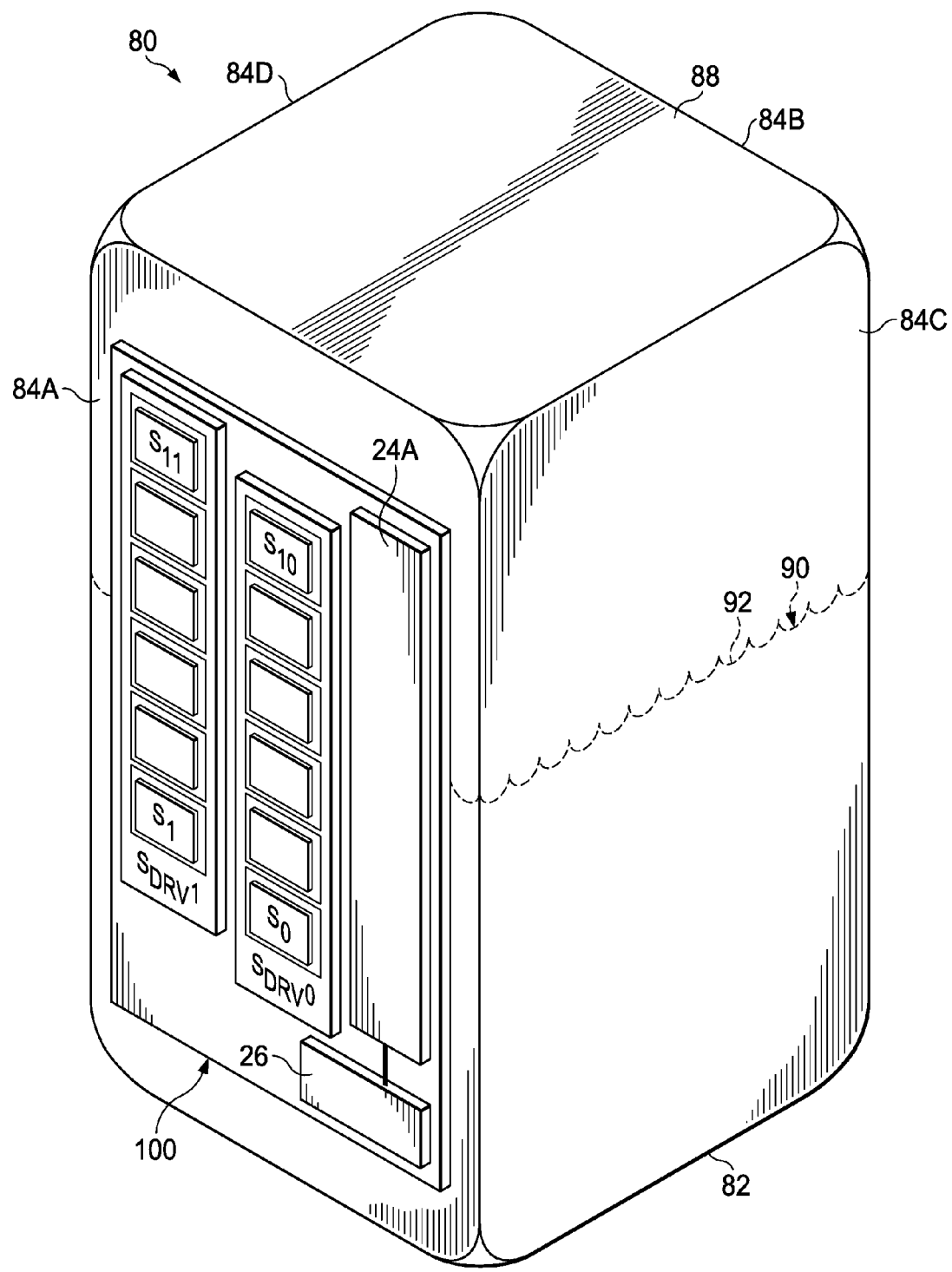
FIG. 4 is a perspective view of a fluid container having a sensor mounted thereto in accordance with an embodiment of the present invention.

FIG. 4 is an isometric view of a fluid container 80 including fluid 90 having fluid surface 92 which was described with reference to FIG. 3. In accordance with the embodiment of FIG. 4, a sensor 100 is mounted to sidewall 84A.

Figure 5:
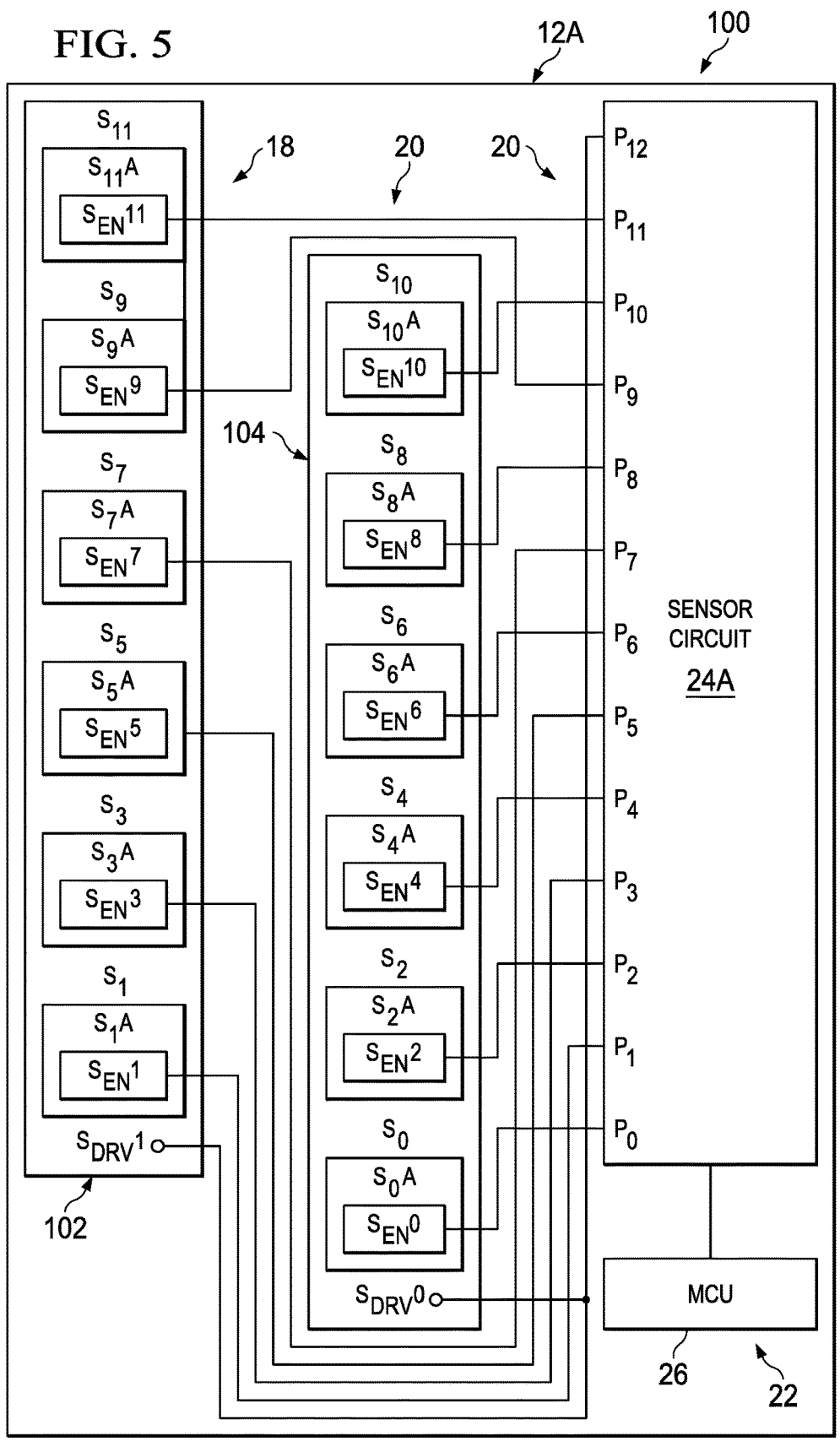
FIG. 5 is a top view of a sensor suitable for use in detecting a fluid level in a cavity of a fluid container in accordance with another embodiment of the present invention.

FIG. 5 is a top view of sensor 100 suitable for use in detecting fluid levels in, for example, a cavity of a fluid container, such as, fluid container 80, in accordance with another embodiment of the present invention. Sensor 100 is comprised of a substrate 12A having a top surface, a bottom surface, a sensor element area 18, and a sensor circuit receiving area 20. Substrate 12A may have a microcontroller receiving area 22. By way of example, substrate 12A is made using printed circuit board materials and manufacturing techniques. One or more sensing elements are formed in a portion of sensing element area 18, a sensor circuit 24A is mounted to sensor circuit receiving area 20, and a microcontroller 26 may be mounted to microprocessor receiving area 22. Sensor circuit 24A is similar to sensor circuit 24 of FIG. 1, but sensor circuit 24A has more terminals and it is configured internally for connections to the additional terminals. Sensor 24A is connected to microcontroller 26.

In accordance with an embodiment, a plurality of sensing elements $S_1$, $S_3$, $S_5$, $S_7$, $S_9$, and $S_{11}$ are configured as a first column 102 of sensing elements and sensing elements $S_0$, $S_2$, $S_4$, $S_6$, $S_8$, and $S_{10}$ are configured as a second column 104 of sensing elements. In column 102, sensing element $S_1$ is comprised of an electrode $S_{EN}1$ surrounded by a dielectric material $S_1A$ (e.g., a clearance, air, etc.), which is surrounded by an electrode $S_{DRV}1$; sensing element $S_3$ is comprised of an electrode $S_{EN}3$ surrounded by a dielectric material $S_3A$ (e.g., a clearance, air, etc.), which is surrounded by an electrode $S_{DRV}1$; sensing element $S_5$ is comprised of an electrode $S_{EN}5$ surrounded by a dielectric material $S_5A$ (e.g., a clearance, air, etc.), which is surrounded by an electrode $S_{DRV}1$; sensing element $S_7$ is comprised of an electrode $S_{EN}7$ surrounded by a dielectric material $S_7A$ (e.g., a clearance, air, etc.), which is surrounded by an electrode $S_{DRV}1$; sensing element $S_9$ is comprised of an electrode $S_{EN}9$ surrounded by a dielectric material $S_9A$ (e.g., a clearance, air, etc.), which is surrounded by an electrode $S_{DRV}1$; and sensing element $S_{11}$ is comprised of an electrode $S_{EN}11$ surrounded by a dielectric material $S_{11}A$ (e.g., a clearance, air, etc.), which is surrounded by an electrode $S_{DRV}1$. It should be noted that electrode $S_{DRV}1$ is common to sensing elements $S_1$, $S_3$, $S_5$, $S_7$, $S_9$, and $S_{11}$.

In column 104, sensing element $S_0$ is comprised of an electrode $S_{EN}0$ surrounded by a dielectric material $S_0A$ (e.g., a clearance, air, etc.), which is surrounded by an electrode $S_{DRV}0$; sensing element $S_2$ is comprised of an electrode $S_{EN}2$ surrounded by a dielectric material $S_2A$ (e.g., a clearance, air, etc.), which is surrounded by an electrode $S_{DRV}0$; sensing element $S_4$ is comprised of an electrode $S_{EN}4$ surrounded by a dielectric material $S_4A$ (e.g., a clearance, air, etc.), which is surrounded by an electrode $S_{DRV}0$; sensing element $S_6$ is comprised of an electrode $S_{EN}6$ surrounded by a dielectric material $S_6A$ (e.g., a clearance, air, etc.), which is surrounded by an electrode $S_{DRV}0$; sensing element $S_8$ is comprised of an electrode $S_{EN}8$ surrounded by a dielectric material $S_8A$ (e.g., a clearance, air, etc.), which is surrounded by an electrode $S_{DRV}0$; and sensing element $S_{10}$ is comprised of an electrode $S_{EN}10$ surrounded by a dielectric material $S_{10}A$ (e.g., a clearance, air, etc.), which is surrounded by an electrode $S_{DRV}0$. It should be noted that electrode $S_{DRV}0$ is common to sensing elements $S_0$, $S_2$, $S_4$, $S_6$, $S_8$, and $S_{10}$.

Sensing elements $S_1$, $S_3$, $S_5$, $S_7$, $S_9$, and $S_{11}$ are positioned at different vertical levels, and sensing elements $S_0$, $S_2$, $S_4$, $S_6$, $S_8$, and $S_{10}$ are positioned at different vertical levels. With reference to column 102, sensing element $S_1$ is at the lowest vertical level, sensing element $S_3$ is placed at a vertical level that is higher than sensing element $S_1$, sensing element $S_5$ is placed at a vertical level that is higher than sensing element $S_3$, sensing element $S_7$ is placed at a vertical level that is higher than sensing element $S_5$, sensing element $S_9$ is placed at a vertical level that is higher than sensing element $S_7$, and sensing element $S_{11}$ is placed at a vertical level that is higher than sensing element $S_9$.

With reference to column 104, sensing element $S_0$ is at the lowest vertical level, sensing element $S_2$ is placed at a vertical level that is higher than sensing element $S_0$, sensing element $S_4$ is placed at a vertical level that is higher than sensing element $S_2$, sensing element $S_6$ is placed at a vertical level that is higher than sensing element $S_4$, sensing element $S_8$ is placed at a vertical level that is higher than sensing element $S_6$, and sensing element $S_{10}$ is placed at a vertical level that is higher than sensing element $S_8$.

With reference to columns 102 and 104, sensing element $S_0$ is at the lowest vertical level and sensing element $S_{11}$ is at the highest vertical level. Sensing element $S_1$ is placed at a vertical level that is higher than sensing element $S_0$, sensing element $S_2$ is placed at a vertical level that is higher than sensing element $S_1$, sensing element $S_3$ is placed at a vertical level that is higher than sensing element $S_2$, sensing element $S_4$ is placed at a vertical level that is higher than sensing element $S_3$, sensing element $S_5$ is placed at a vertical level that is higher than sensing element $S_4$, sensing element $S_6$ is placed at a vertical level that is higher than sensing element $S_5$, sensing element $S_7$ is placed at a vertical level that is higher than sensing element $S_6$, sensing element $S_8$ is placed at a vertical level that is higher than sensing element $S_7$, sensing element $S_9$ is placed at a vertical level that is higher than sensing element $S_8$, sensing element $S_{10}$ is placed at a vertical level that is higher than sensing element $S_9$, and sensing element $S_{11}$ is placed at a vertical level that is higher than sensing element $S_{10}$.

Figure 6:
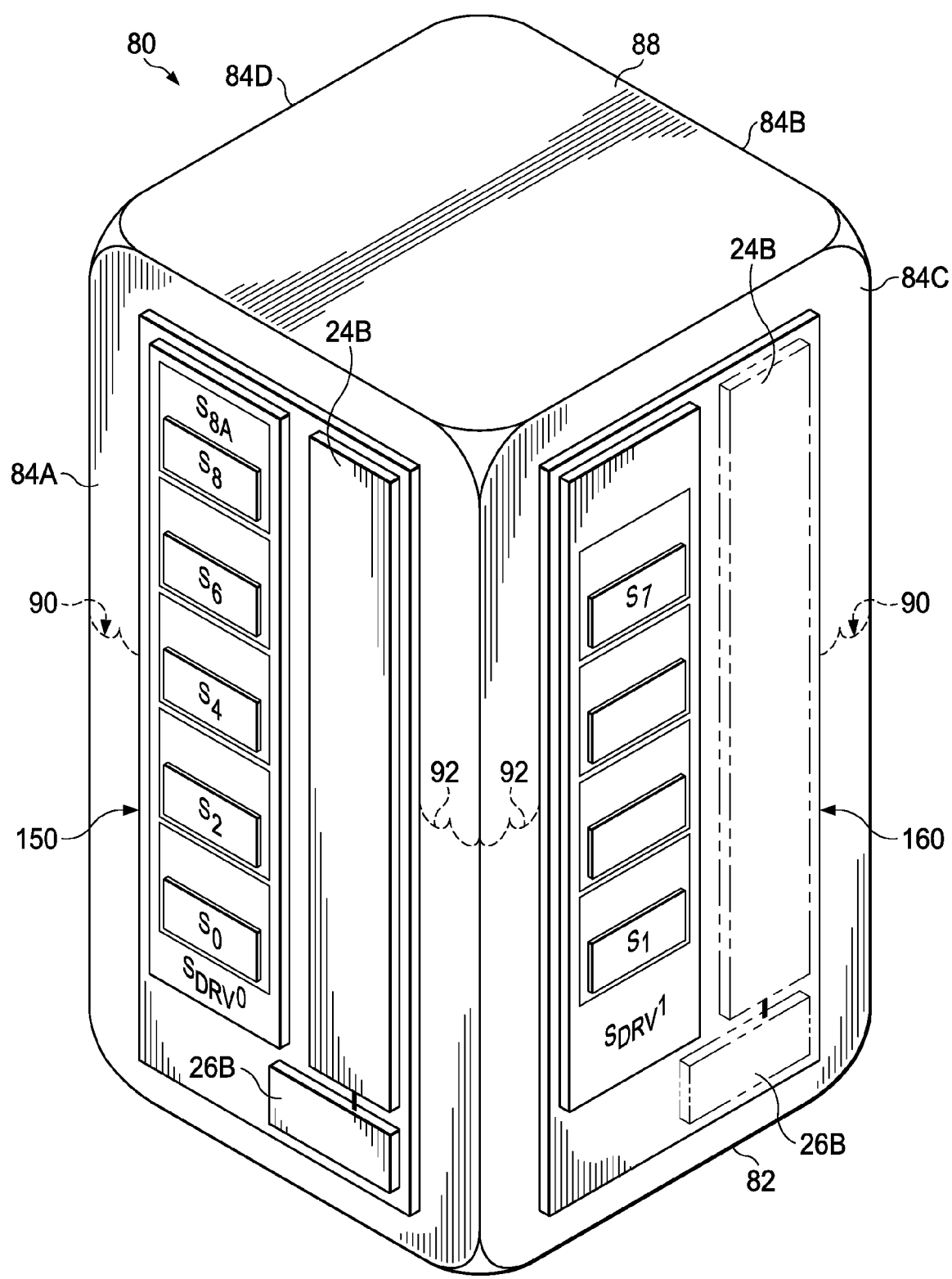
FIG. 6 is a perspective view of a fluid container having sensors mounted thereto in accordance with another embodiment of the present invention.

FIG. 6 is an isometric view of a fluid container 80 containing fluid 90 having fluid surface 92 which was described with reference to FIG. 3. In accordance with the embodiment of FIG. 6, a sensor 150 is mounted to sidewall 84A and a sensor 160 is mounted to sidewall 84C.

Figure 6A:
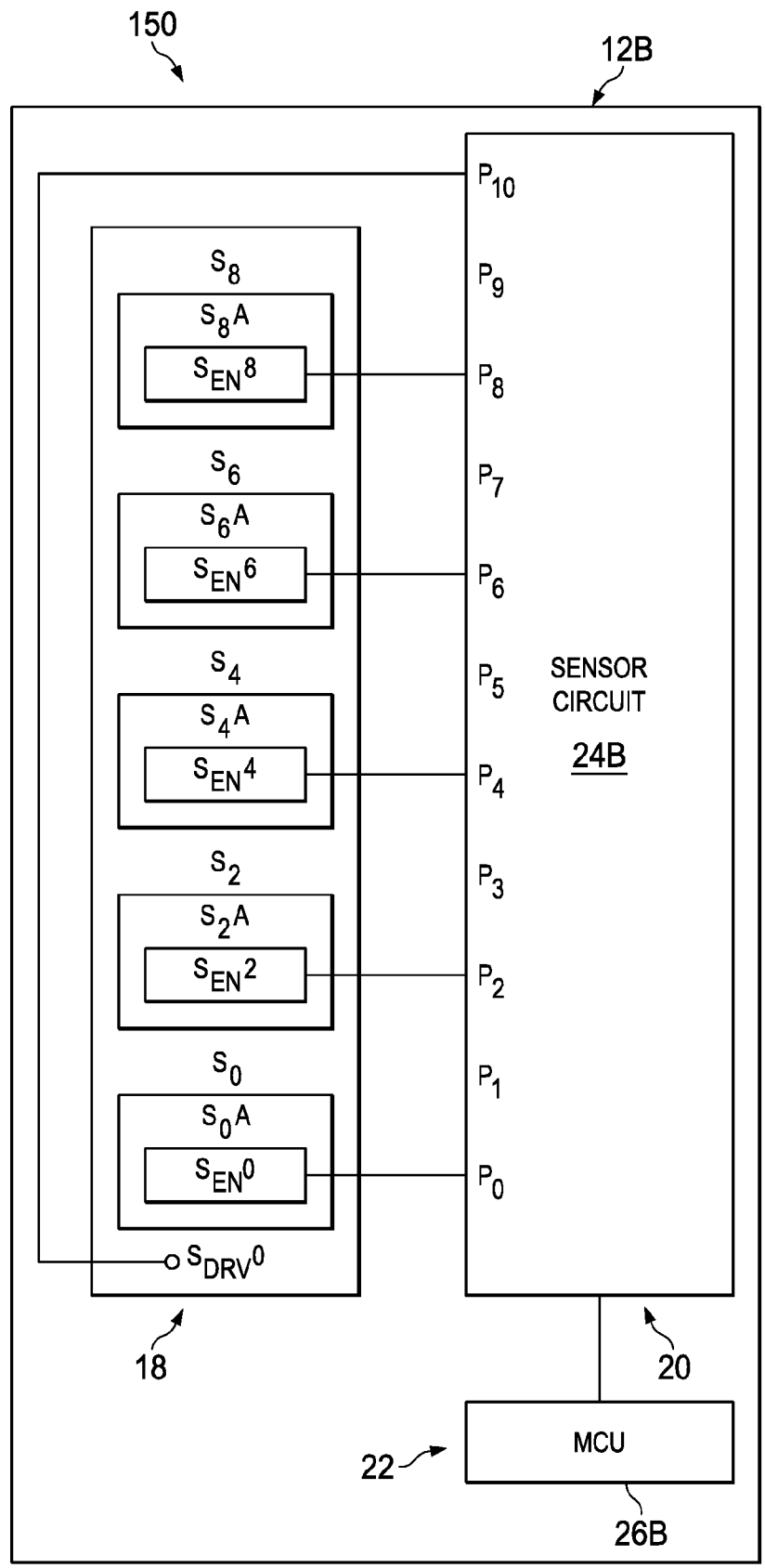
FIG. 6A is a top view of a sensor of FIG. 6 in accordance with another embodiment of the present invention.

FIG. 6A is a top view of sensor 150 suitable for use in detecting fluid levels in, for example, a cavity of a fluid container in accordance with another embodiment of the present invention. Sensor 150 comprises substrate 12B having a top surface, a bottom surface, a sensor element area 18, a sensor circuit receiving area 20, and a microcontroller receiving area 22. By way of example, substrate 12B is made using printed circuit board materials and manufacturing techniques. One or more sensing elements are formed in a portion of sensing element area 18, a sensor circuit 24B is mounted to a sensor circuit receiving area 20, and a microcontroller 26B may be mounted to microprocessor receiving area 22.

In accordance with an embodiment, a plurality of sensing elements $S_0$, $S_2$, $S_4$, $S_6$, and $S_8$ are on or from substrate 12B. Sensing element $S_0$ is comprised of an electrode $S_{EN}0$ surrounded by a dielectric material $S_0A$ (e.g., a clearance, air, etc.), which is surrounded by an electrode $S_{DRV}0$; sensing element $S_2$ is comprised of an electrode $S_{EN}2$ surrounded by a dielectric material $S_2A$ (e.g., a clearance, air, etc.), which is surrounded by an electrode $S_{DRV}0$; sensing element $S_4$ is comprised of an electrode $S_{EN}4$ surrounded by a dielectric material $S_4A$ (e.g., a clearance, air, etc.), which is surrounded by an electrode $S_{DRV}0$; sensing element $S_6$ is comprised of an electrode $S_{EN}6$ surrounded by a dielectric material $S_6A$ (e.g., a clearance, air, etc.), which is surrounded by an electrode $S_{DRV}0$; and sensing element $S_8$ is comprised of an electrode $S_{EN}8$ surrounded by a dielectric material $S_8A$ (e.g., a clearance, air, etc.), which is surrounded by an electrode $S_{DRV}0$. It should be noted that electrode $S_{DRV}0$ is common to sensing elements $S_0$, $S_2$, $S_4$, $S_6$, and $S_8$.

Sensing element $S_0$ is at the lowest vertical level, sensing element $S_2$ is placed at a vertical level that is higher than sensing element $S_0$, sensing element $S_4$ is placed at a vertical level that is higher than sensing element $S_2$, sensing element $S_6$ is placed at a vertical level that is higher than sensing element $S_4$, and sensing element $S_8$ is placed at a vertical level that is higher than sensing element $S_6$.

Sensing element $S_0$ is electrically connected to terminal $P_0$, sensing element $S_2$ is electrically connected to terminal $P_2$, sensing element $S_4$ is electrically connected to terminal $P_4$, sensing element $S_6$ is electrically connected to terminal $P_6$, and sensing element $S_8$ is electrically connected to terminal $P_8$. Electrode $S_{DRV}0$ is electrically connected to terminal $P_{10}$.

Figure 6B:
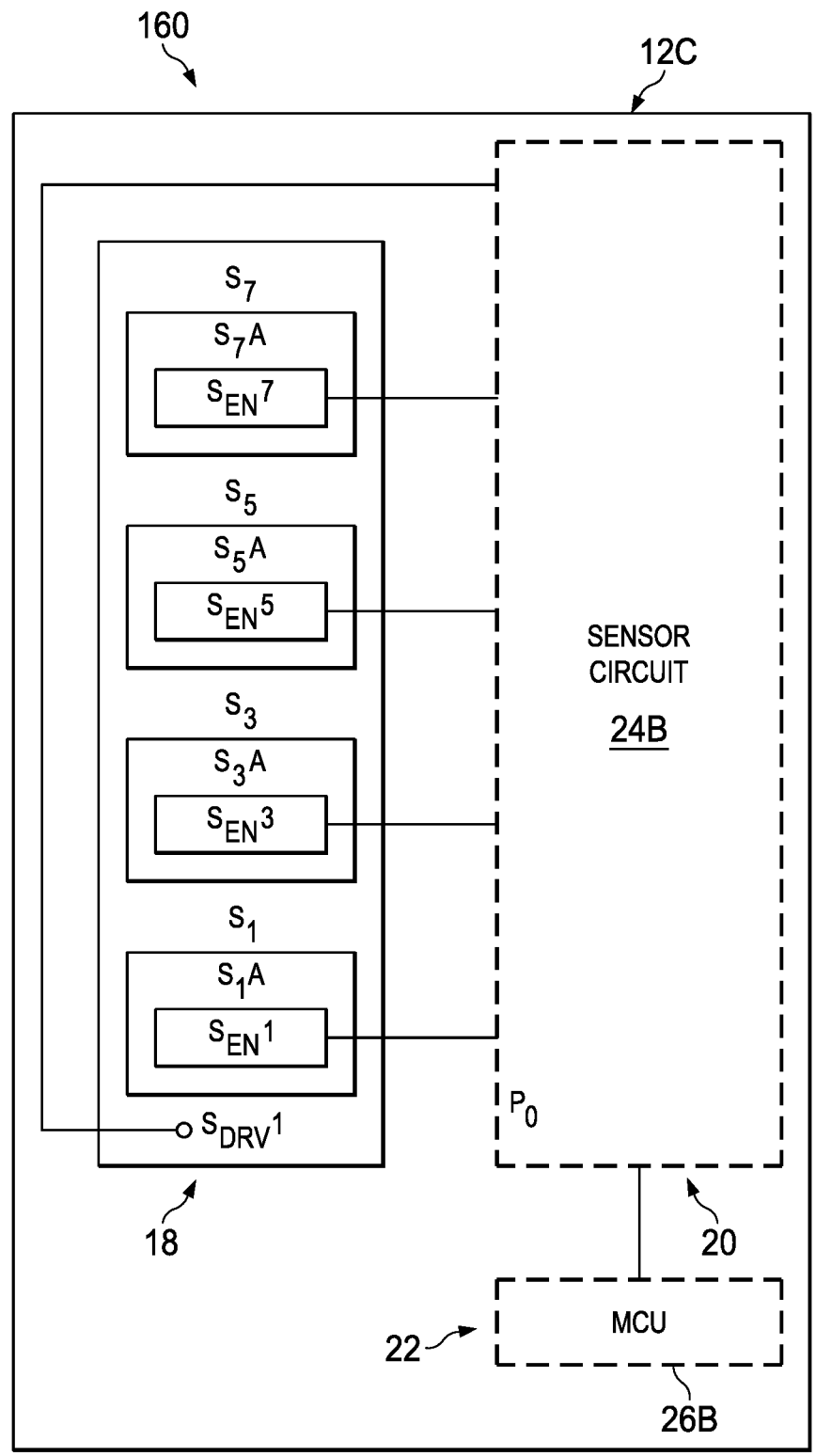
FIG. 6B is a top view of another sensor of FIG. 6 in accordance with another embodiment of the present invention.

FIG. 6B is a top view of sensor 160 suitable for use in detecting fluid levels in, for example, a cavity of a fluid container in accordance with another embodiment of the present invention. Sensor 160 comprises substrate 12C having a top surface, a bottom surface, a sensor element area 18, a sensor circuit receiving area 20, and a microcontroller receiving area 22. By way of example, substrate 12C is made using printed circuit board materials and manufacturing techniques. One or more sensing elements are formed in a portion of sensing element area 18. It should be noted that sensor circuit 24B of sensor 160 and microcontroller 26B of sensor 160 are identified by broken lines because they may not necessarily be present on substrate 12C (e.g., sensor circuit 24B and microcontroller 26B may be located elsewhere). In this embodiment, the sensing elements of sensor 160 are connected to sensor circuit 24B shown on substrate 12B. However, they are shown on substrate 12C to show where the sensor elements of sensor 160 connect to sensor circuit 24B of sensor 150. However, it should be appreciated that in some embodiments it may be desirable to include a sensor circuit (e.g., sensor circuit 24B) and a microcontroller (e.g., microcontroller 26B) on substrate 12C.

In accordance with an embodiment, a plurality of sensing elements $S_1$, $S_3$, $S_5$, and $S_7$ are on or from substrate 12C. Sensing element $S_1$ is comprised of an electrode $S_{EN}1$ surrounded by a dielectric material $S_1A$ (e.g., a clearance, air, etc.), which is surrounded by an electrode $S_{DRV}1$; sensing element $S_3$ is comprised of an electrode $S_{EN}3$ surrounded by a dielectric material $S_3A$ (e.g., a clearance, air, etc.), which is surrounded by an electrode $S_{DRV}1$; sensing element $S_5$ is comprised of an electrode $S_{EN}5$ surrounded by a dielectric material $S_5A$ (e.g., a clearance, air, etc.), which is surrounded by an electrode $S_{DRV}1$; and sensing element $S_7$ is comprised of an electrode $S_{EN}7$ surrounded by a dielectric material $S_7A$ (e.g., a clearance, air, etc.), which is surrounded by an electrode $S_{DRV}1$. It should be noted that electrode $S_{DRV}1$ is common to sensing elements $S_1$, $S_3$, $S_5$, and $S_7$.

Sensing element $S_1$ is at the lowest vertical level, sensing element $S_3$ is placed at a vertical level that is higher than sensing element $S_1$, sensing element $S_5$ is placed at a vertical level that is higher than sensing element $S_3$, and sensing element $S_7$ is placed at a vertical level that is higher than sensing element $S_5$.

Sensing element $S_1$ is electrically connected to terminal $P_1$, sensing element $S_3$ is electrically connected to terminal $P_3$, sensing element $S_5$ is electrically connected to terminal $P_5$, and sensing element $S_7$ is electrically connected to terminal $P_7$. Electrode $S_{DRV}1$ is electrically connected to terminal $P_{10}$.

Sensor 150 is mounted to sidewall 84A and sensor 160 is mounted to sidewall 84C such that sensing element $S_0$ is at the lowest vertical level, sensing element $S_1$ is placed at a vertical level that is higher than sensing element $S_0$, sensing element $S_2$ is placed at a vertical level that is higher than sensing element $S_1$, sensing element $S_3$ is placed at a vertical level that is higher than sensing element $S_2$, sensing element $S_4$ is placed at a vertical level that is higher than sensing element $S_3$, sensing element $S_5$ is placed at a vertical level that is higher than sensing element $S_4$, sensing element $S_6$ is placed at a vertical level that is higher than sensing element $S_5$, sensing element $S_7$ is placed at a vertical level that is higher than sensing element $S_6$, and sensing element $S_8$ is placed at a vertical level that is higher than sensing element $S_7$.

Figure 7:
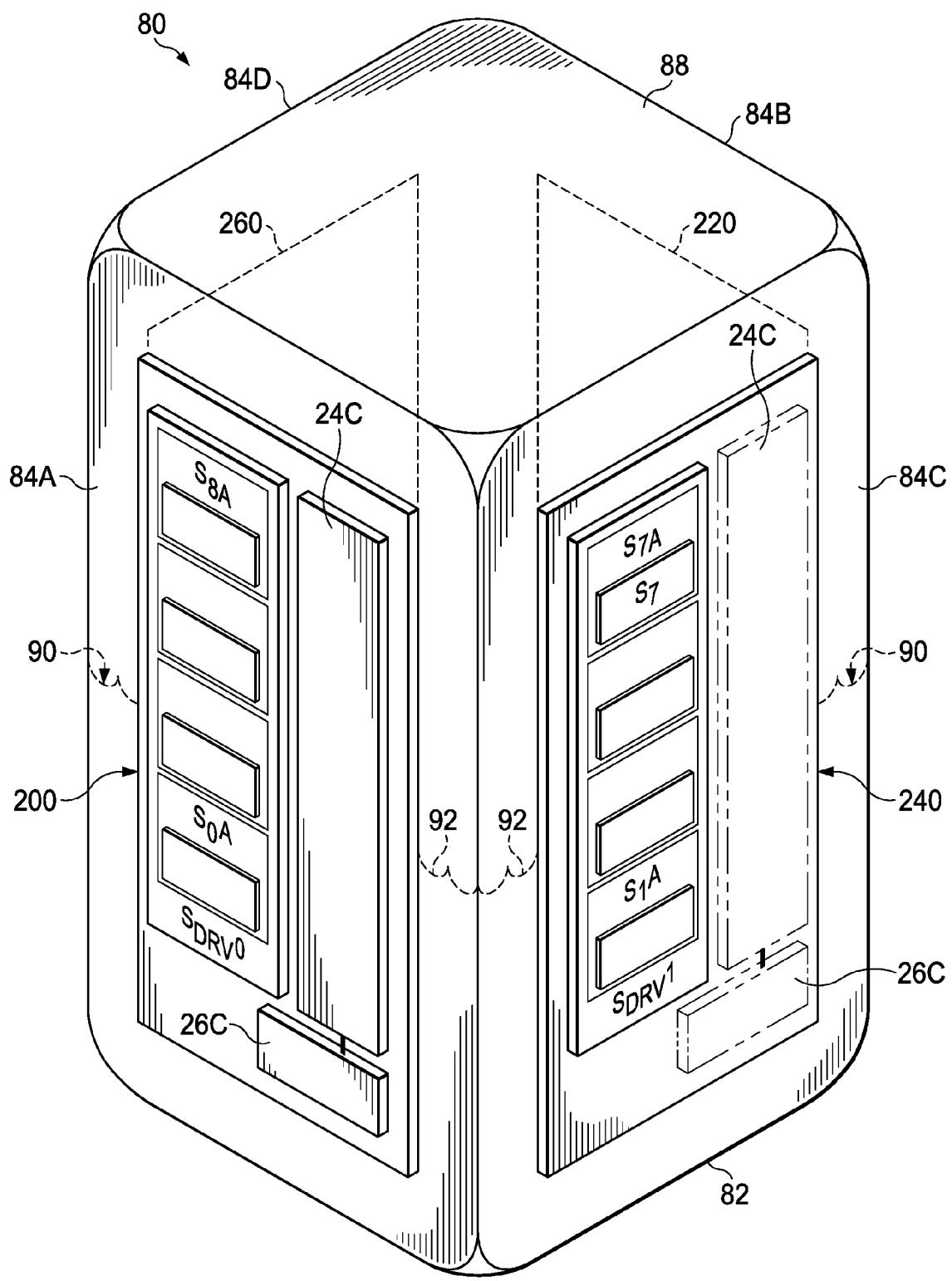
FIG. 7 is a perspective view of a fluid container having sensors mounted thereto in accordance with another embodiment of the present invention.

FIG. 7 is an isometric view of a fluid container 80 that contains fluid 90 having fluid surface 92 which was described with reference to FIG. 3. In accordance with the embodiment of FIG. 7, a sensor 200 is mounted to sidewall 84A, a sensor 220 is mounted to sidewall 84B, a sensor 240 is mounted to a sidewall 84C, and a sensor 260 is mounted to sidewall 84D.

Figure 7A:
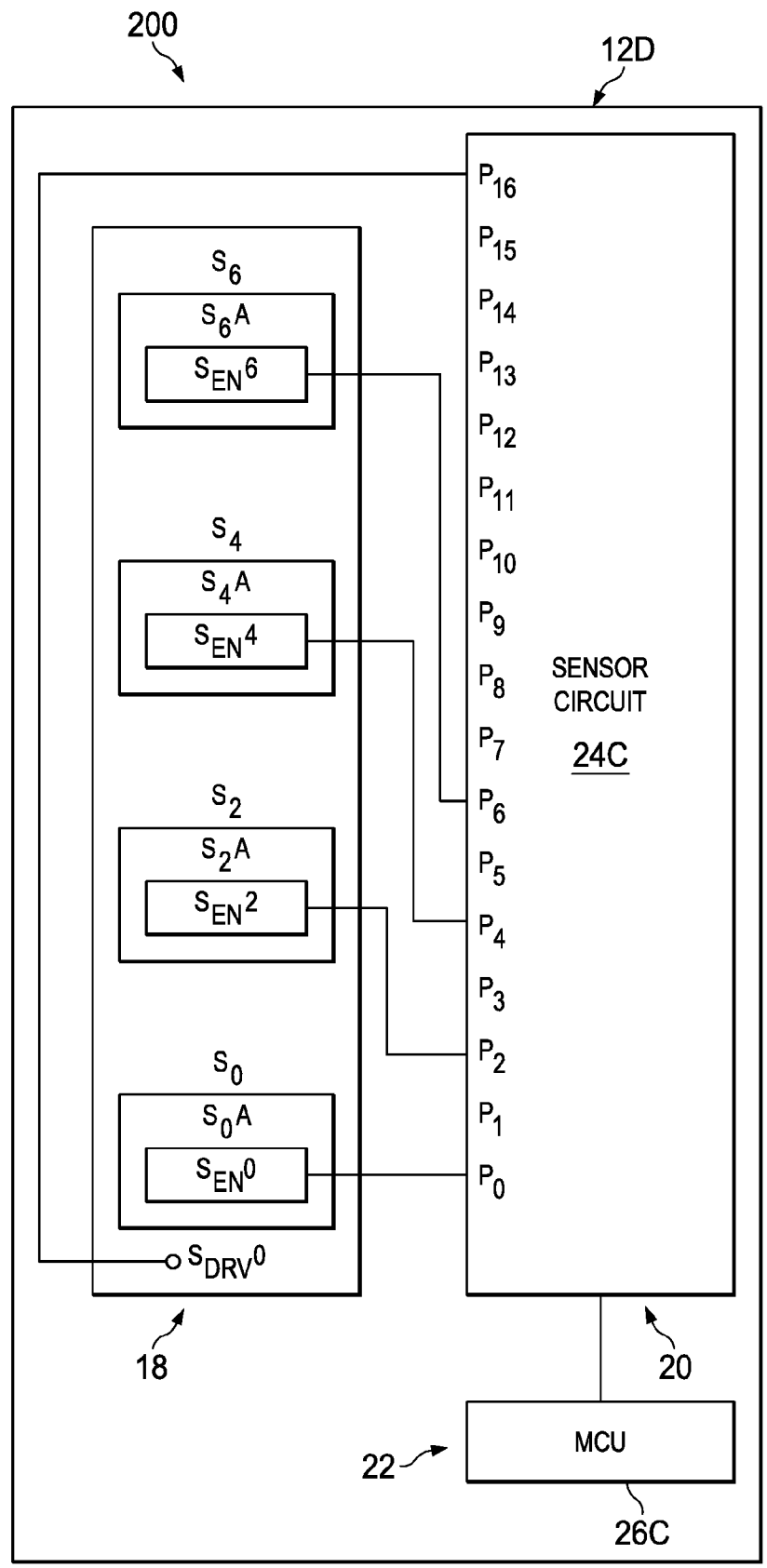
FIG. 7A is a top view of a sensor of FIG. 7 in accordance with another embodiment of the present invention.

FIG. 7A is a top view of sensor 200 suitable for use in detecting fluid levels in, for example, a cavity of a fluid container in accordance with another embodiment of the present invention. Sensor 200 comprises substrate 12D having a top surface, a bottom surface, a sensor element area 18, and a sensor circuit receiving area 20, and a microcontroller receiving area 22. By way of example, substrate 12D is made using printed circuit board materials and manufacturing techniques. One or more sensing elements are formed in a portion of sensing element area 18, a sensor circuit 24C is mounted to sensor circuit receiving area 20, and a microcontroller 26C is mounted to microprocessor receiving area 22.

In accordance with an embodiment, a plurality of sensing elements $S_0$, $S_2$, $S_4$, and $S_6$ are on or from substrate 12D. Sensing element $S_0$ is comprised of an electrode $S_{EN}0$ surrounded by a dielectric material $S_0A$ (e.g., a clearance, air, etc.), which is surrounded by an electrode $S_{DRV}0$; sensing element $S_2$ is comprised of an electrode $S_{EN}2$ surrounded by a dielectric material $S_2A$ (e.g., a clearance, air, etc.), which is surrounded by an electrode $S_{DRV}0$; sensing element $S_4$ is comprised of an electrode $S_{EN}4$ surrounded by a dielectric material $S_4A$ (e.g., a clearance, air, etc.), which is surrounded by an electrode $S_{DRV}0$; and sensing element $S_6$ is comprised of an electrode $S_{EN}6$ surrounded by a dielectric material $S_6A$ (e.g., a clearance, air, etc.), which is surrounded by an electrode $S_{DRV}0$. It should be noted that electrode $S_{DRV}0$ is common to sensing elements $S_0$, $S_2$, $S_4$, and $S_6$.

Sensing element $S_0$ is at the lowest vertical level, sensing element $S_2$ is placed at a vertical level that is higher than sensing element $S_0$, sensing element $S_4$ is placed at a vertical level that is higher than sensing element $S_2$, and sensing element $S_6$ is placed at a vertical level that is higher than sensing element $S_4$.

Sensing element $S_0$ is electrically connected to terminal $P_0$, sensing element $S_2$ is electrically connected to terminal $P_2$, sensing element $S_4$ is electrically connected to terminal $P_4$, and sensing element $S_6$ is electrically connected to terminal $P_6$. More particularly, electrode $S_{EN}0$ is electrically connected to terminal $P_0$, electrode $S_{EN}2$ $S_2$ is electrically connected to terminal $P_2$, electrode $S_{EN}4$ is electrically connected to terminal $P_4$, and electrode $S_{EN}6$ is electrically connected to terminal $P_6$. Electrode $S_{DRV}0$ is electrically connected to terminal $P_{16}$.

Figure 7B:
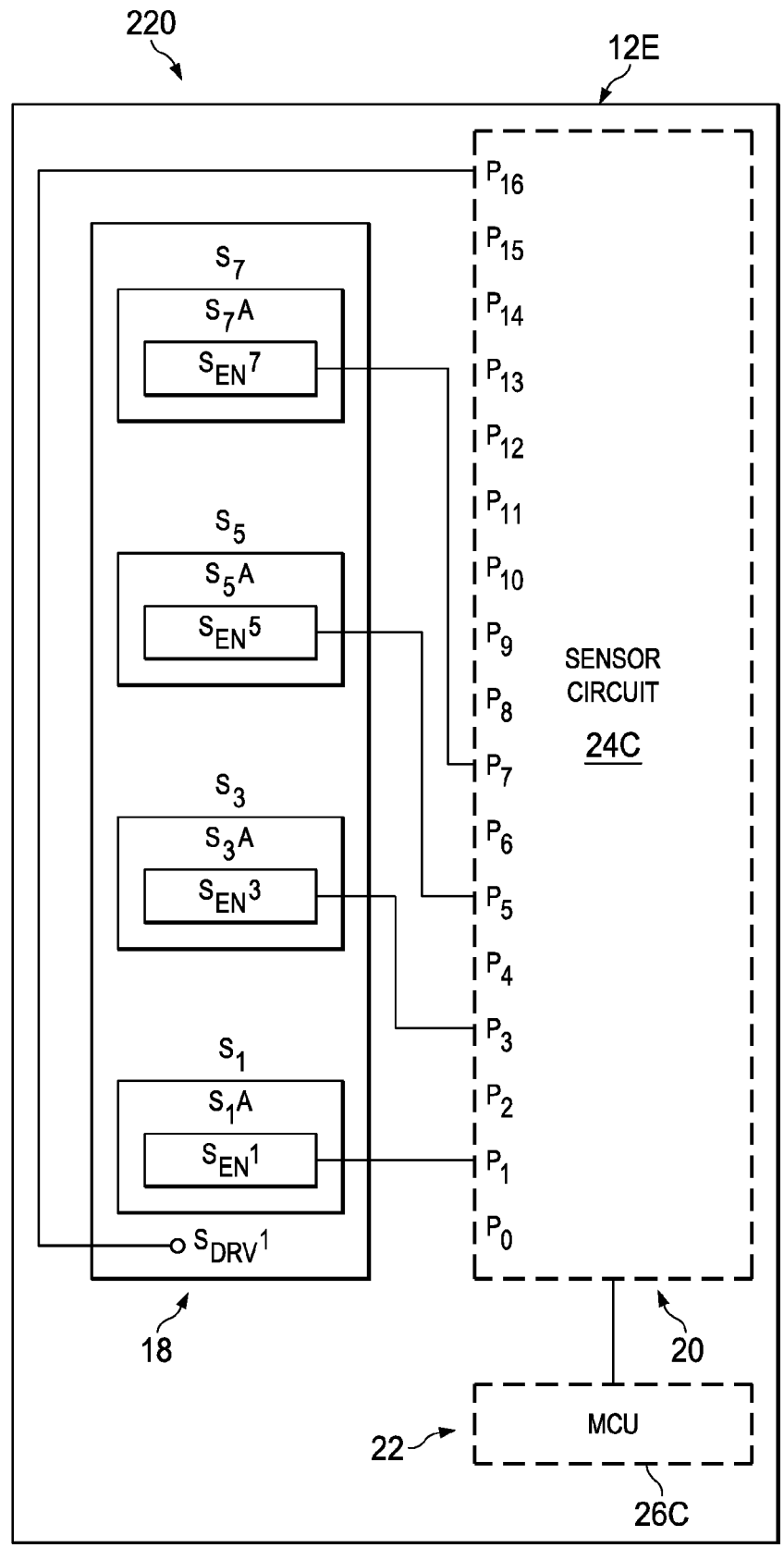
FIG. 7B is a top view of another sensor of FIG. 7 in accordance with another embodiment of the present invention.

FIG. 7B is a top view of sensor 220 suitable for use in detecting fluid levels in, for example, a cavity of a fluid container in accordance with another embodiment of the present invention. Sensor 220 comprises substrate 12E having a top surface, a bottom surface, a sensor element area 18, and a sensor circuit receiving area 20, and a microcontroller receiving area 22. By way of example, substrate 12E is made using printed circuit board materials and manufacturing techniques. One or more sensing elements are formed in a portion of sensing element area 18. It should be noted that sensor circuit 24C of sensor 220 and microcontroller 26C of sensor 220 are identified by broken lines because they are not present on substrate 12E. In this embodiment, the sensing elements of sensor 220 are connected to sensor circuit 24C shown on substrate 12D. However, they are shown on substrate 12E to show where the sensor elements of sensor 220 connect to sensor circuit 24C of sensor 200. However, it should be appreciated that in some embodiments it may be desirable to include a sensor circuit and a microcontroller on substrate 12E.

In accordance with an embodiment, a plurality of sensing elements $S_1$, $S_3$, $S_5$, and $S_7$ are formed on or from substrate 12E. Sensing element $S_1$ is comprised of an electrode $S_{EN}1$ surrounded by a dielectric material $S_1A$ (e.g., a clearance, air, etc.), which is surrounded by an electrode $S_{DRV}1$; sensing element $S_3$ is comprised of an electrode $S_{EN}3$ surrounded by a dielectric material $S_3A$ (e.g., a clearance, air, etc.), which is surrounded by an electrode $S_{DRV}1$; sensing element $S_5$ is comprised of an electrode $S_{EN}5$ surrounded by a dielectric material $S_5A$ (e.g., a clearance, air, etc.), which is surrounded by an electrode $S_{DRV}1$; and sensing element $S_7$ is comprised of an electrode $S_{EN}7$ surrounded by a dielectric material $S_7A$ (e.g., a clearance, air, etc.), which is surrounded by an electrode $S_{DRV}1$. It should be noted that electrode $S_{DRV}1$ is common to sensing elements $S_1$, $S_3$, $S_5$, and $S_7$.

Sensing element $S_1$ is at the lowest vertical level, sensing element $S_3$ is placed at a vertical level that is higher than sensing element $S_1$, sensing element $S_5$ is placed at a vertical level that is higher than sensing element $S_3$, and sensing element $S_7$ is placed at a vertical level that is higher than sensing element $S_5$.

Sensing element $S_1$ is electrically connected to terminal $P_1$, sensing element $S_3$ is electrically connected to terminal $P_3$, sensing element $S_5$ is electrically connected to terminal $P_5$, and sensing element $S_7$ is electrically connected to terminal $P_7$. More particularly, electrode $S_{EN}1$ is electrically connected to terminal $P_1$, electrode $S_{EN}3$ is electrically connected to terminal $P_3$, electrode $S_{EN}5$ is electrically connected to terminal $P_5$, and electrode $S_{EN}7$ is electrically connected to terminal $P_7$. Electrode $S_{DRV}1$ is electrically connected to terminal $P_{16}$.

Figure 7C:
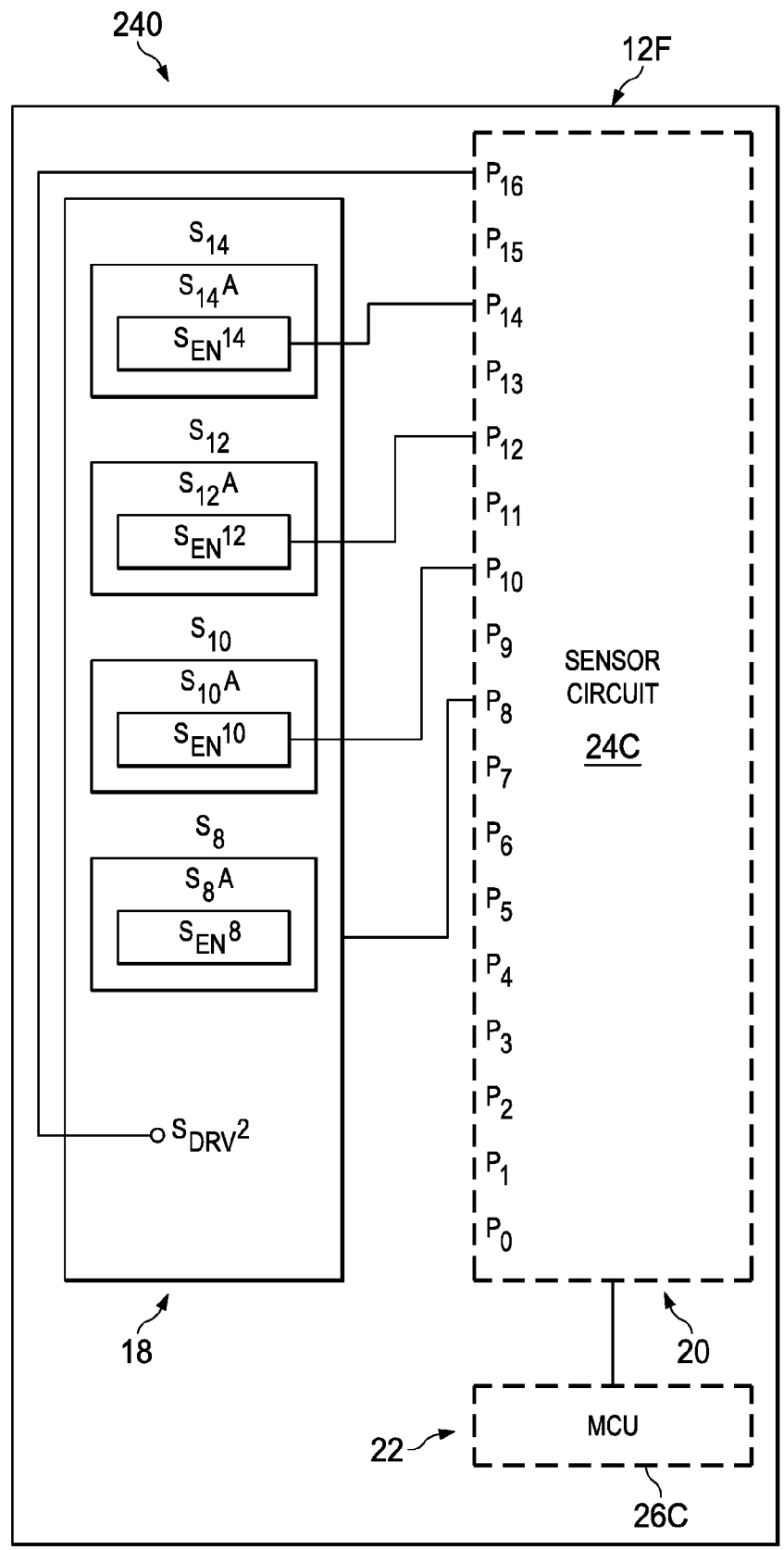
FIG. 7C is a top view of a sensor of FIG. 7 in accordance with another embodiment of the present invention.

FIG. 7C is a top view of sensor 240 suitable for use in detecting fluid levels in, for example, a cavity of a fluid container in accordance with another embodiment of the present invention. Sensor 240 comprises substrate 12F having a top surface, a bottom surface, a sensor element area 18, and a sensor circuit receiving area 20, and a microcontroller receiving area 22. By way of example, substrate 12F is made using printed circuit board materials and manufacturing techniques. One or more sensing elements are formed in a portion of sensing element area 18. It should be noted that sensor circuit 24C of sensor 240 and microcontroller 26C of sensor 240 are identified by broken lines because they are not present on substrate 12F. In this embodiment, the sensing elements of sensor 240 are connected to sensor circuit 24C shown on substrate 12D. However, they are shown on substrate 12F to show where the sensor elements of sensor 240 connect to sensor circuit 24C of sensor 200. However, it should be appreciated that in some embodiments it may be desirable to include a sensor circuit and a microcontroller on substrate 12F.

In accordance with an embodiment, a plurality of sensing elements $S_8$, $S_{10}$, $S_{12}$, and $S_{14}$ are formed on or from substrate 12F. Sensing element $S_8$ is comprised of an electrode $S_{EN}8$ surrounded by a dielectric material $S_8A$ (e.g., a clearance, air, etc.), which is surrounded by an electrode $S_{DRV}2$; sensing element $S_{10}$ is comprised of an electrode $S_{EN}10$ surrounded by a dielectric material $S_{10}A$ (e.g., a clearance, air, etc.), which is surrounded by electrode $S_{DRV}2$; sensing element $S_{12}$ is comprised of an electrode $S_{EN}12$ surrounded by a dielectric material $S_{12}A$ (e.g., a clearance, air, etc.), which is surrounded by electrode $S_{DRV}2$; and sensing element $S_{14}$ is comprised of an electrode $S_{EN}14$ surrounded by a dielectric material $S_{14}A$ (e.g., a clearance, air, etc.), which is surrounded by electrode $S_{DRV}2$. It should be noted that electrode $S_{DRV}2$ is common to sensing elements $S_8$, $S_{10}$, $S_{12}$, and $S_{14}$.

Sensing element $S_8$ is at the lowest vertical level, sensing element $S_{10}$ is placed at a vertical level that is higher than sensing element $S_8$, sensing element $S_{12}$ is placed at a vertical level that is higher than sensing element $S_{10}$, and sensing element $S_{14}$ is placed at a vertical level that is higher than sensing element $S_{12}$.

Sensing element $S_8$ is electrically connected to terminal $P_8$, sensing element $S_{10}$ is electrically connected to terminal $P_{10}$, sensing element $S_{12}$ is electrically connected to terminal $P_{12}$, and sensing element $S_{14}$ is electrically connected to terminal $P_{14}$. More particularly, electrode $S_{EN}8$ is electrically connected to terminal $P_8$, electrode $S_{EN}10$ is electrically connected to terminal $P_{10}$, electrode $S_{EN}12$ is electrically connected to terminal $P_{12}$, and electrode $S_{EN}14$ is electrically connected to terminal $P_{14}$. Electrode $S_{DRV}2$ is electrically connected to terminal $P_{16}$.

Figure 7D:
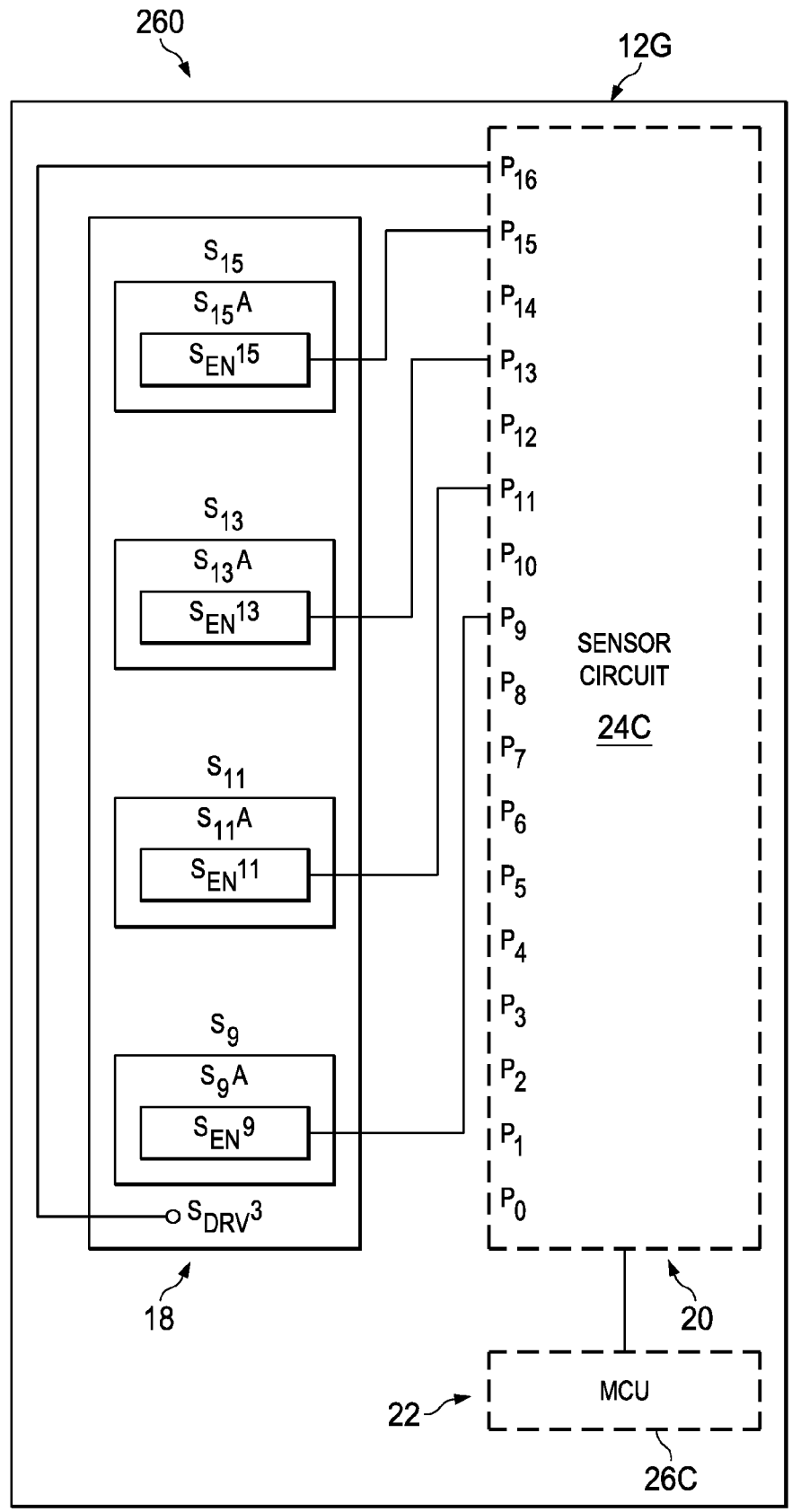
FIG. 7D is a top view of another sensor of FIG. 7 in accordance with another embodiment of the present invention.

FIG. 7D is a top view of sensor 260 suitable for use in detecting fluid levels in, for example, a cavity of a fluid container in accordance with another embodiment of the present invention. Sensor 260 comprises substrate 12G having a top surface, a bottom surface, a sensor element area 18, and a sensor circuit receiving area 20, and a microcontroller receiving area 22. By way of example, substrate 12G is made using printed circuit board materials and manufacturing techniques. One or more sensing elements are formed in a portion of sensing element area 18. It should be noted that sensor circuit 24C of sensor 260 and microcontroller 26C of sensor 260 are identified by broken lines because they are not present on substrate 12G. In this embodiment, the sensing elements of sensor 240 are connected to sensor circuit 24C shown on substrate 12D. However, they are shown on substrate 12G to show where the sensor elements of sensor 260 connect to sensor circuit 24C of sensor 200. However, it should be appreciated that in some embodiments it may be desirable to include a sensor circuit and a microcontroller on substrate 12G.

In accordance with an embodiment, a plurality of sensing elements $S_9$, $S_{11}$, $S_{13}$, and $S_{15}$ are formed on or from substrate 12G. Sensing element $S_9$ is comprised of an electrode $S_{EN}9$ surrounded by a dielectric material $S_9A$ (e.g., a clearance, air, etc.), which is surrounded by an electrode $S_{DRV}3$; sensing element $S_{11}$ is comprised of an electrode $S_{EN}11$ surrounded by a dielectric material $S_{11}A$ (e.g., a clearance, air, etc.), which is surrounded by electrode $S_{DRV}3$; sensing element $S_{13}$ is comprised of an electrode $S_{EN}13$ surrounded by a dielectric material $S_{13}A$ (e.g., a clearance, air, etc.), which is surrounded by electrode $S_{DRV}3$; and sensing element $S_{15}$ is comprised of an electrode $S_{EN}15$ surrounded by a dielectric material $S_{15}A$ (e.g., a clearance, air, etc.), which is surrounded by electrode $S_{DRV}3$. It should be noted that electrode $S_{DRV}3$ is common to sensing elements $S_9$, $S_{11}$, $S_{13}$, and $S_{15}$.

Sensing element $S_9$ is at the lowest vertical level, sensing element $S_{11}$ is placed at a vertical level that is higher than sensing element $S_9$, sensing element $S_{13}$ is placed at a vertical level that is higher than sensing element $S_{11}$, and sensing element $S_{15}$ is placed at a vertical level that is higher than sensing element $S_{13}$.

Sensing element $S_9$ is electrically connected to terminal $P_9$, sensing element $S_{11}$ is electrically connected to terminal $P_{11}$, sensing element $S_{13}$ is electrically connected to terminal $P_{13}$, and sensing element $S_{15}$ is electrically connected to terminal $P_{15}$. More particularly, electrode $S_{EN}9$ is electrically connected to terminal $P_9$, electrode $S_{EN}11$ is electrically connected to terminal $P_{11}$, electrode $S_{EN}13$ is electrically connected to terminal $P_{13}$, and electrode $S_{EN}15$ is electrically connected to terminal $P_{15}$. Electrode $S_{DRV}3$ is electrically connected to terminal $P_{16}$.

It should be noted that sensing elements $S_0$, $S_2$, $S_4$, and $S_6$ along sidewall 84A, sensing elements $S_1$, $S_3$, $S_5$, and $S_7$ along sidewall 84C, sensing elements $S_8$, $S_{10}$, $S_{12}$, and $S_{14}$ along sidewall 84B, and sensing elements $S_9$, $S_{11}$, $S_{13}$, and $S_{15}$ along sidewall 84D are at different vertical levels. Placing each of the sensor elements at different levels increases the accuracy of the fluid level measurements.

Figure 8:
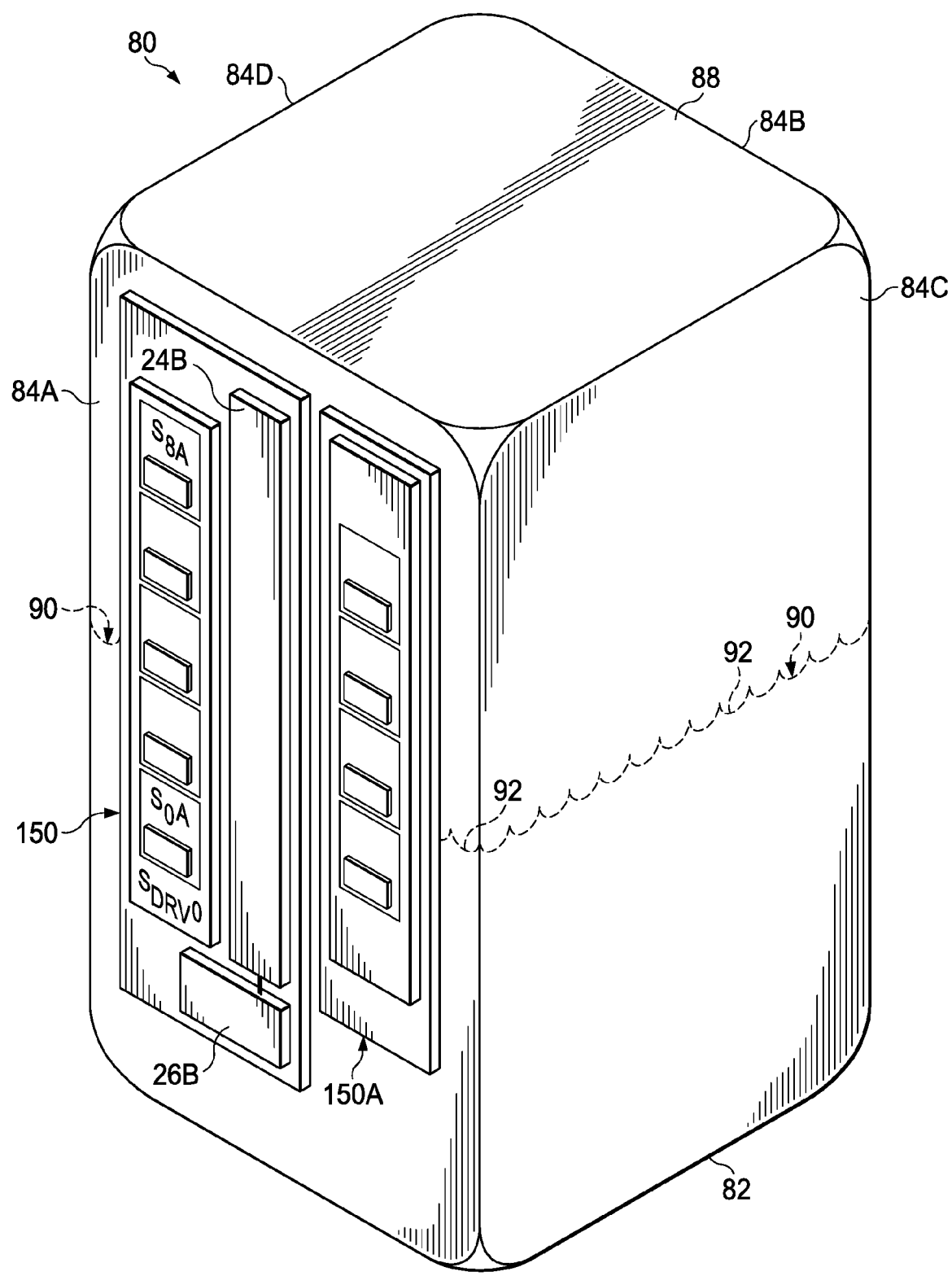
FIG. 8 is a perspective view of a fluid container having a sensor mounted thereto in accordance with another embodiment of the present invention.

FIG. 8 is an isometric view of a fluid container 80 containing fluid 90 having fluid surface 92 is shown in fluid container 80. In accordance with the embodiment of FIG. 8, sensors such as, for example, sensor 150 and a sensor 150A are mounted to sidewall 84A. Sensor 150 has been described with reference to FIG. 6A. Sensor 150A includes sensing elements such as, for example, sensing elements $S_7$, $S_5$, $S_3$, and $S_1$ described with reference to FIG. 6B. Sensing element $S_1$ is electrically connected to terminal $P_1$, sensing element $S_3$ is electrically connected to terminal $P_3$, sensing element $S_5$ is electrically connected to terminal $P_5$, and sensing element $S_7$ is electrically connected to terminal $P_7$. Electrode $S_{DRV}1$ is electrically connected to terminal $P_{10}$ of sensor circuit 24B.

Figure 9:
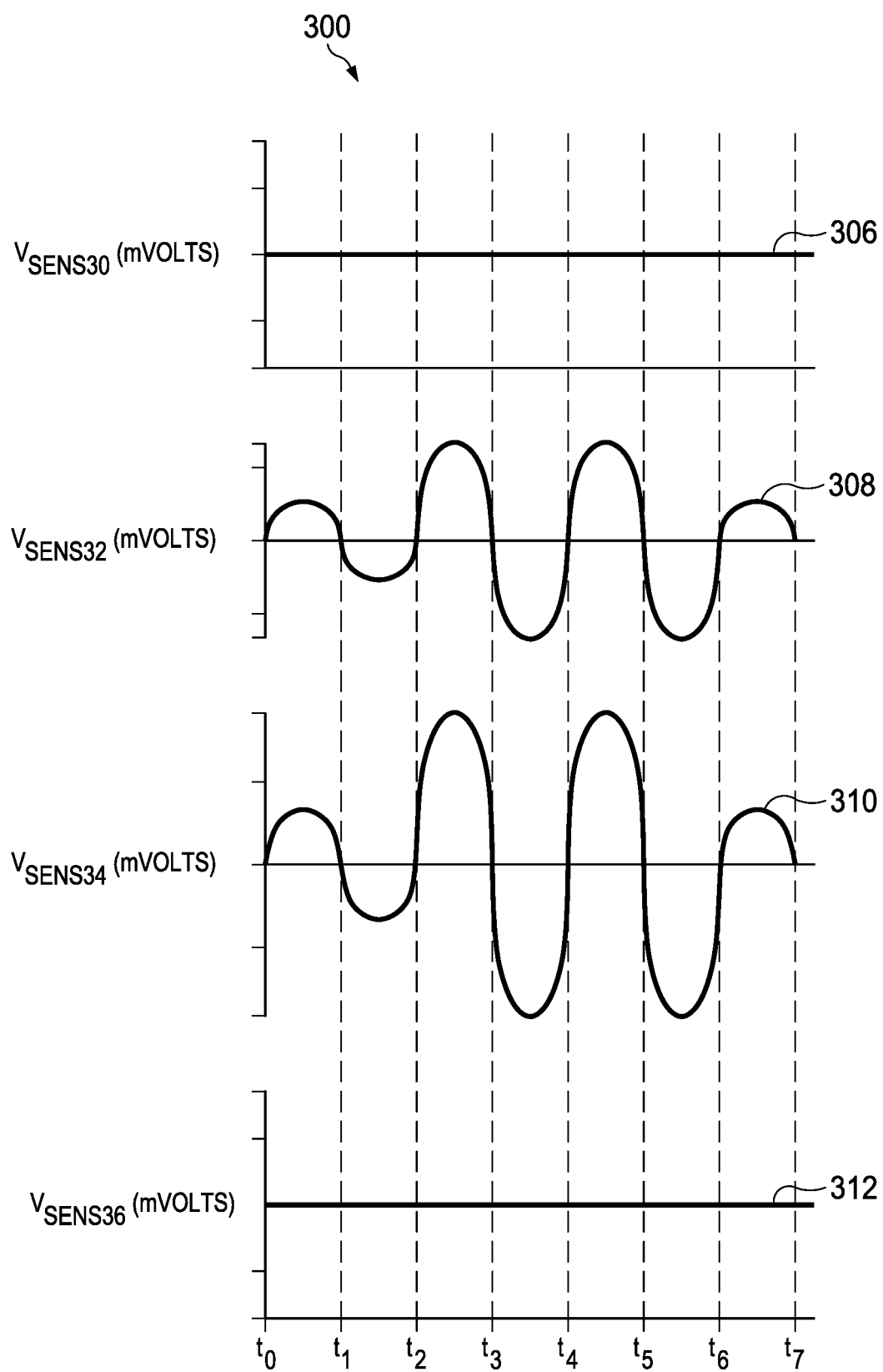
FIG. 9 are graphs of sensor signals in accordance with an embodiment of the present invention.

FIG. 9 is a graph 300 of the output signals $V_{SEN30}$, $V_{SEN32}$, $V_{SEN34}$, and $V_{SEN36}$ from sensing elements 30, 32, 34, and 36, respectively, versus time, wherein output signals $V_{SEN30}$, $V_{SEN32}$, $V_{SEN34}$, and $V_{SEN36}$ provide an indication of fluid levels in accordance with an embodiment of the present invention. Graph 300 includes plots 306, 308, 310, and 312 that illustrate the outputs of sensing elements 30, 32, 34, and 36, respectively over a data collection period. By way of example, the data collection period is 4 seconds. FIG. 3 illustrates that the level of fluid 90 is vertically higher than the level of sensing element 36 and plot 312 shows that the output signal of sensing element 36 is constant over the data collection period. Thus, sensing element 36 indicates that the fluid level is either above or below the level at which sensing element 36 is positioned. Plot 310 shows that sensing element 34 is generating a non-constant output signal, thus the fluid level may be at the level at which level sensing element 34 is positioned. Plot 308 shows that sensing element 32 is generating a non-constant output signal, thus the fluid level may be at the level at which level sensing element 32 is positioned. Plot 306 shows that sensing element 30 is generating a constant output signal, thus the fluid level is either above or below the level at which sensing element 30 is positioned. Accordingly, touch sensors 30-36 indicate that the level of surface 92 is between the levels of sensing elements 30 and 36 and at the level of sensing element 32 or sensing element 34.

Figure 10:
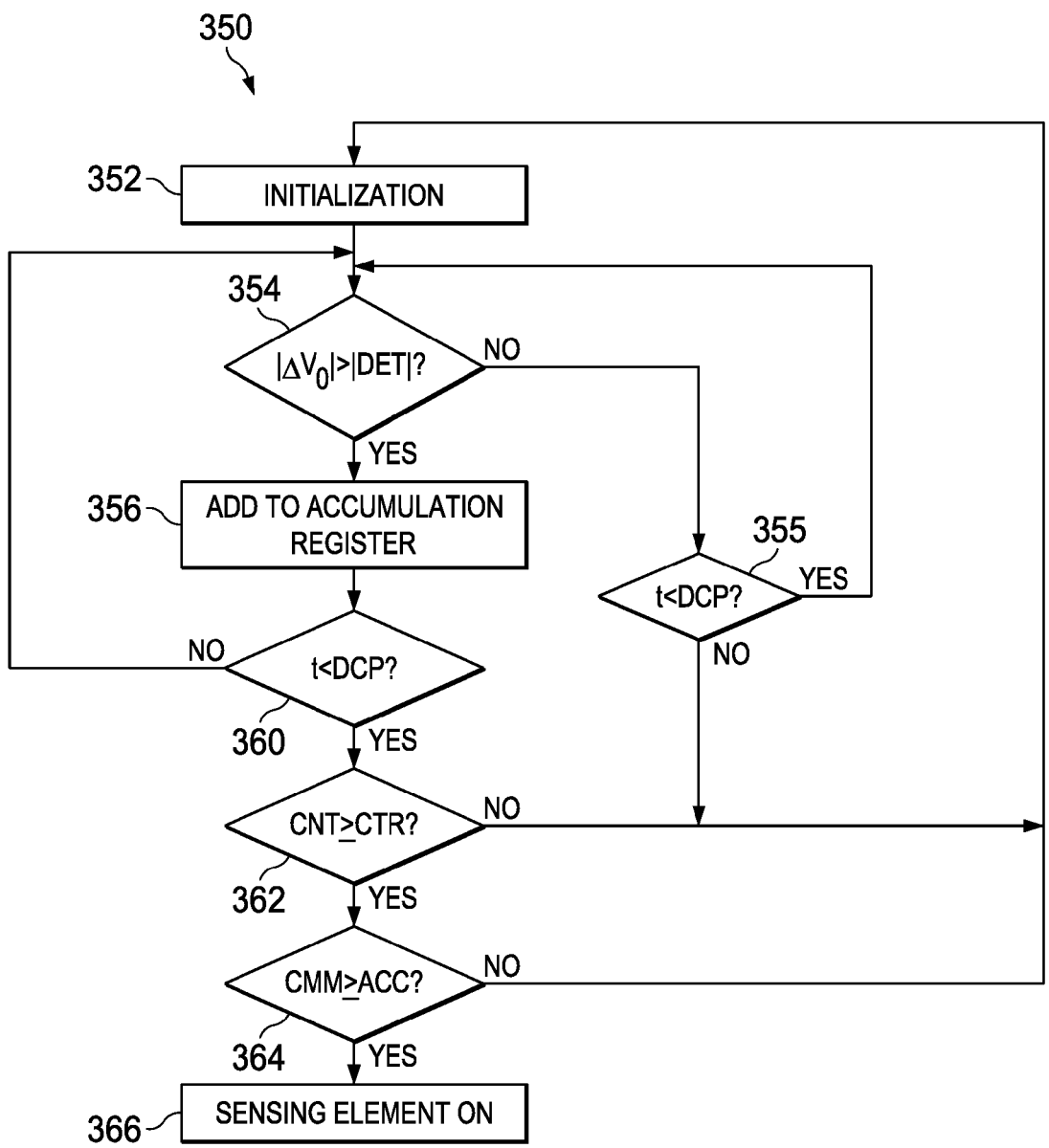
FIG. 10 is flow diagram illustrating detection of a surface level in accordance with an embodiment of the present invention.

FIG. 10 is a flow diagram 350 illustrating a method for determining a level of the fluid in a fluid container such as, for example, container 80 in accordance with another embodiment of the present invention. In a beginning step, the sensor circuit, e.g., sensor circuit 24, 24A, 24B, and 24C, and the associated storage registers within microcontroller 26 are initialized (indicated by box 352). The initialization step resets the values set in the storage registers. The initialization step further includes setting a data collection period DCP, a detection threshold value DET, a count threshold value, CNT, and an accumulation threshold value ACC. It should be noted that data collection period DCP, detection threshold value DET, count threshold value CTR, and accumulation threshold value ACC may be values that are selected by a user.

After initialization, the sensor determines how much the output signal changes between consecutive inflection points over the data collection period. The change in the output signal between inflection points is referred to as a signal change $\Delta V_O$. If absolute value of the signal change value, i.e., $|\Delta V_O|$ is less than the absolute value of the detection threshold value, i.e., |DET|, and if the time is less than the data collection period DCP, the sensor continues from the input of decision diamond 354 (indicated by decision diamonds 354 and 355) and if the absolute value of the signal change value $|\Delta V_O|$ is greater than the absolute value of the detection threshold value, i.e., |DET| and if the time is less than the data collection period DCP, the sensor adds the absolute value of the signal change value, i.e., $|\Delta V_O|$, to the accumulation register and the sensor continues from the input of decision diamond 354 (indicated by decision diamonds 354 and 360 and box 356). At decision diamond 360, if the time is greater than the data collection period, the sensor compares the number of times (CNT) that the absolute value of the signal change, i.e., $|\Delta V_O|$, exceeded detection threshold value, i.e., |DET|, during the data collection period DCP. If the value CNT is less than CTR, then the sensor returns to the initialization step (indicated by decision diamond 362).

If the value CNT is greater than or equal to count threshold value CTR (indicated by decision diamond 362), then the sensor determines whether the accumulated value (CMM) stored in the accumulation register is greater than the accumulation threshold value ACC (indicated by decision diamond 364). If the accumulated value (CMM) stored in the accumulation register is less than the accumulation threshold value ACC then the sensor returns to the initialization step (352). If the accumulated value CMM stored in the accumulation register is greater than the accumulation threshold value ACC, then the sensor is defined as being on or activated in response to a surface level at the input channel (identified by box 366).

Figure 11:
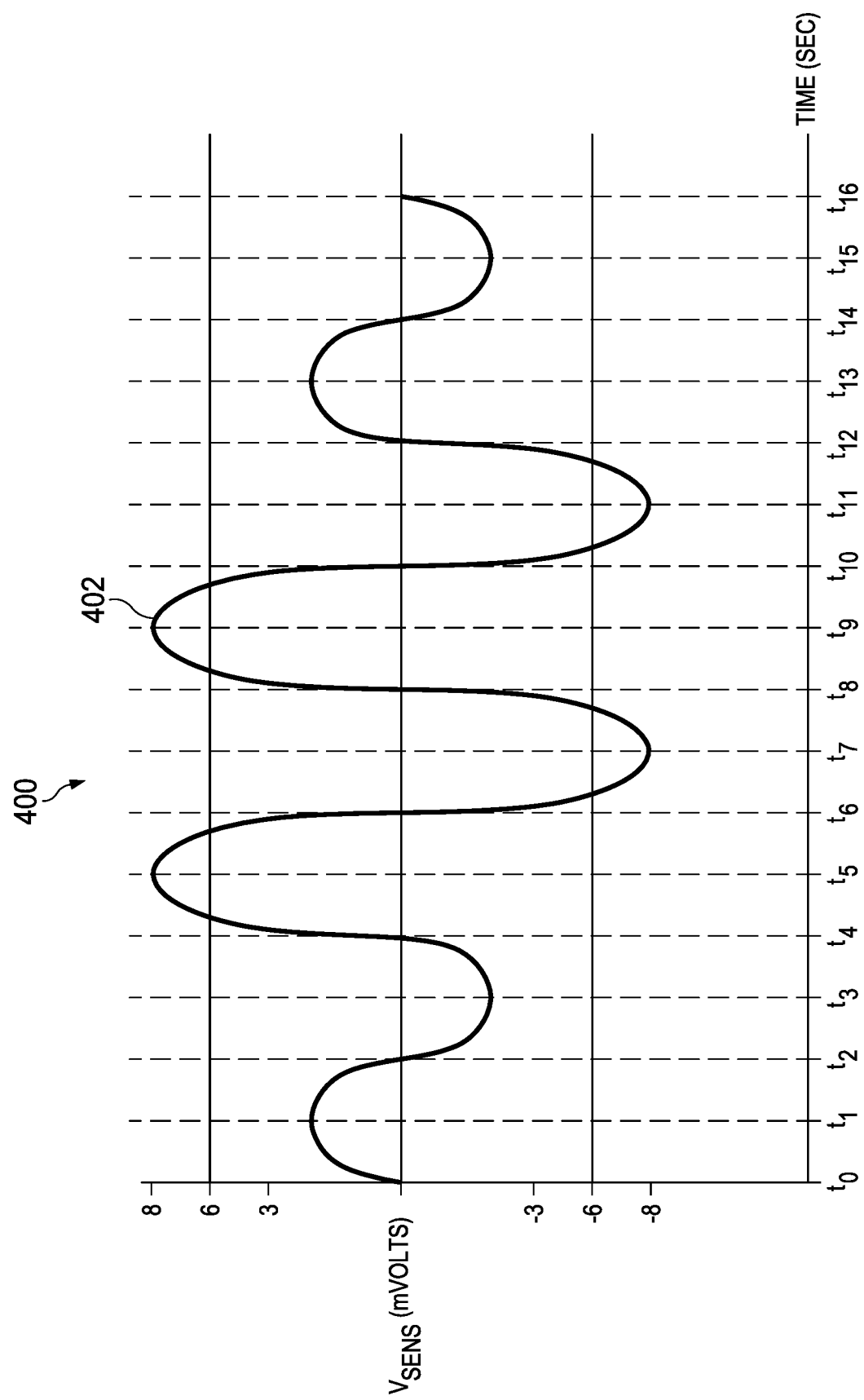
FIG. 11 is a graph of a sensor output signal in accordance with another embodiment of the present invention.

Referring now to FIGS. 10 and 11 to illustrate the determination of the fluid level. FIG. 11 is a graph 400 that includes a plot 402 of sensing element output voltage $V_{SENS}$ versus time. By way of example, data collection period DCP is 4 second, detection threshold value DET is 6 millivolts (mV), count threshold value CTR is 3, and accumulation threshold value ACC is 50 mV. Thus, time $t_0$ represents the beginning time of data collection period DCP and time $t_{16}$ represents the ending time of data collection period DCP, e.g., 4 seconds.

From time $t_0$ to time $t_1$, sensing element output signal $V_{SENs}$ increases from 0 mV to almost 3 mV, and the signal change value $\Delta V_O$ is almost 3 mV, which is less than 6 mV. Thus, the sensor does not change the accumulated value CMM stored in the accumulation register and because the time is within the data collection period of, for example, 4 seconds the sensor generates an updated signal change value $\Delta V_O$.

From time $t_1$ to time $t_3$, the sensor changes from almost +3 mV to almost −3 mV, which does not exceed the detection threshold value DET of 6 mV. The sensor does not change the value stored in the accumulation register, i.e., does not add to the accumulated value CMM, and because the time is within the data collection period of, for example, 4 seconds the sensor is configured to generate an updated signal value change $\Delta V_O$.

From time $t_3$ to time $t_5$, the sensor changes from almost −3 mV to 8 mV, i.e., a change of almost 11 mV. Accordingly, the sensor generates an updated signal change value $\Delta V_O$ having an absolute value that exceeds the detection threshold value DET of 6 mV. Assuming a change of 11 mV, the sensor adds 11 mV to the accumulated value CMM stored in the accumulation register, i.e., 0 mV+11 mV, and because the time is within the data collection period of, for example, 4 seconds, the sensor generates an updated signal change value.

From time $t_5$ to time $t_7$, the sensor changes from 8 mV to −8 mV, i.e., a change of 16 mV. Accordingly, the sensor generates an updated signal change value $\Delta V_O$, which exceeds the detection threshold value DET of 6 mV. The sensor adds 16 mV to the accumulated value CMM stored in the accumulation register and because the time is within the data collection period of, for example, 4 seconds, the sensor generates an updated signal change value $\Delta V_O$. At this point the total voltage value stored in the accumulation register is 27 mV.

From time $t_7$ to time $t_9$, the sensor changes from −8 mV to 8 mV, i.e., 16 mV. Accordingly, the sensor generates an updated signal change value $\Delta V_O$, which exceeds the detection threshold value DET of 6 mV. The sensor adds 16 mV to the accumulated value CMM stored in the accumulation register, and because the time is within the data collection period of, for example, 4 seconds, the sensor generates an updated signal change value $\Delta V_O$. At this point the total voltage accumulated value CMM stored in the accumulation register is 43 mV.

From time $t_9$ to time $t_{11}$, the sensor changes from 8 mV to −8 mV, i.e., 16 mV. Accordingly, the sensor generates an updated signal change value $\Delta V_O$, which exceeds the detection threshold value DET of 6 mV. The sensor adds 16 mV to the accumulated value CMM stored in the accumulation register, and because the time is within the data collection period of, for example, 4 seconds, the sensor generates an updated signal change value. At this point the total voltage value stored in the accumulation register is 59 mV.

From time $t_{11}$ to time $t_{13}$, the sensor changes from −8 mV to almost 3 mV, i.e., almost 11 mV. Accordingly, the sensor generates an updated signal change value $\Delta V_O$, which exceeds the detection threshold value DET of 6 mV. Assuming a change of 11 mV, the sensor adds 11 mV to the accumulated value CMM stored in the accumulation register, and because the time is within the data collection period of, for example, 4 seconds, the sensor generates an updated signal change value $\Delta V_O$. At this point the total accumulated voltage value CMM stored in the accumulation register is 70 mV.

From time $t_{13}$ to time $t_{15}$, the sensor changes from almost +3 mV to −3 mV, i.e., almost 6 mV, which does not exceed the detection threshold value DET of 6 mV. The sensor does not change the value stored in the accumulation register and because the time is within the data collection period of, for example, 4 seconds the sensor is configured to generate an updated signal value change $\Delta V_O$.

From time $t_{15}$ to time $t_{16}$, the sensor changes from almost −3 mV to 0 mV, i.e., almost 3 mV, which does not exceed the detection threshold value DET of 6 mV. The sensor does not change the value stored in the accumulation register.

At time $t_{16}$, the data collection period DCP ends and the sensor compares the number of times the count value CNT exceeded the count threshold value CTR during the data collection period DCP. In this example, count value CNT exceeded the count threshold value CTR five times: once from time $t_3$ to time $t_5$, once from time $t_5$ to time $t_7$, once from time $t_7$ to time $t_9$, once from time $t_9$ to time $t_{11}$, and once from time $t_{11}$ to time $t_{13}$. Thus, the count value CNT exceeds count threshold value CTR, so the sensor compares the accumulated value CMM stored in the accumulation register with the accumulation value ACC. The value in the accumulation register is 70 mV which exceeds the accumulation value of 50. Thus, the sensing element from which plot 402 results is activated or on.

Figure 12A:
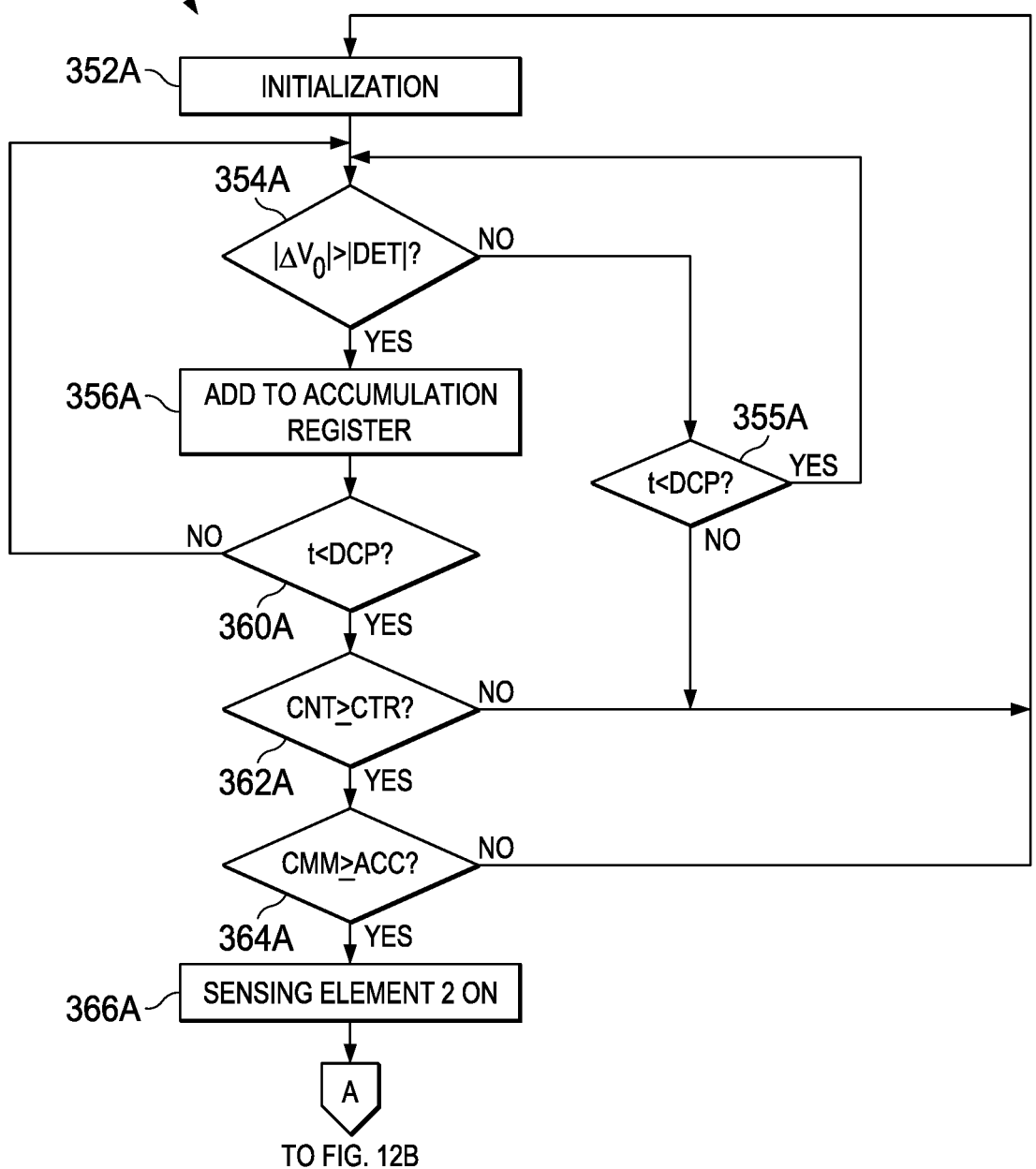
FIG. 12A is a first portion of a flow diagram illustrating detection of a surface level in accordance with an embodiment of the present invention.
Figure 12B:
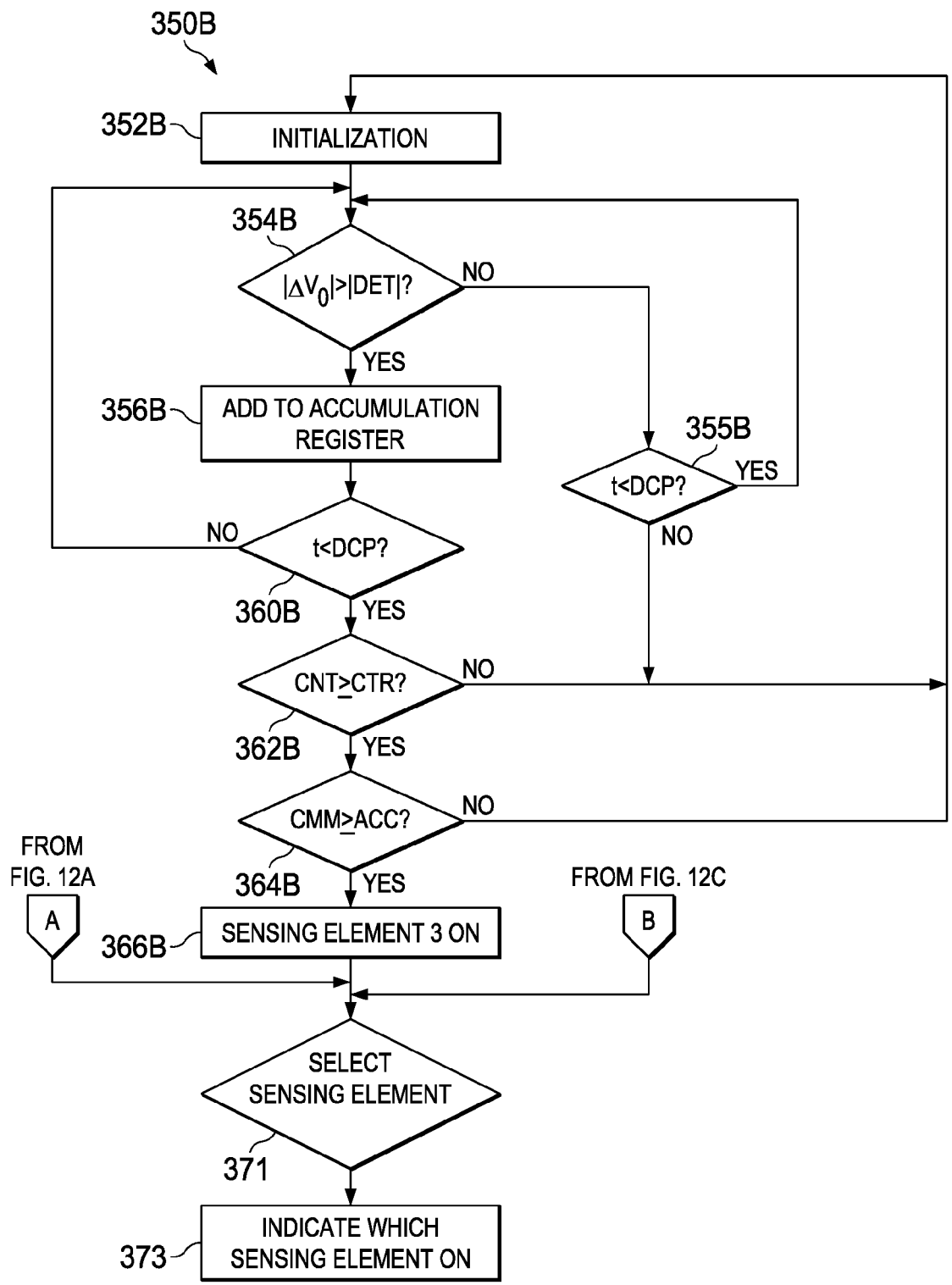
FIG. 12B is a second portion of a flow diagram illustrating detection of a surface level in accordance with an embodiment of the present invention.
Figure 12C:
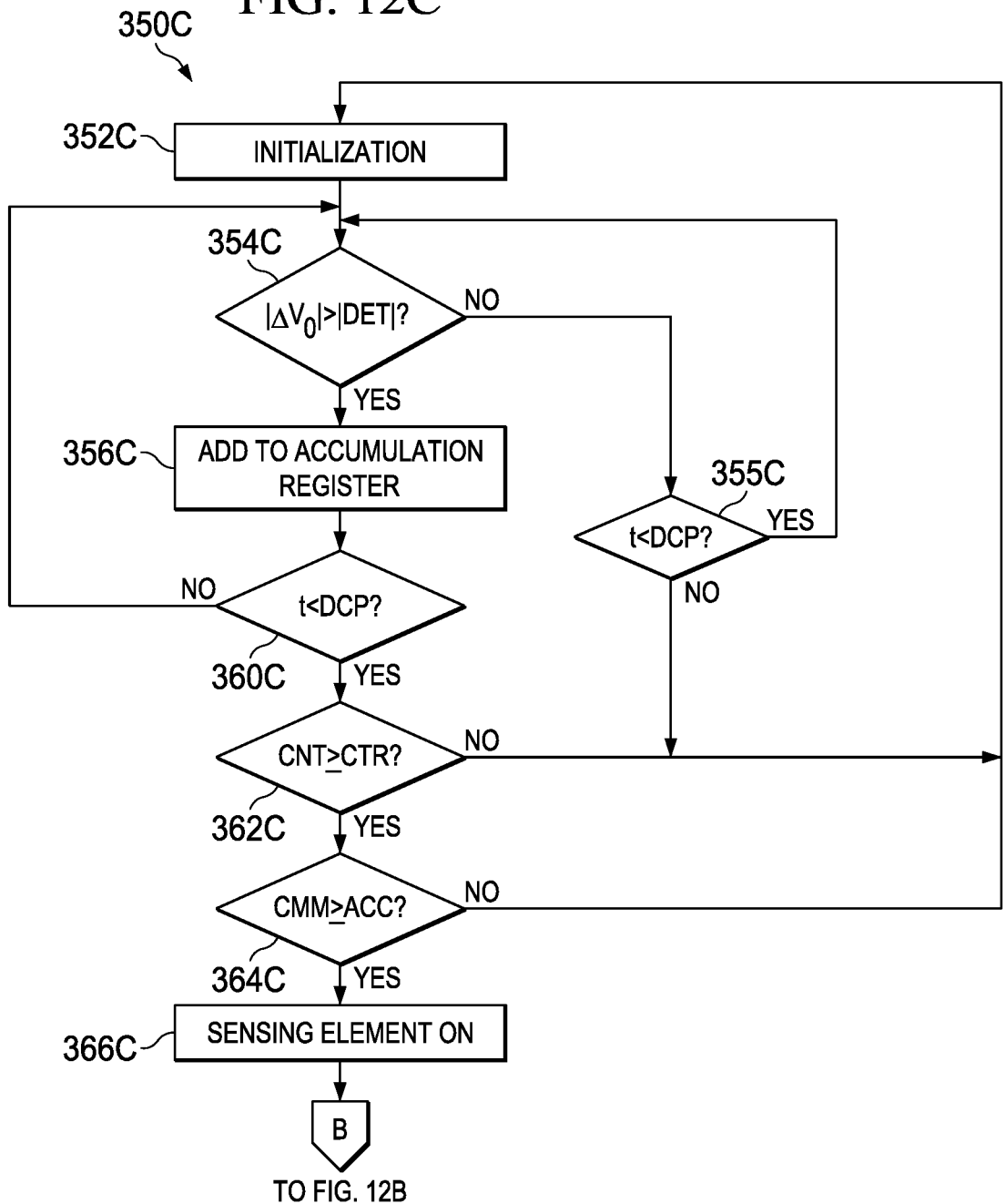
FIG. 12C is a third portion of a flow diagram illustrating detection of the surface level in accordance with an embodiment of the present invention.

FIGS. 12A-12C is are flow diagrams 350 illustrating a method for determining a level of the fluid in a fluid container such as, for example, container 80 in accordance with another embodiment of the present invention, wherein multiple sensors indicate that the fluid level is at the level of that particular sensor. For example, sensor 100 shown in FIG. 5 may be detecting that fluid level 92 is at the level of sensing elements $S_2$, $S_3$, and $S_4$. Thus, in this example, flow diagram 350A corresponds to sensing element $S_2$, flow diagram 350B corresponds to sensing element $S_3$, and flow diagram 350C corresponds to sensing element $S_4$. It should be noted that the processes indicated by flow diagrams 350A, 350B, and 350C may occur in parallel and that the flow diagrams have been shown on separate sheets because they cannot fit onto a single sheet. In a beginning step, the sensor circuit, e.g., sensor circuit 24, 24A, 24B, and 24C, and the associated storage registers within microcontroller 26, 26A, 26B, or 26C are initialized (indicated by boxes 352A, 352B, and 352C). The initialization step resets the values set in the storage registers associated with register $S_2$, $S_3$, and $S_4$. The initialization step further includes setting a data collection period DCP, a detection threshold value DET, a count threshold value, CNT, and an accumulation threshold value ACC. It should be noted that data collection period DCP, detection threshold value DET, count threshold value CTR, and accumulation threshold value ACC may be values that are selected by a user.

After initialization, the sensor determines how much the output signal changes between consecutive inflection points over the data collection period. Although the process for sensors $S_2$, $S_3$, and $S_4$ occur in parallel, each process will be described separately for the sake of clarity. For sensor $S_2$, the change in the output signal between inflection points is referred to as a signal change value $\Delta V_{O2}$. If absolute value of the signal change value, i.e., $|\Delta V_{O2}|$ is less than the absolute value of the detection threshold value, i.e., $|DET|$, and if the time is less than the data collection period DCP, the sensor continues from the input of the corresponding decision diamond, i.e., decision diamond 354A.

Still referring to sensor $S_2$, if the absolute value of the signal change value $|\Delta V_{O2}|$ is greater than the absolute value of the detection threshold value, i.e., $|DET|$ and if the time is less than the data collection period DCP, the sensor adds the absolute value of the signal change value, i.e., $|\Delta V_{O2}|$, to the accumulation register and the sensor continues from the input of decision diamond 354A (indicated by decision diamonds 354A and 360A and by box 356A). At decision diamond 360A, if the time is greater than the data collection period, the sensor compares the number of times ($CNT_2$) that the absolute value of the signal change, i.e., $|\Delta V_{O2}|$, exceeded detection threshold value, i.e., $|DET|$, during the data collection period DCP. If the value $CNT_2$ is less than CTR, then the sensor returns to the initialization step (indicated by decision diamond 362A).

If the value $CNT_2$ is greater than or equal to count threshold CTR (indicated by decision diamond 362A), then the sensor determines whether the accumulated value (CMM$_2$) stored in the accumulation register is greater than accumulation threshold value ACC (indicated by decision diamond 364A). If the accumulated value (CMM$_2$) stored in the accumulation register is less than accumulation threshold value ACC then the sensor returns to the initialization step (352A). If the accumulation value CMM$_2$ stored in the accumulation register is greater than accumulation threshold value ACC, then the sensing element is defined as being on or activated in response to a surface level at the input channel (identified by box 366A).

For sensor S$_3$, the change in the output signal between inflection points is referred to as a signal change value $\Delta V_{O3}$. If absolute value of the signal change value, i.e., $|\Delta V_{O3}|$ s less than the absolute value of the detection threshold value, i.e., |DET|, and if the time is less than the data collection period DCP, the sensor continues from the input of the corresponding decision diamond, i.e., decision diamond 354B.

Still referring to sensor S$_3$, if the absolute value of the signal change value $|\Delta V_{O3}|$ is greater than the absolute value of the detection threshold value, i.e., |DET| and if the time is less than the data collection period DCP, the sensor adds the absolute value of the signal change value, i.e., $|\Delta V_{O3}|$, to the accumulation register and the sensor continues from the input of decision diamond 354B (indicated by decision diamonds 354B and 360B and by box 356B). At decision diamond 360B, if the time is greater than the data collection period, the sensor compares the number of times (CNT$_3$) that the absolute value of the signal change, i.e., $|\Delta V_{O3}|$, exceeded detection threshold value, i.e., |DET|, during the data collection period DCP. If the value CNT$_3$ is less than CTR, then the sensor returns to the initialization step (indicated by decision diamond 362B).

If the value CNT$_3$ is greater than or equal to count threshold CTR (indicated by decision diamond 362B), then the sensor determines whether the accumulated value (CMM$_3$) stored in the accumulation register is greater than accumulation threshold value ACC (indicated by decision diamond 364B). If the accumulated value (CMM$_3$) stored in the accumulation register is less than accumulation threshold value ACC then the sensor returns to the initialization step (352B). If the accumulation value CMM$_3$ stored in the accumulation register is greater than accumulation threshold value ACC, then the sensing is defined as being on or activated in response to a surface level at the input channel (identified by box 366B).

For sensor S$_4$, the change in the output signal between inflection points is referred to as a signal change value $\Delta V_{O4}$. If absolute value of the signal change value, i.e., $|\Delta V_{O4}|$ is less than the absolute value of the detection threshold value, i.e., |DET|, and if the time is less than the data collection period DCP, the sensor continues from the input of the corresponding decision diamond, i.e., decision diamond 354C.

Still referring to sensor S$_4$, if the absolute value of the signal change value $|\Delta V_{O4}|$ is greater than the absolute value of the detection threshold value, i.e., |DET| and if the time is less than the data collection period DCP, the sensor adds the absolute value of the signal change value, i.e., $|\Delta V_{O4}|$, to the accumulation register and the sensor continues from the input of decision diamond 354C (indicated by decision diamonds 354C and 360C and by box 356C). At decision diamond 360C, if the time is greater than the data collection period, the sensor compares the number of times (CNT$_4$) that the absolute value of the signal change, i.e., $|\Delta V_{O4}|$, exceeded detection threshold value, i.e., |DET|, during the data collection period DCP. If the value CNT$_4$ is less than CTR, then the sensor returns to the initialization step (indicated by decision diamond 362C).

If the value CNT$_4$ is greater than or equal to count threshold CTR (indicated by decision diamond 362C), then the sensor determines whether the accumulated value (CMM$_4$) stored in the accumulation register is greater than accumulation threshold value ACC (indicated by decision diamond 364C). If the accumulated value (CMM$_4$) stored in the accumulation register is less than accumulation threshold value ACC then the sensor returns to the initialization step (352C). If the accumulation value CMM$_4$ stored in the accumulation register is greater than accumulation threshold value ACC, then the sensing element is defined as being on or activated in response to a surface level at the input channel (identified by box 366C).

In response to the sensing elements S$_2$, S$_3$, and S$_4$ on, being on or activated, the sensor determines which of the activated sensing elements is on at decision diamond 362. It should be noted that FIGS. 12A, 12B, and 12C use the notation of an A within a circle or a polygon and a B within a circle or a polygon to indicate that the sensor uses the signals from for example, boxes 366A, 366B, and 366C to decide which sensing element is on or activated. In accordance with an embodiment of the present invention, at decision diamond 371, the sensor determines which of the sensing elements has the highest accumulated value CMM$_2$, CMM$_3$, or CMM$_4$ and the sensing element with the highest accumulated value CMM$_2$, CMM$_3$, or CMM$_4$ is the sensing element that is on or activated. Thus, the sensor indicates which sensing element is on as indicated by box 373.

Figure 13:
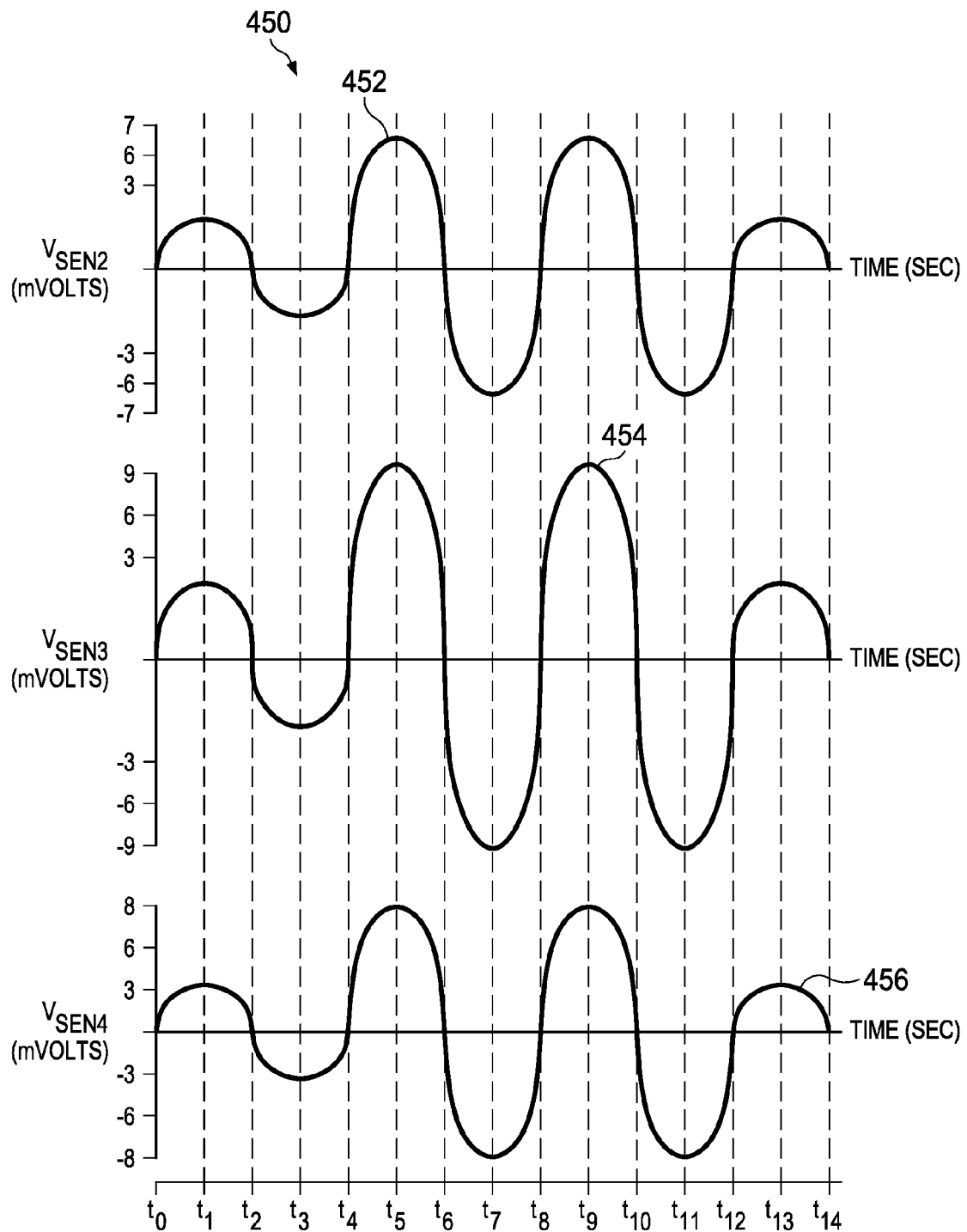
FIG. 13 are graphs of sensor signals in accordance with an embodiment of the present invention.

Referring now to FIGS. 12A-12C and 13 to illustrate the determination of the fluid level. FIG. 13 is a graph 450 that includes plots 452, 454, and 456 of sensing element output voltage V$_{SENs}$ versus time. By way of example, data collection period DCP is 4 second, detection threshold value DET is 6 mV, count threshold value CTR is 3, and accumulation threshold value ACC is 50 mV. Thus, time t$_0$ represents the beginning time of data collection period DCP and time t$_{14}$ represents the ending time of data collection period DCP, e.g., 4 seconds.

Referring to sensing element 2, from time t$_0$ to time t$_1$, sensing element output signal V$_{SEN2}$ increases from 0 mV to almost 3 mV, and the signal change value $\Delta V_{O2}$ is almost 3 mV, which is less than 6 mV. Thus, the sensor does not change the accumulated value CMM$_2$ stored in the accumulation register and because the time is within the data collection period of, for example, 4 seconds the sensor generates an updated signal change value $\Delta V_{O2}$.

From time t$_1$ to time t$_3$, the sensing element output signal V$_{SENS2}$ changes from, almost +3 mV to almost −3 mV, i.e., almost 6 mV, which does not exceed the detection threshold value DET of 6 mV. The sensor does not change the value stored in the accumulation register, i.e., does not add to the accumulated value CMM$_2$, and because the time is within the data collection period of, for example, 4 seconds the sensor is configured to generate an updated signal value change $\Delta V_{O2}$.

From time t$_3$ to time t$_5$, the sensing element output signal V$_{SENS2}$ changes from almost −3 mV to 7 mV, i.e., a change of almost 10 mV. Accordingly, the sensor generates an updated signal change value $\Delta V_{O2}$ having an absolute value that exceeds the detection threshold value DET of 6 mV. The sensor adds 10 mV to the accumulated value CMM$_2$ stored in the accumulation register, i.e., 0 mV+10 mV, and because the time is within the data collection period of, for example, 4 seconds, the sensor generates an updated signal change value.

From time $t_5$ to time $t_7$, the sensing element output signal $V_{SENS2}$ changes from 7 mV to −7 mV, i.e., a change of 14 mV. Accordingly, the sensor generates an updated signal change value $\Delta V_{O2}$, which exceeds the detection threshold value DET of 6 mV. The sensor adds 14 mV to the accumulated value $CMM_2$ stored in the accumulation register and because the time is within the data collection period of, for example, 4 seconds, the sensor generates an updated signal change value $\Delta V_{O2}$. At this point the total voltage value stored in the accumulation register is 24 mV.

From time $t_7$ to time $t_9$, the sensor changes from −7 mV to 7 mV, i.e., 14 mV. Accordingly, the sensor generates an updated signal change value $\Delta V_O$, which exceeds the detection threshold value DET of 6 mV. The sensor adds 14 mV to the accumulated value $CMM_2$ stored in the accumulation register, and because the time is within the data collection period of, for example, 4 seconds, the sensor generates an updated signal change value $\Delta V_{O2}$. At this point the total voltage accumulated value CMM stored in the accumulation register is 38 mV.

From time $t_9$ to time $t_{11}$, the sensor changes from 7 mV to −7 mV, i.e., 14 mV. Accordingly, the sensor generates an updated signal change value $\Delta V_{O2}$, which exceeds the detection threshold value DET of 6 mV. The sensor adds 14 mV to the accumulated value $CMM_2$ stored in the accumulation register, and because the time is within the data collection period of, for example, 4 seconds, the sensor generates an updated signal change value. At this point the total voltage value stored in the accumulation register is 52 mV.

From time $t_{11}$ to time $t_{13}$, the sensor changes from −7 mV to almost 3 mV, i.e., almost 10 mV. Accordingly, the sensor generates an updated signal change value $\Delta V_{O2}$, which exceeds the detection threshold value DET of 6 mV. The sensor adds 10 mV to the accumulated value $CMM_2$ stored in the accumulation register, and because the time is within the data collection period of, for example, 4 seconds, the sensor generates an updated signal change value $\Delta V_{O2}$. At this point the total accumulated voltage value CMM stored in the accumulation register is 62 mV.

From time $t_{13}$ to time $t_{14}$, the sensor changes from almost +3 mV to 0 mV, i.e., almost 3 mV, which does not exceed the detection threshold value DET of 6 mV. The sensor does not change the value stored in the accumulation register and because the time is within the data collection period of, for example, 4 seconds the sensor is configured to generate an updated signal value change $\Delta V_{O2}$.

From time $t_{15}$ to time $t_{16}$, the sensor changes from almost −3 mV to 0 mV, i.e., almost 3 mV, which does not exceed the detection threshold value DET of 6 mV. The sensor does not change the value stored in the accumulation register.

At time $t_{14}$, the data collection period DCP ends and the sensor compares the number of times the count value $CNT_2$ exceeded the count threshold value CTR during the data collection period DCP. In this example, count value $CNT_2$ exceeded the count threshold value CTR five times: once from time $t_3$ to time $t_5$, once from time $t_5$ to time $t_7$, once from time $t_7$ to time $t_9$, once from time $t_9$ to time $t_{11}$, and once from time $t_{11}$ to time $t_{13}$. Thus, the count value $CNT_2$ exceeds count threshold value CTR, so the sensor compares the accumulated value CMM2 stored in the accumulation register with the accumulation threshold value ACC. The value in the accumulation register is 62 mV which exceeds the accumulation value of 50. Thus, sensing element $S_2$ from which plot 452 results is activated or on.

Referring to sensing element 3, from time $t_0$ to time $t_1$, sensing element output signal $V_{SENS3}$ increases from 0 mV to almost 3 mV, and the signal change value $\Delta V_{O3}$ is 3 mV, which is less than 6 mV. Thus, the sensor does not change the accumulated value $CMM_3$ stored in the accumulation register and because the time is within the data collection period of, for example, 4 seconds the sensor generates an updated signal change value $\Delta V_{O3}$.

From time $t_1$ to time $t_3$, the sensing element output signal $V_{SENS2}$ changes from almost +3 mV to almost −3 mV, i.e., almost 6 mV, which does not exceed the detection threshold value DET of 6 mV. The sensor does not change the value stored in the accumulation register, i.e., does not add to the accumulated value $CMM_2$, and because the time is within the data collection period of, for example, 4 seconds the sensor is configured to generate an updated signal value change $\Delta V_{O3}$.

From time $t_3$ to time $t_5$, the sensing element output signal $V_{SENS3}$ changes from almost −3 mV to 9 mV, i.e., a change of almost 12 mV. Accordingly, the sensor generates an updated signal change value $\Delta V_{O3}$ having an absolute value that exceeds the detection threshold value DET of 6 mV. The sensor adds 12 mV to the accumulated value $CMM_3$ stored in the accumulation register, i.e., 0 mV+12 mV, and because the time is within the data collection period of, for example, 4 seconds, the sensor generates an updated signal change value.

From time $t_5$ to time $t_7$, the sensing element output signal $V_{SENS3}$ changes from 9 mV to −9 mV, i.e., a change of 18 mV. Accordingly, the sensor generates an updated signal change value $\Delta V_{O3}$, which exceeds the detection threshold value DET of 6 mV. The sensor adds 18 mV to the accumulated value $CMM_3$ stored in the accumulation register and because the time is within the data collection period of, for example, 4 seconds, the sensor generates an updated signal change value $\Delta V_{O3}$. At this point the total voltage value stored in the accumulation register is 30 mV.

From time $t_7$ to time $t_9$, the sensor changes from −9 mV to 9 mV, i.e., 18 mV. Accordingly, the sensor generates an updated signal change value $\Delta V_{O3}$, which exceeds the detection threshold value DET of 6 mV. The sensor adds 18 mV to the accumulated value $CMM_3$ stored in the accumulation register, and because the time is within the data collection period of, for example, 4 seconds, the sensor generates an updated signal change value $\Delta V_{O3}$. At this point the total voltage accumulated value CMM stored in the accumulation register is 48 mV.

From time $t_9$ to time $t_{11}$, the sensor changes from 9 mV to −9 mV, i.e., 18 mV. Accordingly, the sensor generates an updated signal change value $\Delta V_{O3}$, which exceeds the detection threshold value DET of 6 mV. The sensor adds 18 mV to the accumulated value $CMM_3$ stored in the accumulation register, and because the time is within the data collection period of, for example, 4 seconds, the sensor generates an updated signal change value. At this point the total voltage value stored in the accumulation register is 66 mV.

From time $t_{11}$ to time $t_{13}$, the sensor changes from −9 mV to almost 3 mV, i.e., almost 12 mV. Accordingly, the sensor generates an updated signal change value $\Delta V_{O3}$, which exceeds the detection threshold value DET of 6 mV. The sensor adds 12 mV to the accumulated value $CMM_3$ stored in the accumulation register, and because the time is within the data collection period of, for example, 4 seconds, the sensor generates an updated signal change value $\Delta V_{O3}$. At this point the total accumulated voltage value CMM stored in the accumulation register is 78 mV.

From time $t_{13}$ to time $t_{14}$, the sensor changes from almost +3 mV to 0 mV, i.e., almost 3 mV, which does not exceed the detection threshold value DET of 6 mV. The sensor does not change the value stored in the accumulation register and because the time is within the data collection period of, for example, 4 seconds the sensor is configured to generate an updated signal value change $\Delta V_{O3}$.

At time $t_{14}$, the data collection period DCP ends and the sensor compares the number of times the count value $CNT_3$ exceeded the count threshold value CTR during the data collection period DCP. In this example, count value $CNT_3$ exceeded the count threshold value CTR five times: once from time $t_3$ to time $t_5$, once from time $t_5$ to time $t_7$, once from time $t_7$ to time $t_9$, once from time $t_9$ to time $t_{11}$, and once from time $t_{11}$ to time $t_{13}$. Thus, the count value $CNT_3$ exceeds count threshold value CTR, so the sensor compares the accumulated value $CMM_3$ stored in the accumulation register with the accumulation threshold value ACC. The value in the accumulation register is 78 mV which exceeds the accumulation value of 50. Thus, sensing element $S_3$ from which plot 454 results is activated or on.

Referring to sensing element 4, from time $t_0$ to time $t_1$, sensing element output signal $V_{SENS4}$ increases from 0 mV to 3 mV, and the signal change value $\Delta V_{O4}$ is 3 mV, which is less than 6 mV. Thus, the sensor does not change the accumulated value $CMM_4$ stored in the accumulation register and because the time is within the data collection period of, for example, 4 seconds the sensor generates an updated signal change value $\Delta V_{O4}$.

From time $t_1$ to time $t_3$, the sensing element output signal $V_{SENS4}$ changes from +3 mV to −3 mV, i.e., 6 mV, which does not exceed the detection threshold value DET of 6 mV. The sensor does not change the value stored in the accumulation register, i.e., does not add to the accumulated value $CMM_4$, and because the time is within the data collection period of, for example, 4 seconds the sensor is configured to generate an updated signal value change $\Delta V_{O4}$.

From time $t_3$ to time $t_5$, the sensing element output signal $V_{SENS4}$ changes from −3 mV to 8 mV, i.e., a change of 11 mV. Accordingly, the sensor generates an updated signal change value $\Delta V_{O4}$ having an absolute value that exceeds the detection threshold value DET of 6 mV. The sensor adds 11 mV to the accumulated value $CMM_4$ stored in the accumulation register, i.e., 0 mV+11 mV, and because the time is within the data collection period of, for example, 4 seconds, the sensor generates an updated signal change value.

From time $t_5$ to time $t_7$, the sensing element output signal $V_{SENS4}$ changes from 8 mV to −8 mV, i.e., a change of 16 mV. Accordingly, the sensor generates an updated signal change value $\Delta V_{O4}$, which exceeds the detection threshold value DET of 6 mV. The sensor adds 16 mV to the accumulated value $CMM_4$ stored in the accumulation register and because the time is within the data collection period of, for example, 4 seconds, the sensor generates an updated signal change value $\Delta V_{O4}$. At this point the total voltage value stored in the accumulation register is 27 mV.

From time $t_7$ to time $t_9$, the sensor changes from −8 mV to 8 mV, i.e., 16 mV. Accordingly, the sensor generates an updated signal change value $\Delta V_{O4}$, which exceeds the detection threshold value DET of 6 mV. The sensor adds 16 mV to the accumulated value $CMM_4$ stored in the accumulation register, and because the time is within the data collection period of, for example, 4 seconds, the sensor generates an updated signal change value $\Delta V_{O4}$. At this point the total voltage accumulated value CMM stored in the accumulation register is 43 mV.

From time $t_9$ to time $t_{11}$, the sensor changes from 8 mV to −8 mV, i.e., 16 mV. Accordingly, the sensor generates an updated signal change value $\Delta V_{O4}$, which exceeds the detection threshold value DET of 6 mV. The sensor adds 16 mV to the accumulated value $CMM_4$ stored in the accumulation register, and because the time is within the data collection period of, for example, 4 seconds, the sensor generates an updated signal change value $\Delta V_{O4}$. At this point the total voltage value stored in the accumulation register is 59 mV.

From time $t_{11}$ to time $t_{13}$, the sensor changes from −8 mV to 3 mV, i.e., 11 mV. Accordingly, the sensor generates an updated signal change value $\Delta V_{O4}$, which exceeds the detection threshold value DET of 6 mV. The sensor adds 11 mV to the accumulated value $CMM_4$ stored in the accumulation register, and because the time is within the data collection period of, for example, 4 seconds, the sensor generates an updated signal change value $\Delta V_{O4}$. At this point the total accumulated voltage value $CMM_4$ stored in the accumulation register is 70 mV.

From time $t_{13}$ to time $t_{14}$, the sensor changes from +3 mV to 0 mV, i.e., 3 mV, which does not exceed the detection threshold value DET of 6 mV. The sensor does not change the value stored in the accumulation register and because the time is within the data collection period of, for example, 4 seconds the sensor is configured to generate an updated signal value change $\Delta V_{O4}$.

At time $t_{14}$, the data collection period DCP ends and the sensor compares the number of times the count value $CNT_4$ exceeded the count threshold value CTR during the data collection period DCP. In this example, count value $CNT_4$ exceeded the count threshold value CTR five times: once from time $t_3$ to time $t_5$, once from time $t_5$ to time $t_7$, once from time $t_7$ to time $t_9$, once from time $t_9$ to time $t_{11}$, and once from time $t_{11}$ to time $t_{13}$. Thus, the count value $CNT_4$ exceeds count threshold value CTR, so the sensor compares the accumulated value $CMM_4$ stored in the accumulation register with the accumulation threshold value ACC. The value in the accumulation register is 70 mV which exceeds the accumulation value of 50. Thus, sensing element $S_4$ from which plot 456 results is activated or on.

The sensor compares the accumulated values $CMM_2$, $CMM_3$, and $CMM_4$ to determine which is the highest value and the sensing element with the highest accumulated value is considered to be on or activated. In this example, accumulated value $CMM_2$ for sensing element $S_2$ is 62 mV, accumulated value $CMM_3$ for sensing element $S_3$ is 78 mV, and accumulated value $CMM_4$ for sensing element $S_4$ is 70 mV. Thus, sensing element $S_3$ is the sensing element that is on or activated.

Figure 14:
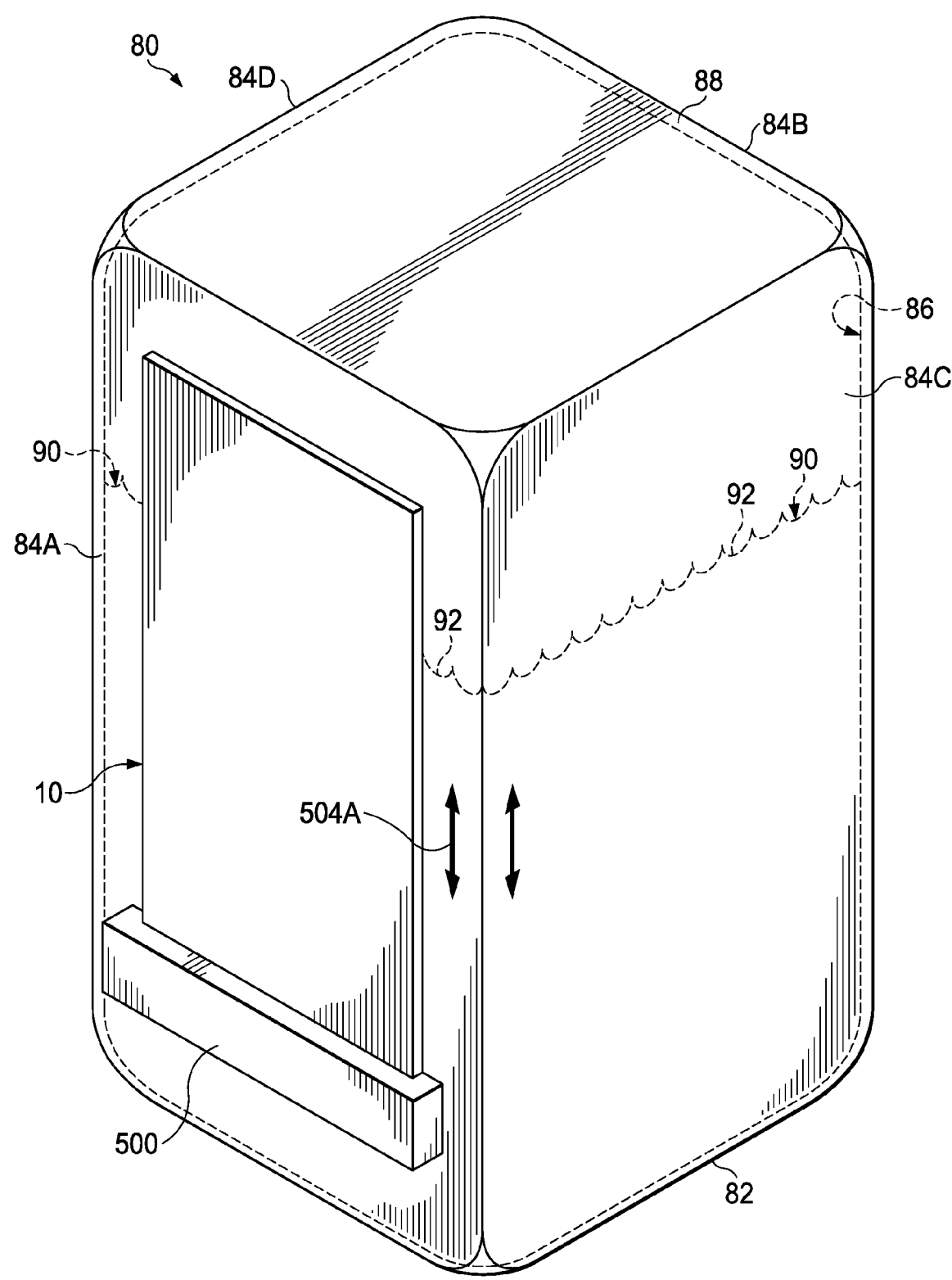
FIG. 14 is an isometric view of a fluid container configured with a sensor for sensing fluid level within the container using a sensor that is external to the container in accordance with an embodiment of the present invention.

FIG. 14 is an isometric view of a fluid container configured with a sensor for sensing fluid level within the container using a sensor that is external to the container in accordance with an embodiment of the present invention. What is shown in FIG. 14 is a container such as, for example, container 80 described with reference to FIG. 3. Container 80 has a floor 82 and sidewalls 84A, 84B, 84C, and 84D, wherein sidewalls 84A and 84B may be substantially parallel to each other and sidewalls 84C and 84D may be substantially parallel to each other and substantially perpendicular to sidewalls 84A and 84B. Fluid container 80 is configured to have a cavity or a hollow 86 bounded by floor 82 and sidewalls 84A-84D. Fluid container 80 may have a top or ceiling 88. Fluid 90 having fluid surface 92 is shown in fluid container 80.

A vibration motor 500 is positioned adjacent to sidewall 84A and a sensor such as, for example, sensor 10 described with reference to FIG. 1 is mounted to vibration motor 500 and positioned adjacent to sidewall 84A. Vibration motor 500 causes sensor 10 to vibrate or move up and down (indicated by arrows 504A) relative to floor 82 and top 88 of fluid container 80. Movement of sensing elements 30, 32, 34, and 36 (see FIG. 1) may aid in determining the surface level of fluid 90 in which surface 92 is stationary or does not have ripples or waves. It should be appreciated that the sensor mounted to motor 500 is not a limitation of the present invention. For example sensor 100 (see FIG. 5), sensor 150 (see FIG. 6A), sensor 160 (see FIG. 6B), sensor 200 (see FIG. 7A), or the like can be mounted to vibration motor 500.

Figure 15:
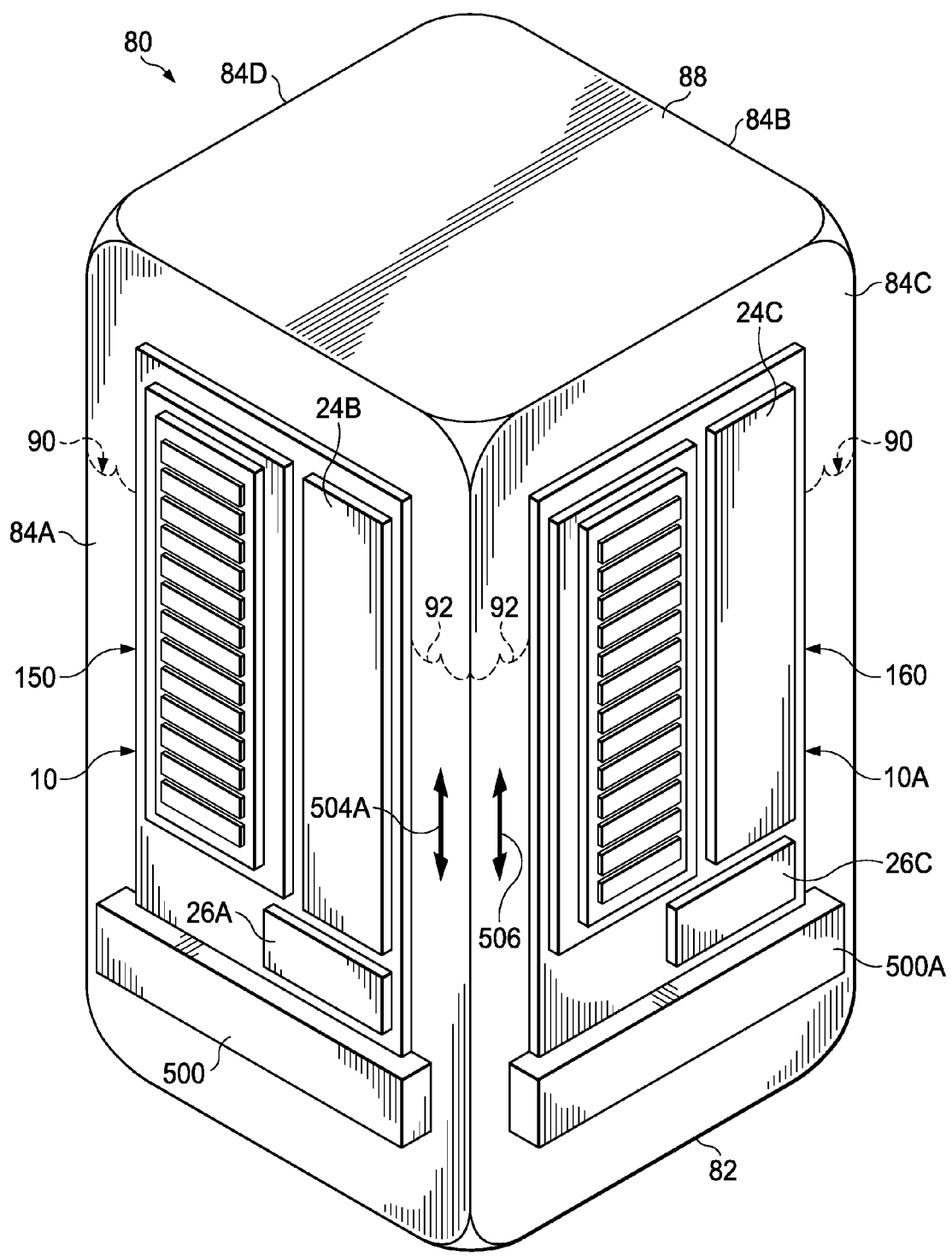
FIG. 15 is an isometric view of a fluid container configured with a sensor for sensing fluid level within the container using a sensor that is external to the container in accordance with an embodiment of the present invention.

FIG. 15 is an isometric view of a fluid container configured with two sensors for sensing fluid level within the container using a sensor that is external to the container in accordance with another embodiment of the present invention. What is shown in FIG. 14 is a container such as, for example, container 80 described with reference to FIG. 3. A vibration motor 500 is positioned adjacent to sidewall 84A and a sensor such as, for example, sensor 10 described with reference to FIG. 1 is mounted to vibration motor 500 and positioned adjacent to sidewall 84A. In addition, a vibration motor 500A is positioned adjacent to sidewall 84C and a sensor such as, for example, sensor 10A is mounted to vibration motor 500A and positioned adjacent to sidewall 84C. Sensor 10A may be the same type of sensor as sensor 10. Reference character A has been appended to reference character 10 for the sensor of FIG. 15 to distinguish between the sensor mounted to vibration motor 500 and the sensor mounted to vibration motor 500A. Vibration motor 500A causes sensor 10A to vibrate or move up and down (indicated by arrows 506) relative to floor 82 and top 88 of fluid container 80. Movement of sensing elements 30, 32, 34, and 36 (see, e.g., FIG. 1) of sensor 10A may aid in determining the surface level of fluid 90 in which surface 92 is stationary or does not have ripples or waves. It should be appreciated that the type of sensor mounted to motor 500A is not a limitation of the present invention. For example sensor 100 (see FIG. 5), sensor 150 (see FIG. 6A), sensor 160 (see FIG. 6B), sensor 200 (see FIG. 7A), or the like can be mounted to vibration motor 500A.

Alternatively, vibration motor 500A and sensor 10A can be mounted along sidewall 84B, rather than sidewall 84C.

Figure 16:
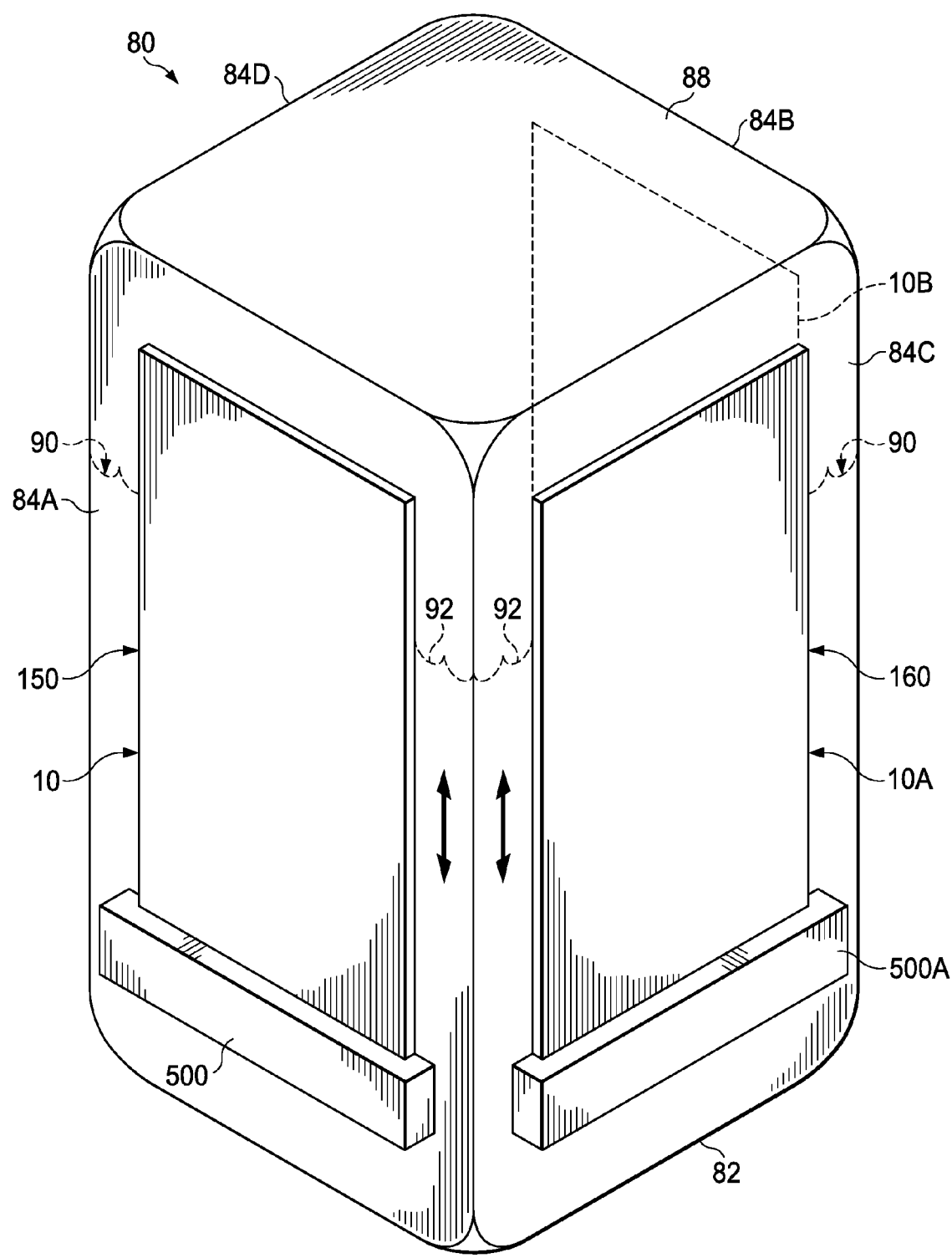
FIG. 16 is an isometric view of a fluid container configured with a sensor for sensing fluid level within the container using a sensor that is external to the container in accordance with an embodiment of the present invention.

FIG. 16 is an isometric view of a fluid container configured with three sensors for sensing fluid level within the container using a sensor that is external to the container in accordance with another embodiment of the present invention. What is shown in FIG. 16 is a container such as, for example, container 80 described with reference to FIG. 15 having a vibration motor a sensor 10 coupled to vibration motor 500 is positioned adjacent to sidewall 84A and a sensor 10A mounted to a vibration motor 500A is positioned adjacent to sidewall 84C. Container 80 of FIG. 15 has been rotated by 90 degrees in FIG. 16, thus motor 500 and sensor 10 described with reference to FIG. 14 are hidden from view. A vibration motor 500A and a sensor 10A as described with reference to FIG. 15 are positioned adjacent to sidewall 84C. A vibration motor 500B having a sensor 10B mounted thereto is positioned adjacent to sidewall 84B. Reference character B has been appended to reference character 10 to distinguish between sensor 10, sensor 10A, and sensor 10B. Sensors 10, 10A, and 10B may be the same type of sensor. Vibration motor 500 causes sensor 10 to vibrate or move up and down (indicated by arrows 504) relative to floor 82 and top 88 of fluid container 80; vibration motor 500A causes sensor 10A to vibrate or move up and down (indicated by arrows 506) relative to floor 82 and top 88 of fluid container 80; and vibration motor 500B causes sensor 10B to move up and down (indicated by arrows 508) relative to floor 82 and top 88 of container 80. Movement of the sensing elements of sensors 10, 10A, and 10B may aid in determining the surface level of fluid 90 in which surface 92 is stationary or does not have ripples or waves. It should be appreciated that the type of sensor mounted to motor 500B is not a limitation of the present invention. For example sensor 100 (see FIG. 5), sensor 150 (see FIG. 6A), sensor 160 (see FIG. 6B), sensor 200 (see FIG. 7A), or the like can be mounted to vibration motor 500B.

Figure 17:
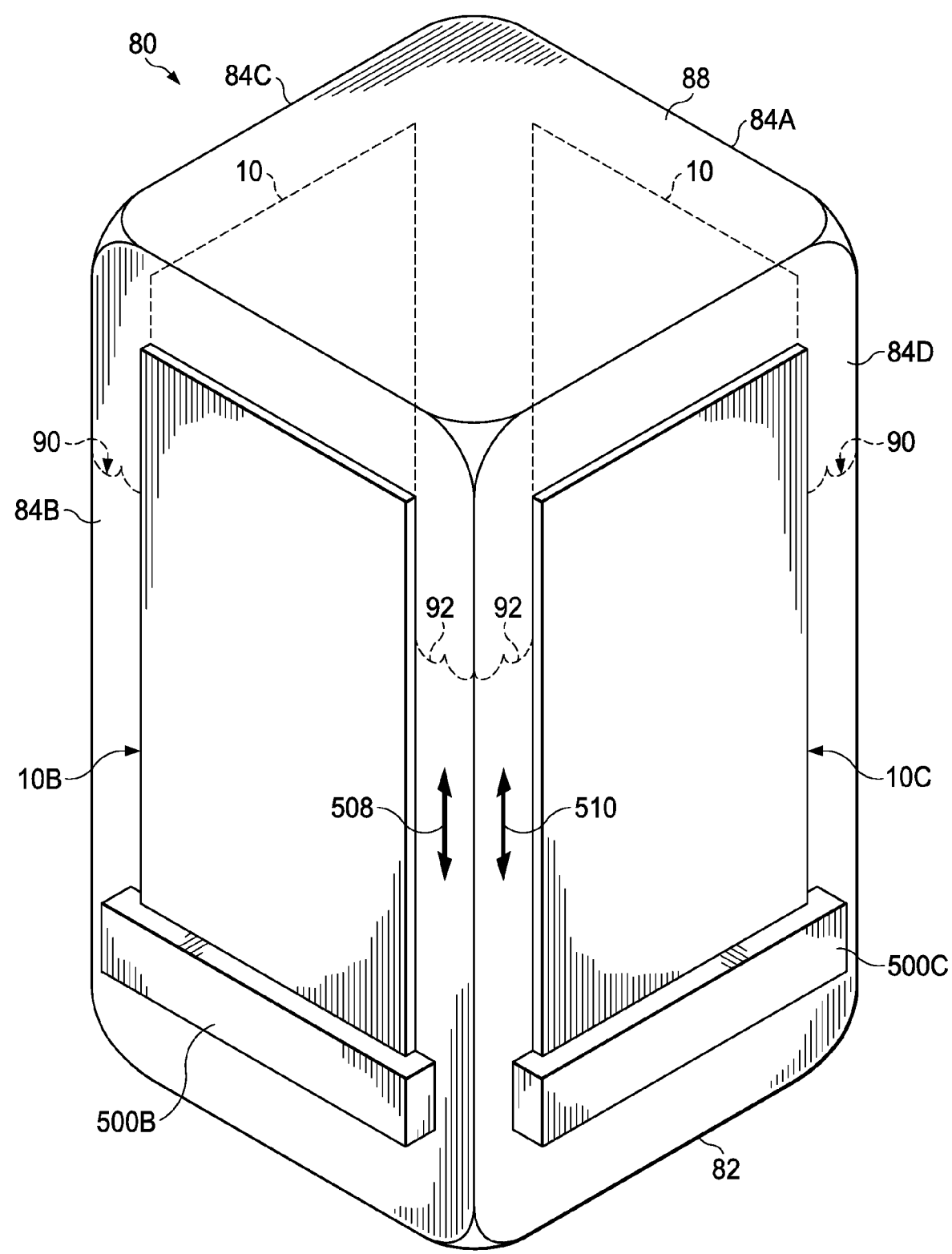
FIG. 17 is an isometric view of a fluid container configured with a sensor for sensing fluid level within the container using a sensor that is external to the container in accordance with an embodiment of the present invention.

FIG. 17 is an isometric view of a fluid container configured with four sensors for sensing fluid level within the container using a sensor that is external to the container in accordance with another embodiment of the present invention. What is shown in FIG. 17 is a container such as, for example, container 80 described with reference to FIG. 15 having a sensor 10 coupled to vibration motor 500 positioned adjacent to sidewall 84A (see FIG. 15), a sensor 10A mounted to a vibration motor 500A positioned adjacent to sidewall 84C (see FIG. 15), and a sensor 10B mounted to vibration motor 500B position adjacent to sidewall 84B. Container 80 of FIG. 15 has been rotated by 180 degrees in FIG. 17, thus motors 500 and 500A and sensors 10 and 10A described with reference to FIG. 15 are hidden from view. A vibration motor 500C having a sensor 10C mounted thereto is positioned adjacent to sidewall 84D. Reference character C has been appended to reference character 10 to distinguish between sensor 10, sensor 10A, sensor 10B, and sensor 10C. Sensors 10, 10A, 10B, and 10C may be the same type of sensor. Vibration motor 500 causes sensor 10 to vibrate or move up and down relative to floor 82 and top 88 of fluid container 80; vibration motor 500A causes sensor 10A to vibrate or move up and down relative to floor 82 and top 88 of fluid container 80; vibration motor 500B causes sensor 10B to move up and down (indicated by arrows 508) relative to floor 82 and top 88 of container 80, and vibration motor 500C causes sensor 10C to vibrate or move up and down (indicated by arrows 510) relative to floor 82 and top 88 of fluid container 80. Movement of the sensing elements of sensors 10, 10A, 10B, and 10C may aid in determining the surface level of fluid 90 in which surface 92 is stationary or does not have ripples or waves. It should be appreciated that the type of sensor mounted to motor 500C is not a limitation of the present invention. For example sensor 100 (see FIG. 5), sensor 150 (see FIG. 6A), sensor 160 (see FIG. 6B), sensor 200 (see FIG. 7A), or the like can be mounted to vibration motor 500C.

Figure 18:
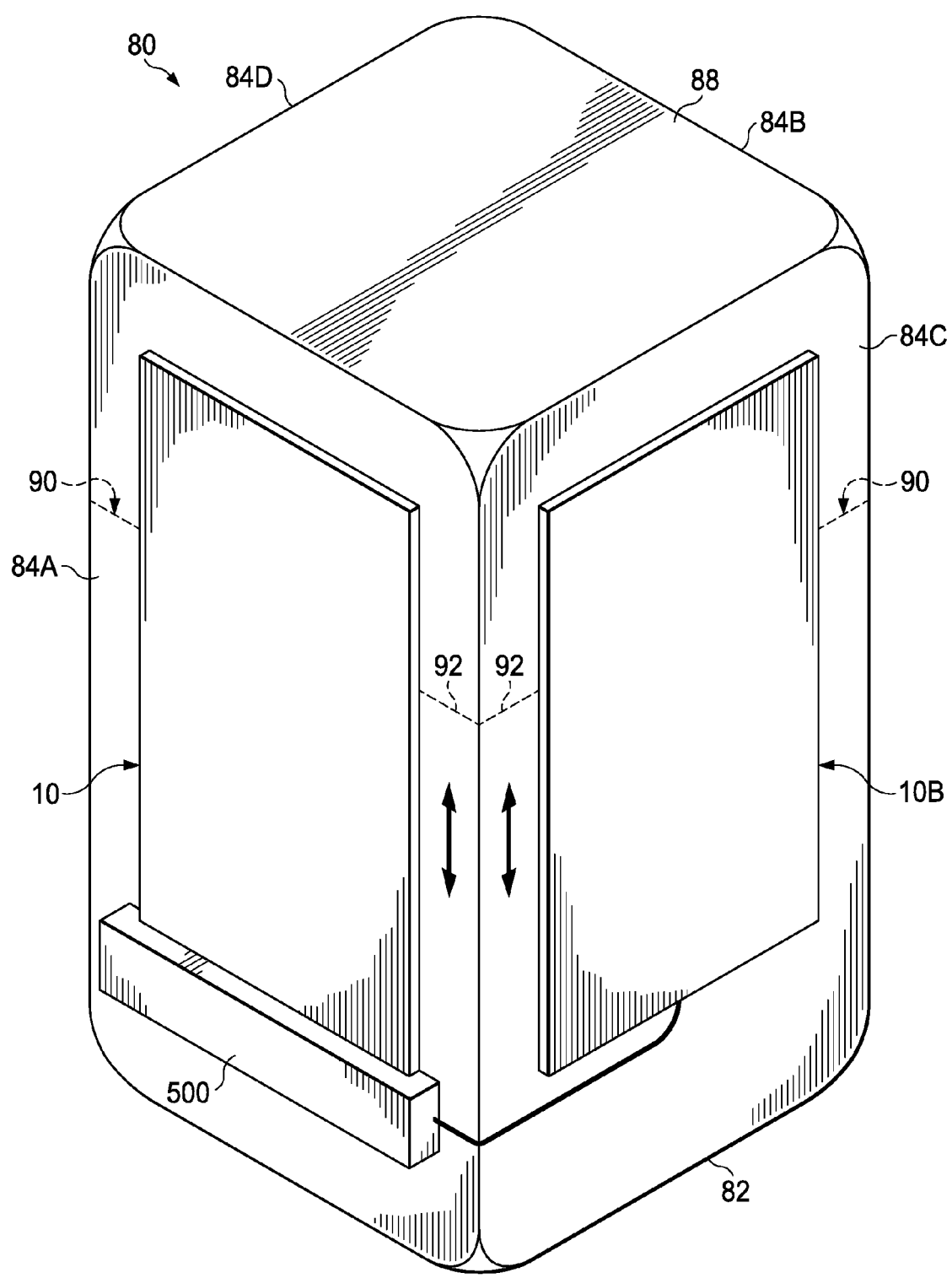
FIG. 18 is an isometric view of a fluid container configured with a sensor for sensing fluid level within the container using a sensor that is external to the container in accordance with an embodiment of the present invention.

FIG. 18 is an isometric view of a fluid container configured with a sensor for sensing fluid level within the container using a sensor that is external to the container in accordance with another embodiment of the present invention. What is shown in FIG. 18 is a container such as, for example, container 80 described with reference to FIG. 3. Container 80 has a floor 82 and sidewalls 84A, 84B, 84C, and 84D, wherein sidewalls 84A and 84B may be substantially parallel to each other and sidewalls 84C and 84D may be substantially parallel to each other and substantially perpendicular to sidewalls 84A and 84B. Fluid container 80 is configured to have a cavity or a hollow 86 bounded by floor 82 and sidewalls 84A-84D. Fluid container 80 may have a top or ceiling 88. Fluid 90 having fluid surface 92 is shown in fluid container 80.

A vibration motor 500 is positioned adjacent to sidewall 84A and a sensor such as, for example, sensor 10 described with reference to FIG. 1 is mounted to vibration motor 500 and positioned adjacent to sidewall 84A. Vibration motor 500 causes sensor 10 to vibrate or move up and down (indicated by arrows 504A) relative to floor 82 and top 88 of fluid container 80. Movement of sensing elements 30, 32, 24, and 26 may aid in determining the surface level of fluid 90 in which surface 92 is stationary or does not have ripples or waves. It should be appreciated that the sensor mounted to motor 500 is not a limitation of the present invention. For example sensor 100, sensor 150, sensor 160, sensor 200, or the like can be mounted to vibration motor 500.

In addition, a sensor such as for example, sensor 10 may be placed adjacent to sidewall 84C and vibration motor 500 may be configured to cause sensors 10 along sidewalls 84A and 84C to vibrate.

Figure 19:
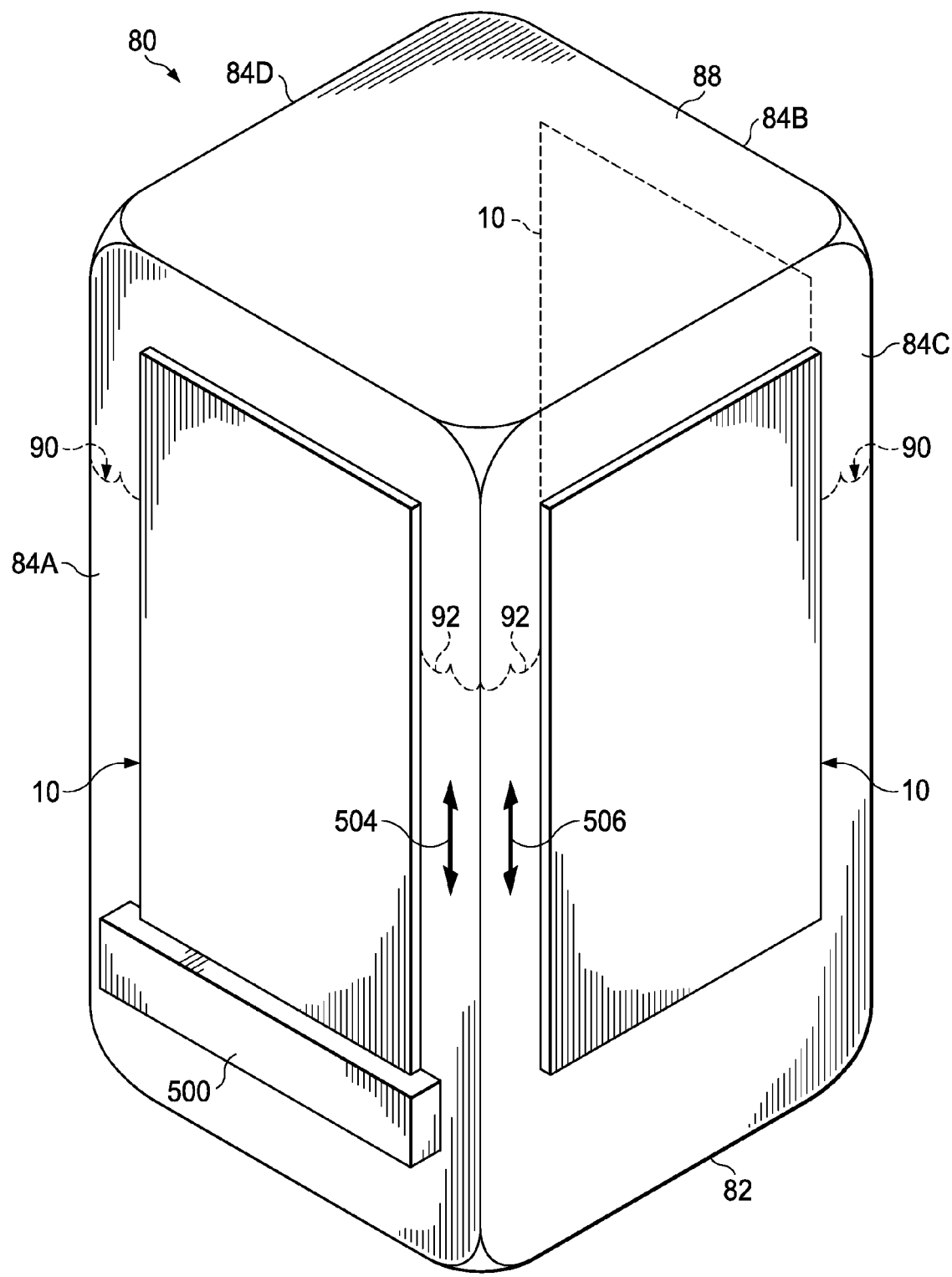
FIG. 19 is an isometric view of a fluid container configured with a sensor for sensing fluid level within the container using a sensor that is external to the container in accordance with an embodiment of the present invention.

FIG. 19 is an isometric view of a fluid container configured with a sensor for sensing fluid level within the container using a sensor that is external to the container in accordance with another embodiment of the present invention. In FIG. 19, a sensor 10 may be placed adjacent to sidewall 84C and another sensor 10 may be placed along sidewall 84C and vibration motor 500 may be configured to cause sensors 10 along sidewalls 84A, 84B, and 84C to vibrate.

Figure 20:
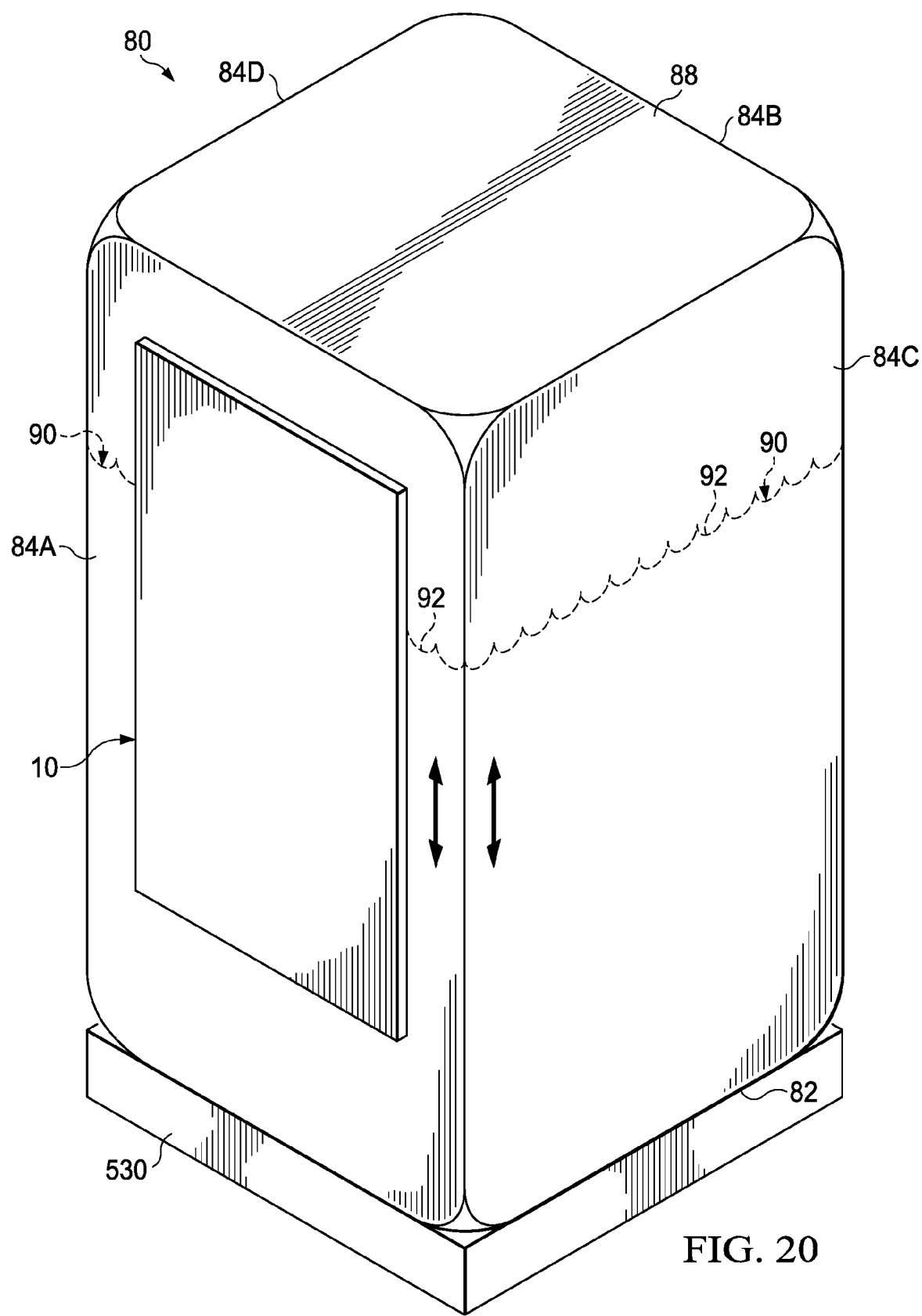
FIG. 20 is an isometric view of a fluid container configured with a sensor for sensing fluid level within the container using a sensor that is external to the container in accordance with an embodiment of the present invention.

FIG. 20 is an isometric view of a fluid container 80 configured with a sensor for sensing fluid level within the container using a sensor 10 that is external to the container in accordance with another embodiment of the present invention. In FIG. 20, a vibration motor 530 is used to cause fluid container 80 to vibrate. Container 80 is shown as being placed on vibration motor 530. Alternatively, vibration motor 530 may be placed on container 80.

By now it should be appreciated that a fluid level detector and method for detecting the fluid level within a tank have been provided. Although the sensor level has been shown as being determined using analog signals, this is not a limitation of the present invention. For example, the sensor signal may be converted to digital signals and the fluid level determined using the digital signals.

According to aspects of the disclosure described earlier, movement of sensing elements or vibration of a container (e.g., container 80) may aid in determining the surface level of a fluid. According to aspects described below, the surface level may be determined without causing a ripple in the liquid surface. As will be described in further detail below, the surface level may be determined by calibrating electrostatic capacitance at one or more sensors.

For example, sensors may be calibrated at one or more instances. During an instance, the capacitance of one sensor (a first sensor) is measured. The measured capacitance is compared against a reference value. For example, the reference value may be a capacitance of the same sensor measured at an earlier time (e.g., when the container was empty). As another example, the reference value may be a capacitance of a second sensor. The capacitance of the second sensor may be independent of the fluid level at the container. The capacitance of the second sensor need not be measured when the container was empty. For example, the capacitance of the second sensor may be measured at any time before the capacitance of the first sensor is measured.

If the measured capacitance of the first sensor differs from the reference value, then it may be determined that the fluid level is at the level of the first sensor (e.g., it may be determined that fluid is present at the level of the first sensor). If the measured capacitance does not differ from the reference value by that amount, then it may be determined that the fluid level is not at the level of the first sensor (e.g., it may be determined that fluid is not present at the level of the first sensor).

The described calibration and comparison may occur at each of two or more instances. By repeating these processes in an iterative manner, stabilized liquid surface detection may be achieved. The stabilized surface detection may be achieved without causing either a substance (inside a container) or a sensing element (outside the container) to move relative to the other.

Figure 21:
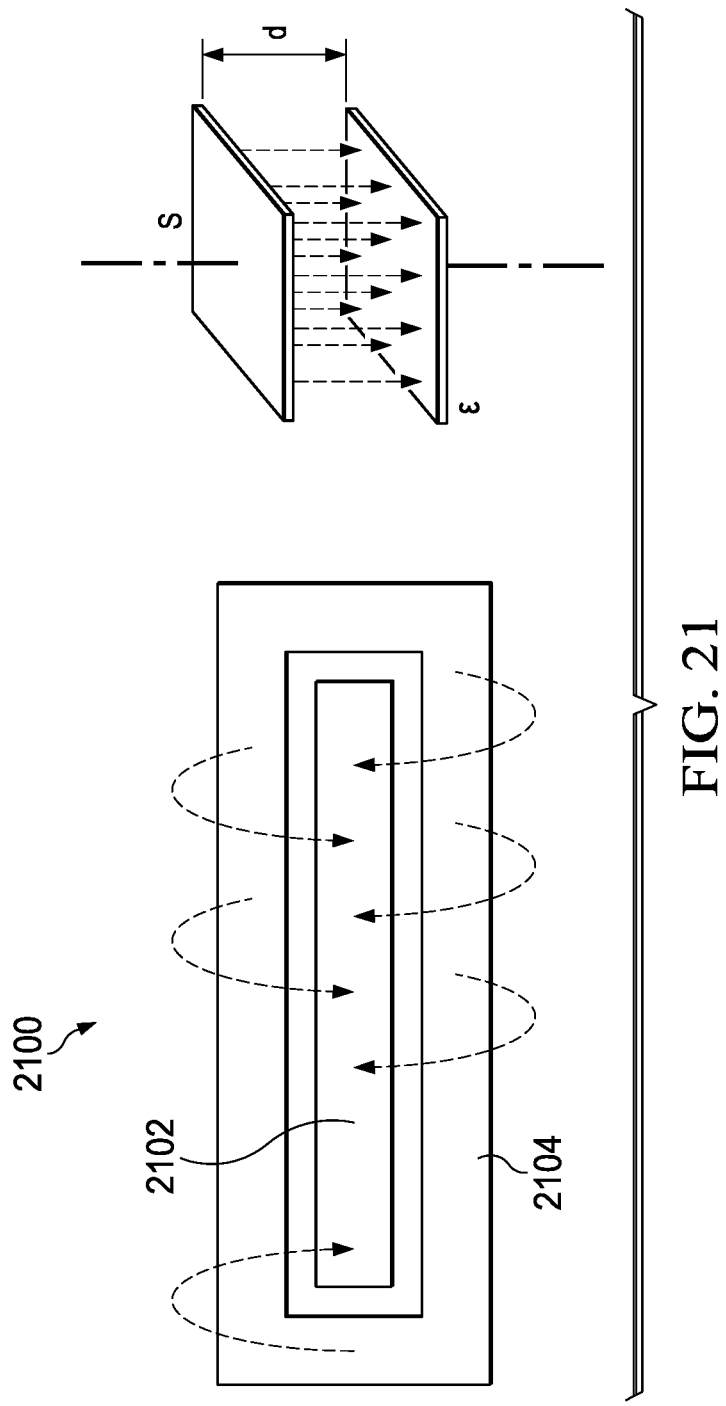
FIG. 21 illustrates a top view of an example of a sensing element.

FIG. 21 illustrates a top view of an example of a sensing element 2100. The sensing element 2100 includes an input pad 2102 and a drive pad 2104. The input pad 2102 and the drive pad 2104 are spaced apart from each other. For example, the input pad 2101 and the drive pad 2104 may be spaced apart from each other by a dielectric material or air.

The drive pad 2104 and input pad 2102 form a capacitor. When a voltage is applied between the drive pad 2104 and the input pad 2102, the capacitor becomes charged. One pad (e.g., the input pad 2102) acquires a negative charge, and the other pad (e.g., the drive pad 2104) acquires an equal amount of positive charge. Accordingly, an electric line of force (e.g., an electric field) is present between the two pads.

With continued reference to FIG. 21, the pads 2102, 2104 may be modeled as two plates. The capacitance C of the capacitor may be equal to $\varepsilon S/d$, where $\varepsilon$ denotes the permittivity in the spacing (separation) between the two plates, S denotes the surface area of each plate, and d denotes the distance between the plates.

Figure 22:
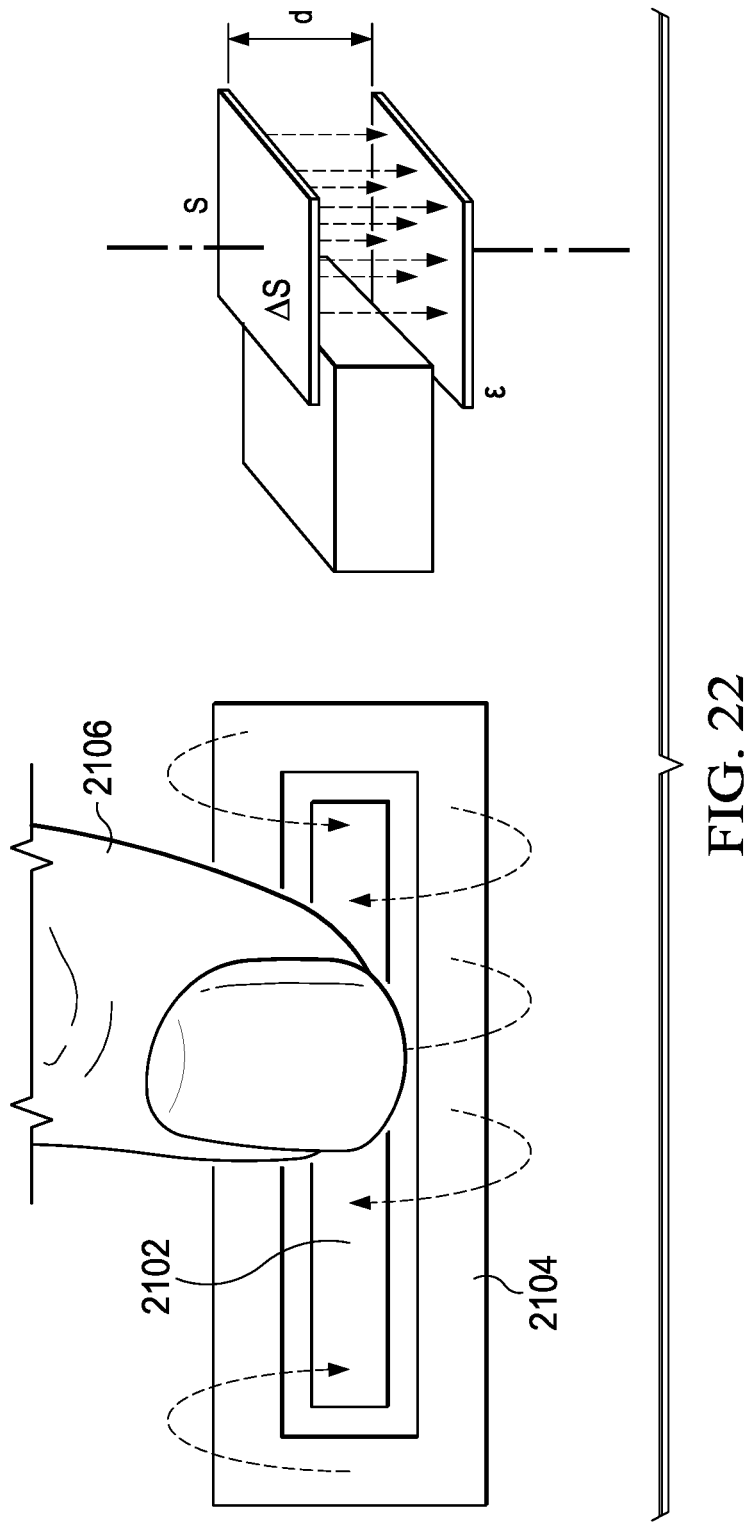
FIG. 22 illustrates a top view of a substance (dielectric) placed in a separation between an input pad and a drive pad of the sensing element.

FIG. 22 illustrates a top view of a substance (dielectric) placed in the separation between the input pad 2102 and the drive pad 2104. When the substance (e.g., finger 2106) is placed in this separation, electric charge flows less readily than in air. As the substance fills the separation, the capacitance C of the capacitor is increased by an amount $\Delta C$. Therefore, the effective capacitance of the capacitor becomes $C+\Delta C$. For example, while air has a permittivity of around 1, water has a permittivity of around 80. Therefore, when a substance such as water (rather than air) fills the separation between the input pad 2102 and the drive pad 2104, the value of C (as calculated using the equation $C=\varepsilon S/d$) increases.

Figure 23:
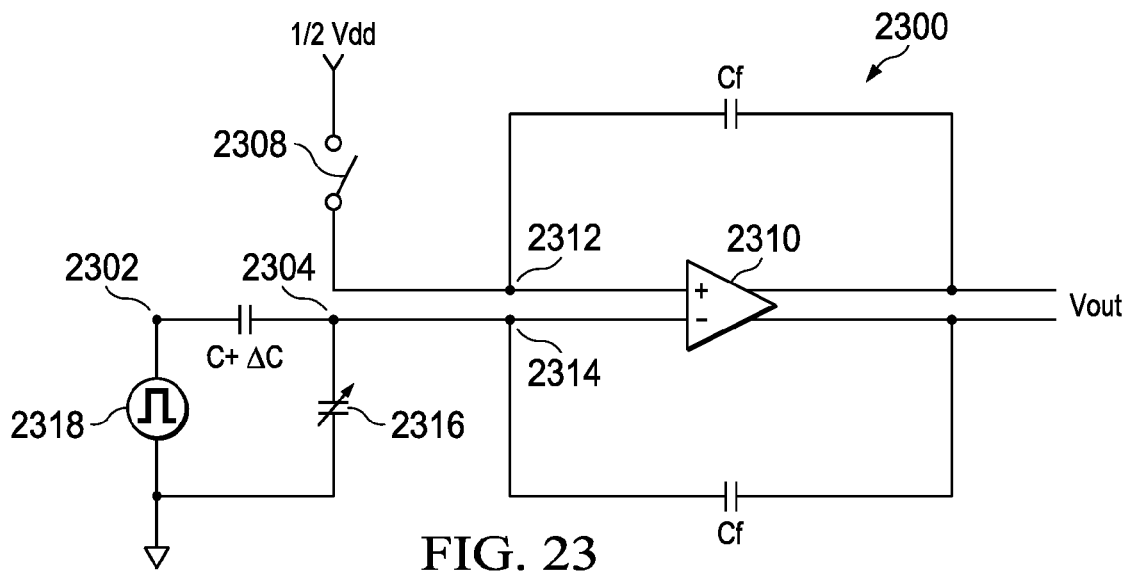
FIG. 23 illustrates a circuit schematic of a device that includes the sensing element.

FIG. 23 illustrates a circuit schematic of a device 2300 that includes the sensor 2100. The device 2300 may be an integrated circuit (IC). Node 2302 represents the drive pad 2104 of the sensor 2100. Node 2304 represents the input pad 2102 of the sensor 2100. The device 2300 also includes a switch 2308 and a differential amplifier 2310. The differential amplifier 2310 has input terminals 2312 and 2314. The device 2300 also includes a corrective capacitor (variable capacitor) 2316. In operation, the capacitance of the corrective capacitor 2316 adjusts according to the capacitance of the sensor 2100. For example, the capacitance of the corrective capacitor 2316 adjusts to be equal to the capacitance of the sensor 2100.

The sensor 2100 may be calibrated at each of one or more instances. During each calibration, the output of the differential amplifier 2310 is monitored. As will be described in more detail below, the capacitance of the corrective capacitor 2316 is noted when the output of the differential amplifier 2310 becomes logic low (e.g., 0V).

Calibration at the device 2300 will now be described with reference with a situation in which there is a lack of material (e.g., fluid) adjacent to the separation between the input pad 2102 and the drive pad 2104 (e.g., the sensor 2100 is outside of the container 80, and the container 80 is empty).

A pulse 2318 of amplitude Vdd is applied between the drive pad 2104 and a return for the pulse (e.g., GND). The capacitor formed by the drive pad 2104 and the input pad 2102 has a capacitance of C. During calibration, the capacitance of the corrective capacitor 2316 adjusts to be equal to the capacitance of the sensor 2100. When the two capacitance values are equal to each other, the voltage drop between the drive pad 2104 and the input pad 2102 becomes equal to the voltage drop across the corrective capacitor 2316. For example, when Vdd is applied between the drive pad 2104 and the return, both the voltage drop between the drive pad 2104 and the input pad 2102 and the voltage drop across the corrective capacitor 2316 become equal to Vdd/2.

In the above situation, the input at the input terminal 2314 of the differential amplifier 2310 becomes equal to Vdd/2. When the switch 2308 is closed, the input at the input terminal 2312 of the differential amplifier 2310 is also equal to Vdd/2. Accordingly, the inputs to the differential amplifier 2310 are equal to each other. Therefore, the output of the differential amplifier 2310 becomes logic low. This indicates that the capacitance of the corrective capacitor 2316 has adjusted to be equal to the capacitance of the sensor 2100. Accordingly, the capacitance of the corrective capacitor 2316 (C) is noted.

Calibration at the device 2300 will now be described with reference with a situation in which there is a presence of material (e.g., fluid) adjacent to the separation between the input pad 2102 and the drive pad 2104 (e.g., the sensor 2100 is outside of the container 80, and fluid in the container 80 is at the level of the sensor 2100).

A pulse of amplitude Vdd is applied between the drive pad 2104 and a return for the pulse (e.g., GND). The capacitor formed by the drive pad 2104 and the input pad 2102 has a capacitance of C+ΔC. The increase ΔC is due to the greater permittivity of the fluid relative to that of air. During calibration, the capacitance of the corrective capacitor 2316 adjusts to be equal to the capacitance of the sensor 2100. When the two capacitance values are equal to each other, the voltage drop between the drive pad 2104 and the input pad 2102 becomes equal to the voltage drop across the corrective capacitor 2316. For example, when Vdd is applied between the drive pad 2104 and the return, both the voltage drop between the drive pad 2104 and the input pad 2102 and the voltage drop across the corrective capacitor 2316 become equal to Vdd/2.

In the above situation, the input at the input terminal 2314 of the differential amplifier 2310 becomes equal to Vdd/2. When the switch 2308 is closed, the input at the input terminal 2312 of the differential amplifier 2310 is also equal to Vdd/2. Accordingly, the inputs to the differential amplifier 2310 are equal to each other. Therefore, the output of the differential amplifier 2310 is logic low. This indicates that the capacitance of the corrective capacitor 2316 has adjusted to be equal to the capacitance of the sensor 2100. Accordingly, the capacitance of the corrective capacitor 2316 (C+ΔC) is noted.

An initial measurement at the device 2300 may occur when the container 80 is empty. The capacitance of the corrective capacitor 2316 (e.g., C) is noted at this time. This value may be stored as a reference value.

During each of subsequent calibrations at the device 2300, the capacitance of the corrective capacitor 2316 is noted and is compared against the reference value. If there is little or no difference between the capacitance of the corrective capacitor 2316 and the reference value, then it may be determined that there is a lack of fluid adjacent to the separation between the input pad 2102 and the drive pad 2104 (e.g., the sensor 2100). Accordingly, it may be determined that the fluid surface is not at the level of the sensor 2100. If there is a larger difference between the capacitance of the corrective capacitor 2316 and the reference value, then it may be determined that there is a presence of fluid adjacent to the separation between the input pad 2102 and the drive pad 2104 (e.g., the sensor 2100). Accordingly, it may be determined that the fluid surface is at the level of the sensor 2100.

Figure 24:
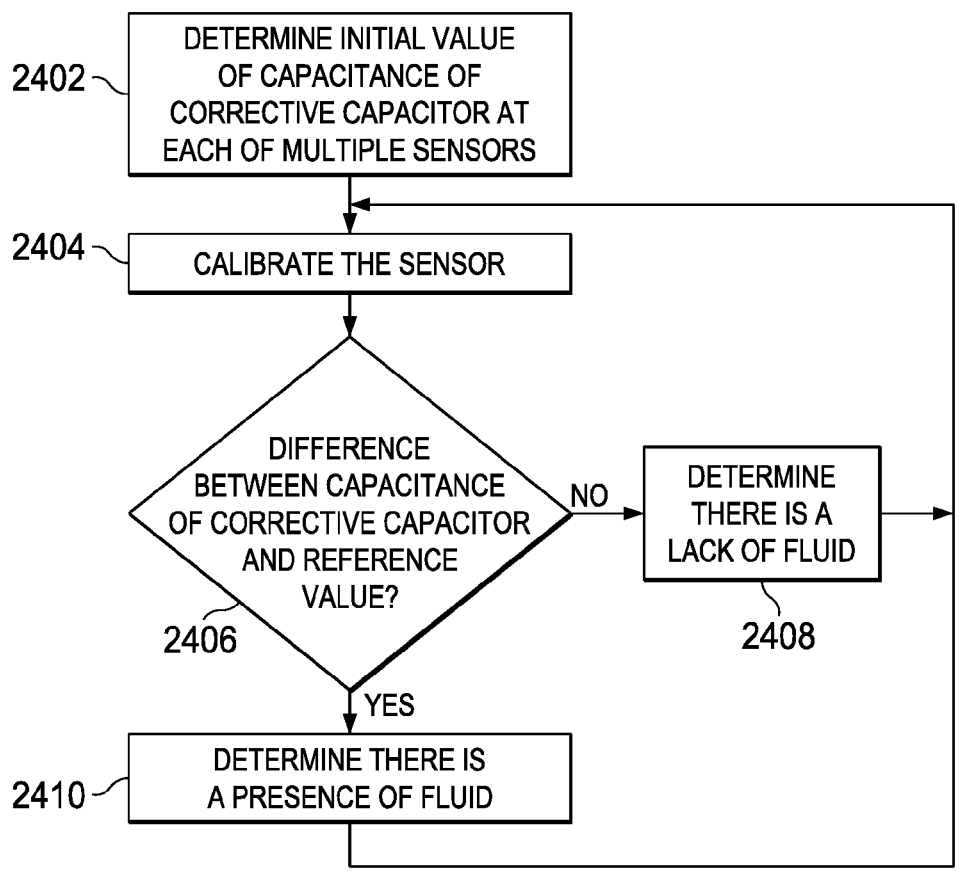
FIG. 24 illustrates a flowchart of determining a level of a fluid surface in a container.

FIG. 24 illustrates a flowchart of determining a level of a fluid surface in a container (e.g., container 80).

At step 2402, an initial value of the capacitance of a corrective capacitor (e.g., corrective capacitor 2316) is determined. During this determination, the container is empty. The determined value is stored (e.g., at microprocessor 26) as a reference value.

The above step may be performed (e.g., by sensor circuit 24) for each of multiple sensors (e.g., sensor 2100), such that each sensor has a corresponding reference value. The multiple sensors may be arranged vertically on a sensor board such that a sensor is above an adjacent sensor (see, e.g. arrangement of sensing elements 30, 32, 34, 36 of FIG. 3).

At step 2404, the sensor is calibrated. For example, as described earlier with reference to FIG. 23, the capacitance of the corrective capacitor 2316 adjusts to be equal to the capacitance of the sensor 2100, such that the output of the differential amplifier 2310 are equal to each other. The value of the capacitance of the corrective capacitor 2316 is noted.

The above step may be performed (e.g., by sensor circuit 24) for each of the multiple sensors.

At step 2406, the value of the capacitance of the corrective capacitor is compared against the reference value of step 2402.

The above step may be performed (e.g., by microprocessor 26) for each of the multiple sensors.

For a given sensor, if there is little or no difference between the capacitance of the corrective capacitor 2316 and the reference value, then it is determined that there is a lack of fluid adjacent to the sensor (e.g., the separation between the input pad 2102 and the drive pad 2104) (step 2408). Accordingly, it is determined that the fluid surface is not at the level of the sensor.

If there is a larger difference between the capacitance of the corrective capacitor and the reference value, then it may be determined that there is a presence of fluid adjacent to the sensor (step 2410). Accordingly, it is determined that the fluid surface may be at the level of the sensor.

If the above condition is satisfied at two or more sensors, then, amongst these sensors, it is determined that the sensor that is positioned highest on the sensor board (see, e.g. arrangement of sensing elements 30, 32, 34, 36 of FIG. 3) indicates the location of the fluid surface.

As described earlier, the reference value (of step 2402) corresponds to a particular sensor. In more detail, the reference value reflects the capacitance of the corrective capacitor of the particular sensor, as measured when the container (e.g., container 80) is empty.

According to other aspects, the reference value may reflect the corrective capacitor of another sensor. This other sensor may be similar to sensor 2100 and, therefore, may have a capacitor similar to that formed by drive pad 2104 and input pad 2102. The capacitance of this other capacitor is independent of the fluid level (or fill level) of the container. In other words, the level to which the container is filled does not affect the capacitance (and, therefore, the capacitance of the corrective capacitor 2316) of this other sensor.

Figure 25:
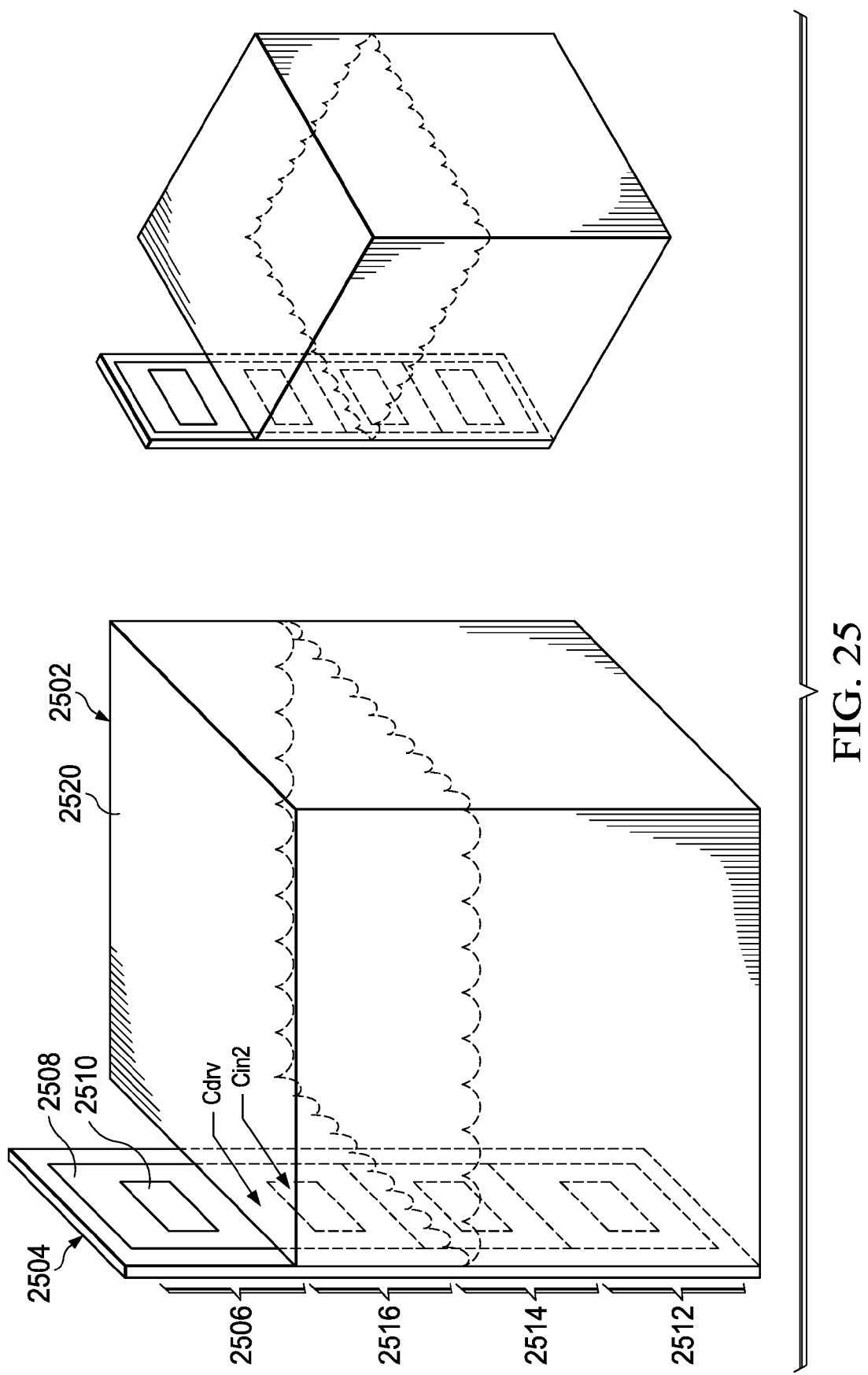
FIG. 25 illustrates perspective views of a container and a sensor board.

FIG. 25 illustrates perspective views of a container 2502 and a sensor board 2504. The sensor board 2504 has a height that is greater than the height of the container 2502. Sensor 2506 includes drive pad 2508 and input pad 2510. The position of sensor 2506 on the sensor board 2504 is above the top 2520 (or ceiling) of the container 2502. Therefore, the capacitance of sensor 2506 (e.g., of the capacitor formed by drive pad 2508 and input pad 2510) is independent of the fill level of the container. If the sensor 2506 is electrically similar to sensors 2512, 2514, 2516, then the capacitance (of the corrective capacitor) of sensor 2506 may be stored as the reference value (see step 2402) corresponding to these sensors.

The above-noted capacitance of sensor 2506 need not be determined when the container 2502 is empty. Rather, the capacitance of sensor 2506 may be determined, for example, during initial calibration of sensors 2512, 2514, 2516.

Figure 26:
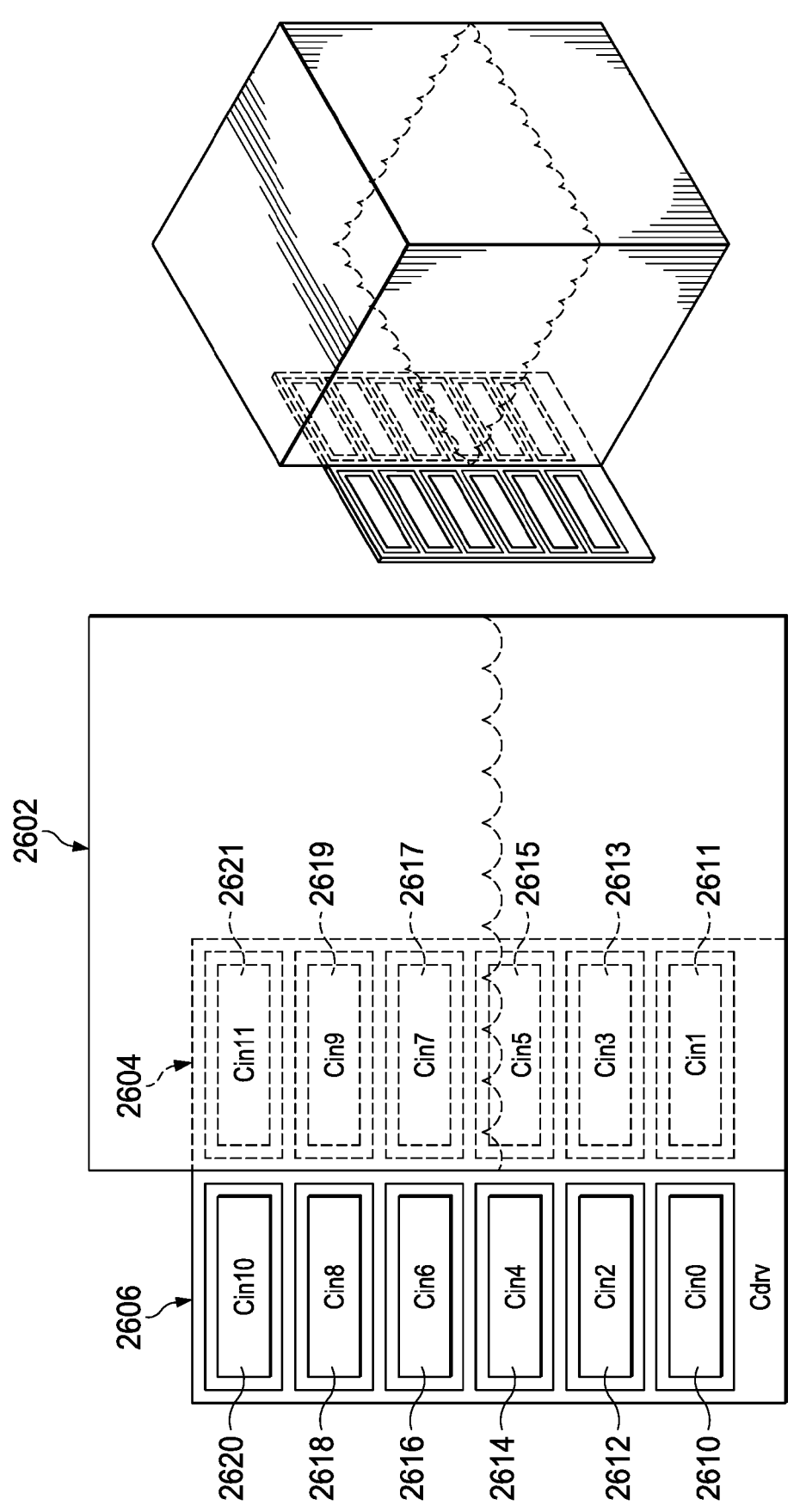
FIG. 26 illustrates side and perspective views of a container and sensor boards.

FIG. 26 illustrates side and perspective views of a container 2602 and sensor boards 2604, 2606. Sensor board 2604 directly faces a sidewall of the container 2602. Both sensor board 2604 and sensor board 2606 are arranged along a same plane. However, sensor board 2606 does not directly face any sidewall of the container 2602. Sensors 2610, 2612, 2614, 2616, 2618, and 2620 are positioned on sensor board 2606. Because sensor board 2606 does not directly face any sidewall of the container 2602, the capacitances of the sensors 2610, 2612, 2614, 2616, 2618, and 2620 (e.g., of the capacitors formed by the corresponding drive pads and input pads) are independent of the fill level of the container 2602. The sensors 2610, 2612, 2614, 2616, 2618 and 2620 may be electrically similar, respectively, to sensors 2611, 2613, 2615, 2617, 2619 and 2621 located on sensor board 2604. In this situation, the capacitances of sensors 2610, 2612, 2614, 2616, 2618 and 2620 may be stored as the reference values for sensors 2611, 2613, 2615, 2617, 2619 and 2621, respectively.

The above-noted capacitances of sensors 2610, 2612, 2614, 2616, 2618 and 2620 need not be determined when the container 2602 is empty. Rather, these capacitances may be determined, for example, during initial calibration of sensors 2611, 2613, 2615, 2617, 2619 and 2621. As described earlier, sensors 2610, 2612, 2614, 2616, 2618, 2620 may be used as reference pads for calibration. For example, after sensor 2620 is calibrated, sensor 2621 may be compared with sensor 2620. If the capacitance of sensor 2620 is equal to the capacitance of sensor 2621, then it is determined that there is a lack of fluid adjacent to the sensor 2621. Similarly, sensor 2611 may be compared with sensor 2610. If there is a difference between the capacitance of sensor 2611 and the capacitance of sensor 2610, then it may be determined that there is a presence of fluid at the level of sensor 2611.

Figure 27A:
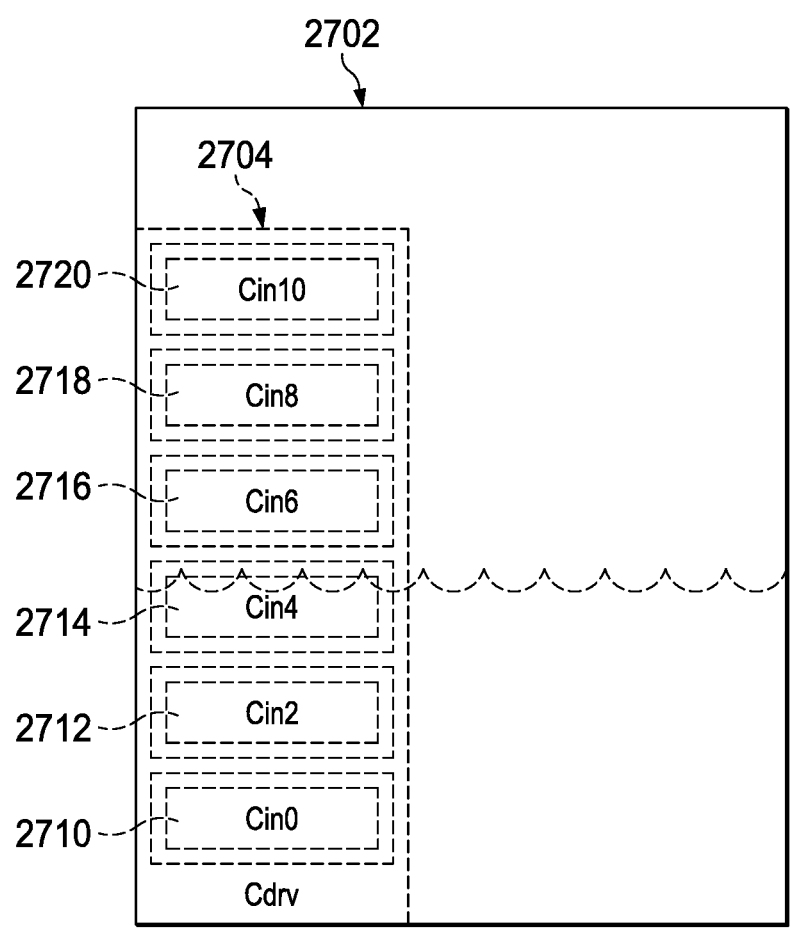
FIG. 27A illustrates side views of a container and a sensor board.

FIG. 27A illustrates side views of a container 2702 and a sensor board 2704. A first surface (front surface) of the sensor board 2704 directly faces a sidewall of the container 2702. Sensors 2710, 2712, 2714, 2716, 2718, and 2720 are positioned on the front surface of the sensor board 2704.

Figure 27B:
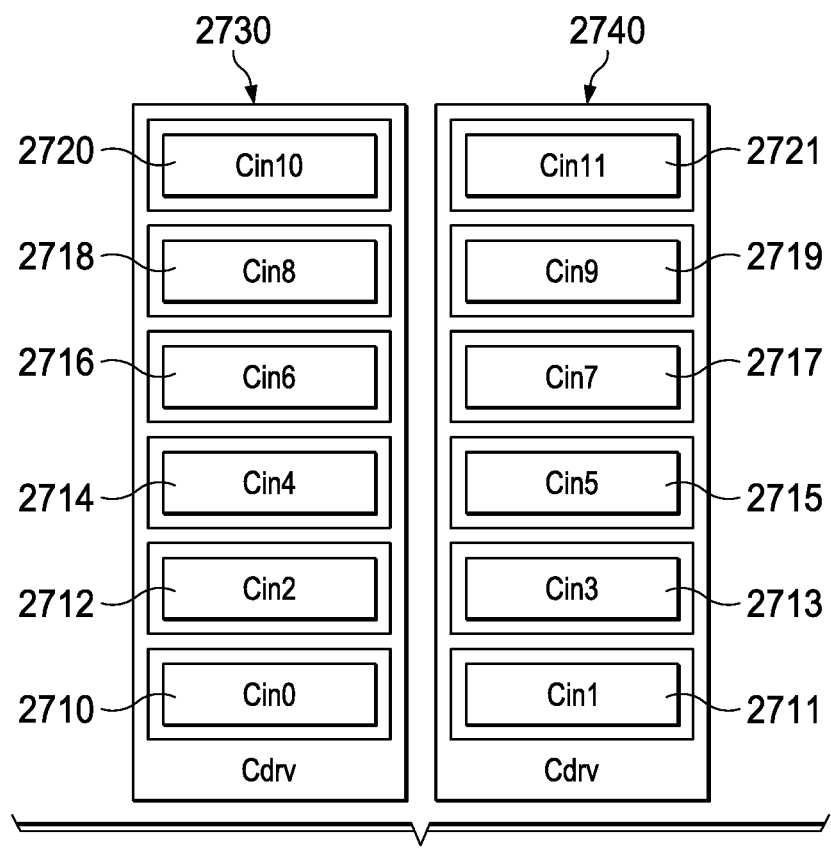
FIG. 27B illustrates side views of a front surface and an opposite surface (rear surface) of the sensor board.

FIG. 27B illustrates side views of the front surface 2730 and an opposite surface 2740 (rear surface) of the sensor board 2704. The rear surface does not directly face a sidewall of the container 2702. Rather, the rear surface faces away from the container 2702. Sensors 2711, 2713, 2715, 2717, 2719 and 2721 are positioned on the rear surface of the sensor board 2704.

Because the rear surface 2740 does not directly face any sidewall of the container 2702, the capacitances of the sensors 2711, 2713, 2715, 2717, 2719 and 2721 (e.g., of the capacitors formed by the corresponding drive pads and input pads) are independent of the fill level of the container 2702. The sensors 2711, 2713, 2715, 2717, 2719 and 2721 may be electrically similar, respectively, to sensors 2710, 2712, 2714, 2716, 2718, and 2720 located on the front surface 2730 of the sensor board 2704. In this situation, the capacitances of sensors 2711, 2713, 2715, 2717, 2719 and 2721 may be stored as the reference values for sensors 2710, 2712, 2714, 2716, 2718, and 2720, respectively.

The above-noted capacitances of sensors 2711, 2713, 2715, 2717, 2719 and 2721 need not be determined when the container 2702 is empty. Rather, these capacitances may be determined, for example, during initial calibration of sensors 2710, 2712, 2714, 2716, 2718, and 2720.

FIG. 27C illustrates partial perspective views of the sensor board 2704 and the container 2702. With reference to FIG. 27C, rear surface 2740 faces away from the container 2702. Front surface 2730 directly faces a sidewall of the container 2702.

Figure 28A:
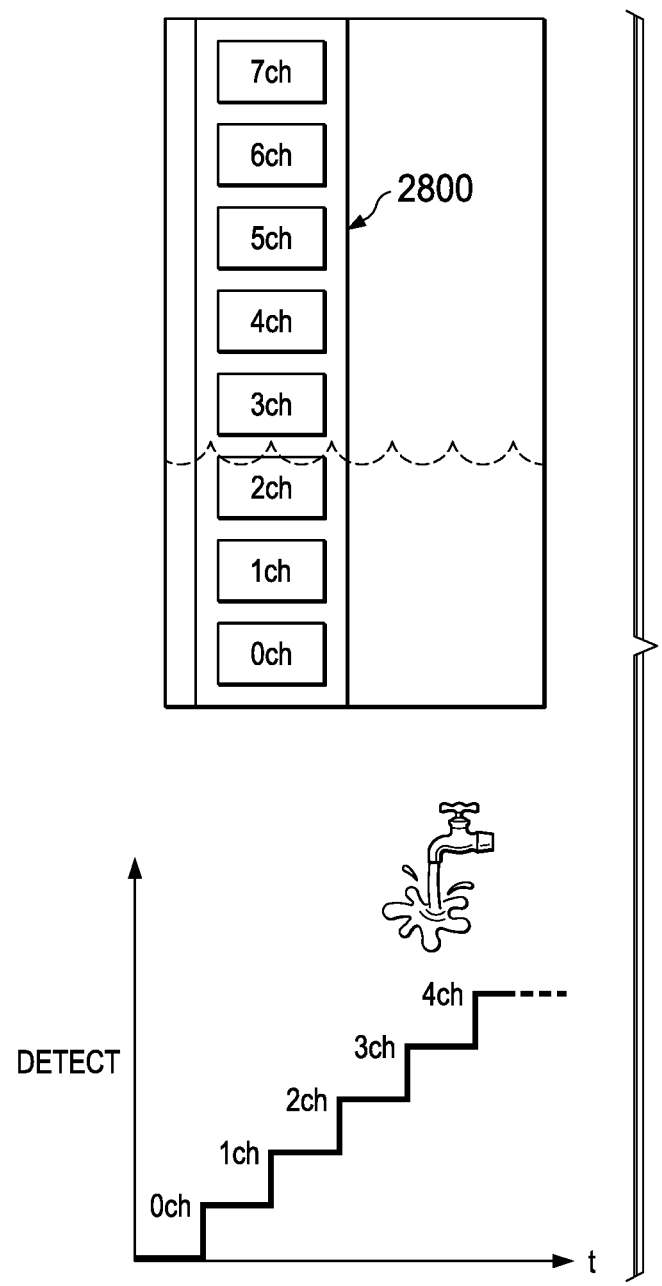
FIG. 28A illustrates a configuration of one sensor circuit.

A particular number of sensors provides a corresponding level of resolution. FIG. 28A illustrates a configuration of a sensor circuit 2800. The sensor circuit 2800 may be an integrated circuit (IC). The sensor circuit 2800 has 8 sensors or channels. As disclosed earlier, the sensor circuit may be used to detect the fluid level of a container. With reference to FIG. 28A, the sensor circuit 2800 may be used to detect the fluid level according to any of 8 possible levels.

Figure 28B:
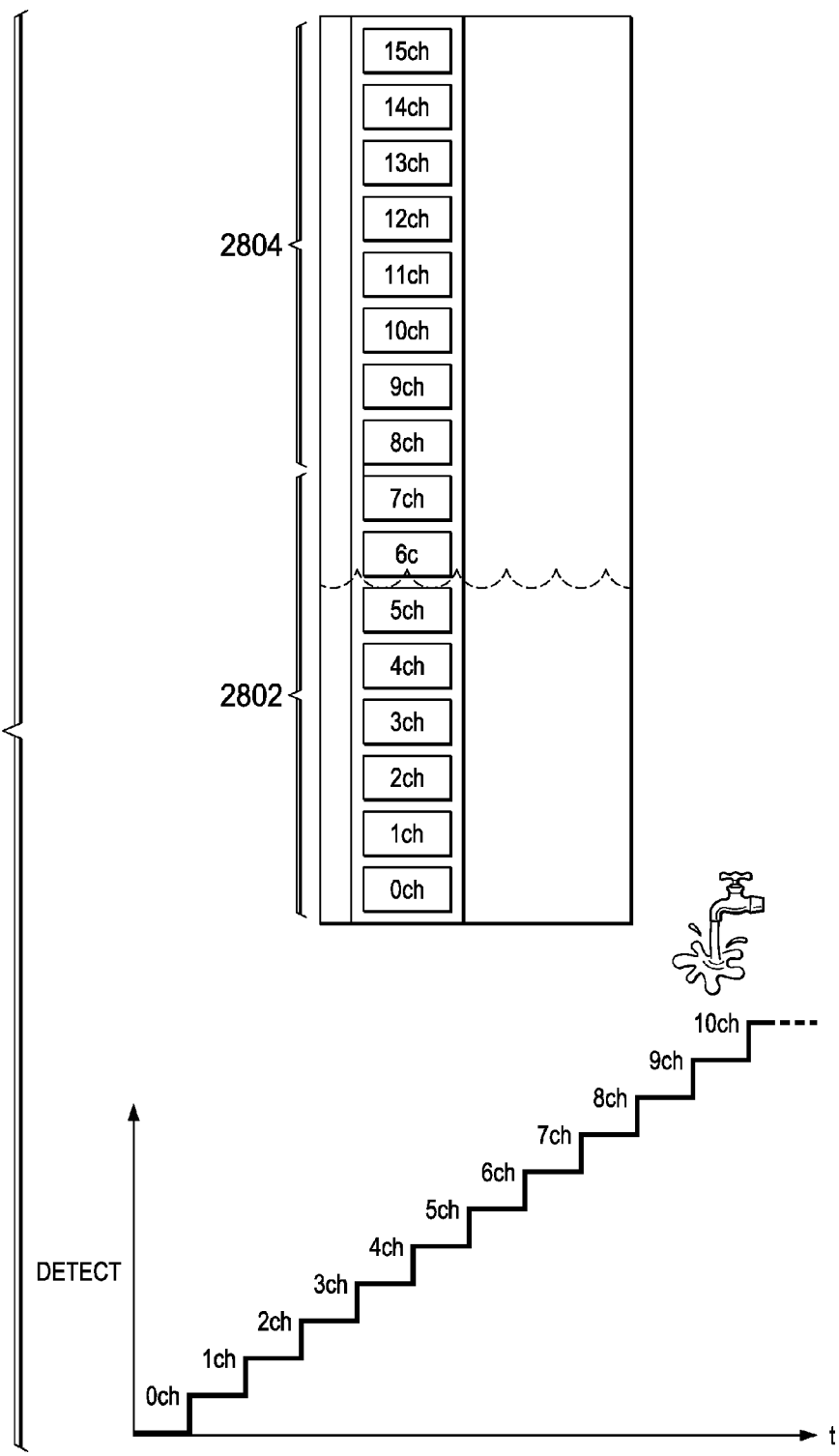
FIG. 28B illustrates a configuration of two sensor circuits.

In some situations, a finer level of resolution may be preferred. FIG. 28B illustrates a configuration of two sensor circuits 2802, 2804. Each of the sensor circuits 2802, 2804 may be an IC. Each of the sensor circuits 2802, 2804 has 8 sensors or channels. The sensor circuits 2802, 2804 may be combined to detect the fluid level of a container. With reference to FIG. 28B, the sensor circuit 2804 may be positioned above the sensor circuit 2802 with respect to the height of a container. Accordingly, the combination of the sensor circuits 2802, 2804 may be used to detect the fluid level according to any of 16 possible levels. However, using a greater number of sensor circuits may involve an increased cost.

Figure 28C:
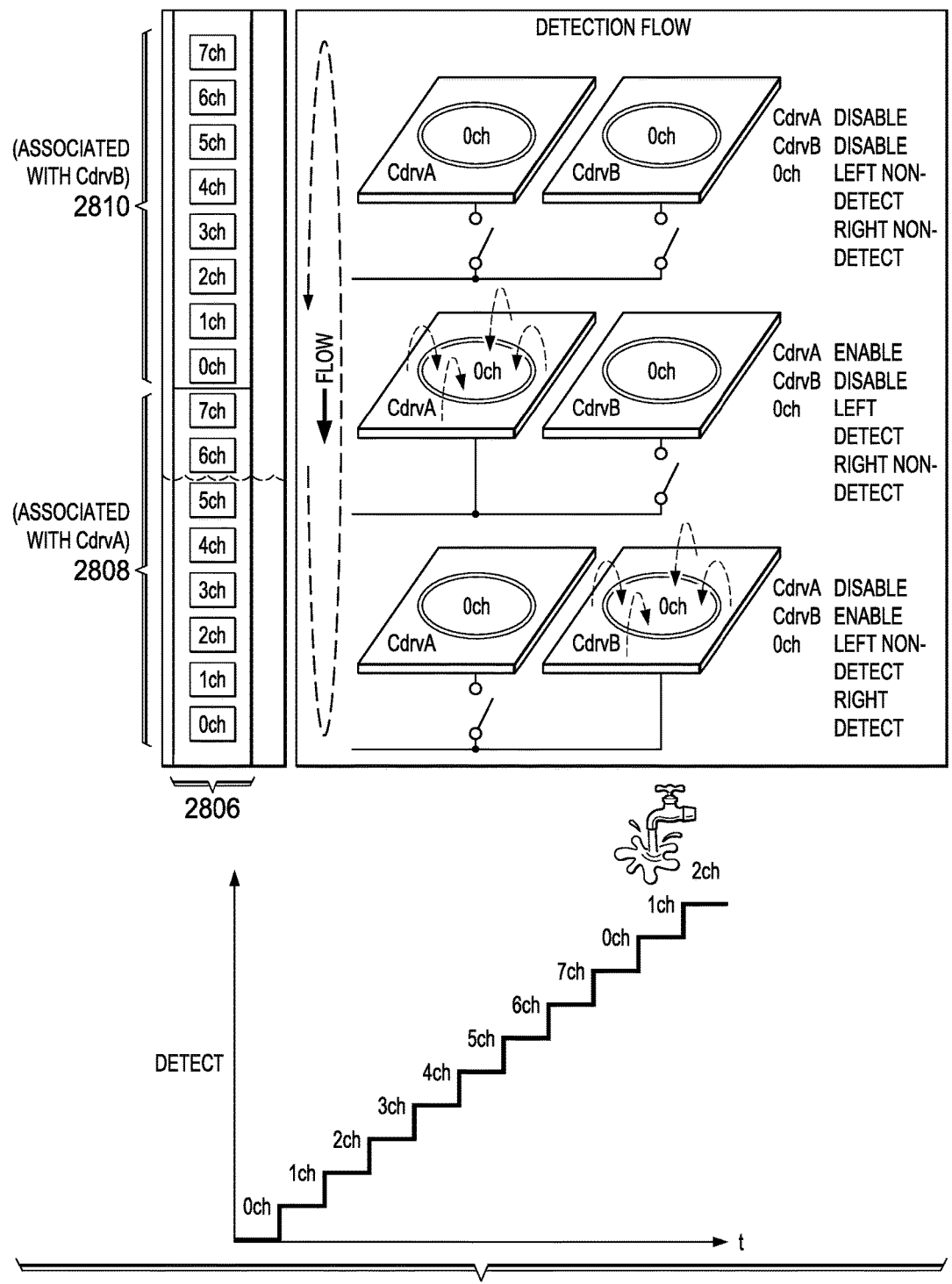
FIG. 28C illustrates a configuration of one sensor circuit.

According to one aspect, a greater number of sensors may be associated with a single sensor circuit. FIG. 28C illustrates a configuration of a sensor circuit 2806. The sensor circuit 2806 may be an IC. The sensor circuit 2806 has 16 sensors or channels. A first group 2808 of 8 sensors is associated with a first drive pad CdrvA. A second group 2810 of 8 sensors is associated with a second drive pad CdrvB. At most one of the drive pads CdrvA, CdrvB is by the sensor circuit 2806 at a given time. When the drive pad CdrvA is driven by the sensor circuit 2806, the first group 2808 of sensors may be used to detect the fluid level according to any of 8 possible levels. When the drive pad CdrvB is driven by the sensor circuit 2806, the second group 2810 of sensors may be used to detect the fluid level according to any of another 8 possible levels. By driving either the drive pad CdrvA or the drive pad CdrvB, the sensor circuit 2806 may be used to detect the fluid level according to any of a total of 16 possible levels.

With continued reference to FIG. 28C, at a given time, both the drive pad CdrvA and the drive pad CdrvB are not driven by the sensor circuit 2806. As illustrated in FIG. 28C, when the drive pad CdrvA and the drive pad CdrvB are not driven by the sensor circuit 2806, neither channel Och (of sensor 2808 associated with the drive pad CdrvA) nor channel Och (of sensor 2810 associated with the drive pad CdrvB) is able to detect the presence or absence of fluid.

At a later time, the drive pad CdrvA may be driven by the sensor circuit 2806 (while the drive pad CdrvB is not driven by the sensor circuit 2806). Accordingly, an electric field exists between the drive pad CdrvA and the input pads of the corresponding 8 sensors. As illustrated in FIG. 28C, when the drive pad CdrvA is driven by the sensor circuit 2806, channel Och (of sensor 2808 associated with the drive pad CdrvA) may detect the presence or absence of fluid. Because the drive pad CdrvB is not driven by the sensor circuit 2806, channel Och (of sensor 2810 associated with the drive pad CdrvB) is not able to detect the presence or absence of fluid.

At a later time, the drive pad CdrvB may be driven by the sensor circuit 2806 (while the drive pad CdrvA is not driven by the sensor circuit 2806). Accordingly, an electric field exists between the drive pad CdrvB and the input pads of the corresponding 8 sensors. As illustrated in FIG. 28C, when the drive pad CdrvB is driven by the sensor circuit 2806, channel Och (of sensor 2810 associated with the drive pad CdrvB) may detect the presence or absence of fluid. Because the drive pad CdrvA is not driven by the sensor circuit 2806, channel Och (of sensor 2808 associated with the drive pad CdrvA) is not able to detect the presence or absence of fluid.

Figure 29:
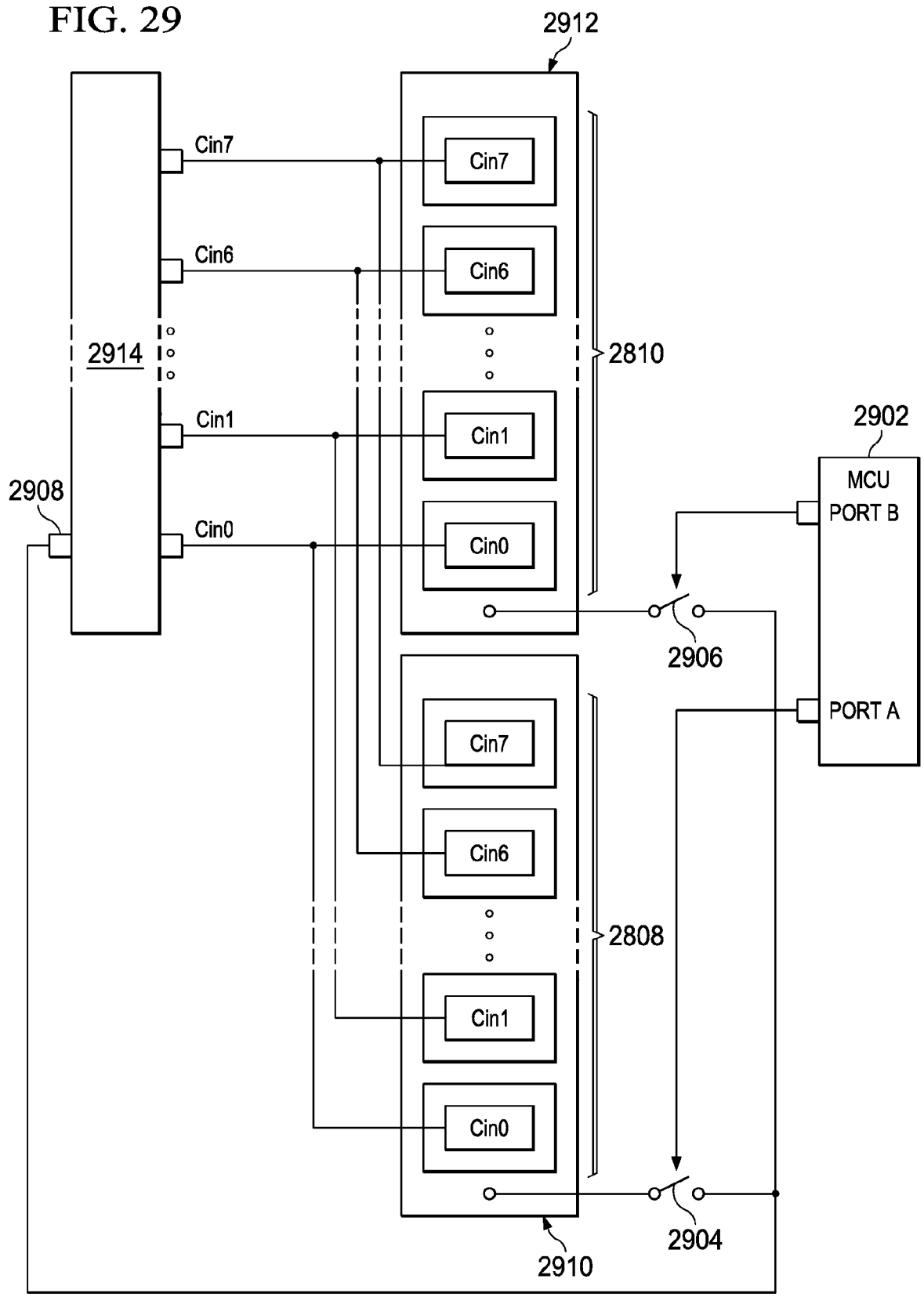
FIG. 29 illustrates a block diagram of a device that includes a sensor circuit.

FIG. 29 illustrates a block diagram of a device that includes a touch IC 2914. The touch IC 2914 is coupled to the first group 2808 of sensors and the second group 2810 of sensors. The touch IC 2914 has an output 2908. As will be explained in more detail below, the output 2908 drives either drive pad 2910 or drive pad 2912.

A microprocessor 2902 controls the opening and closing of switches 2904 and 2906. The microprocessor 2902 closes the switch 2904 to select driving of the drive pad 2910 by the touch IC 2914. The microprocessor 2902 closes the switch 2906 to select driving of the drive pad 2912 by the touch IC 2914. When switches 2904, 2906 are both open, the output 2908 does not drive either the drive pad 2910 or the drive pad 2912. Therefore, neither the drive pad 2910 nor the drive pad 2912 is enabled. Accordingly, neither the sensors of the first group 2808 nor the sensors of the second group 2810 are able to detect the presence or absence of fluid.

At a later time, the switch 2904 is closed, and the switch 2906 remains open. Accordingly, the output 2908 drives the drive pad 2910 and does not drive the drive pad 2912. Accordingly, the drive pad 2910 is enabled, and the drive pad 2912 remains disabled. The sensors of the first group 2808 are able to detect the presence or absence of fluid. However, the sensors of the second group 2810 are not able to detect the presence or absence of fluid.

At a later time, the switch 2904 is opened, and the switch 2906 is closed. Accordingly, the output 2908 drives the drive pad 2912 and does not drive the drive pad 2910. Accordingly, the drive pad 2912 is enabled, and the drive pad 2910 is disabled. The sensors of the second group 2810 are able to detect the presence or absence of fluid. However, the sensors of the first group 2808 are not able to detect the presence or absence of fluid.

Various aspects of the disclosure have been described with respect to determining the surface level of a fluid in a container. It is understood that such aspects may be equally applicable in determining the surface level of not only fluids but also other substances that may be contained in a container. Examples of such substances include gels, solids, and powders. For example, such substances may include food products (e.g., rice, sugar, salt, flour), oil, gasoline, chemical products, products in the form of a powder such as printer toner, and gas.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A method for detecting a fluid level, comprising:
   providing a fluid container having a cavity;
   coupling a first sensor to the fluid container, the first sensor protected from a fluid in the cavity and positioned at a first vertical level of the fluid container;
   operating a vibration motor to cause movement of either the first sensor or the fluid container; and
   using the first sensor to detect the fluid level upon causing the movement of either the first sensor or the fluid container.

2. The method of claim 1, wherein coupling the first sensor to the fluid container includes coupling the first sensor exterior to the cavity.

3. The method of claim 1, wherein providing the fluid container includes providing the fluid container manufactured from a non-metallic material.

4. The method of claim 1, wherein providing the fluid container includes providing the fluid container manufactured from a polymeric material.

5. The method of claim 1, wherein using the first sensor to detect the fluid level includes contactlessly detecting the fluid level in the cavity.

6. The method of claim 1, wherein using the first sensor to detect the fluid level includes differentially sensing the fluid level.

7. The method of claim 1, wherein the sensor includes an array of regularly-spaced electrodes each surrounded by a common drive electrode.

8. The method of claim 7, wherein said using includes selectively coupling each electrode in the array to a variable capacitor and an input of a differential amplifier, the differential amplifier having a second input coupled to a reference voltage.

9. The method of claim 8, wherein said using further includes comparing an output of the differential amplifier to a reference during said movement to detect the fill level relative to each electrode in the array.

10. The method of claim 1, further including generating a detection signal in response to a fluid surface ripple.

11. An apparatus for detecting a fill level, comprising:
    a container having a cavity;
    a sensor positioned at the container exterior to the cavity to capacitively sense the fill level of a fluid in the cavity relative to the sensor; and
    a vibration motor causing movement of the sensor relative to the container.

12. The apparatus of claim 11, wherein the container has a fixed position and the motor moves the sensor.

13. The apparatus of claim 11, wherein the sensor has a fixed position and the motor moves the container.

14. The apparatus of claim 11, wherein the vibration motor comprises at least one of: a piezoelectric element, and an eccentric weight.

15. The apparatus of claim 11, wherein the sensor includes at least one electrode and a circuit coupled to the at least one electrode to generate a detection signal in response to the at least one electrode crossing the fill level.

16. An apparatus for detecting a fill level, comprising:
    a container having a cavity;
    a sensor positioned at the container exterior to the cavity to capacitively sense the fill level of a fluid in the cavity relative to the sensor, the sensor including an array of regularly-spaced electrodes each surrounded by a common drive electrode; and
    a motor causing movement of the sensor relative to the container.

17. The apparatus of claim 16, wherein each electrode in the array is selectively coupled to a variable capacitor and an input of a differential amplifier, the differential amplifier having a second input coupled to a reference voltage.

18. The apparatus of claim 17, further comprising:
an analog-to-digital converter that digitizes an output signal from the differential amplifier; and
a control circuit that adjusts the variable capacitor to match a capacitance of the selectively coupled electrode, iterating so as to detect the fill level relative to each electrode in the array.

19. The apparatus of claim 17, further comprising:
an analog-to-digital converter that digitizes an output signal from the differential amplifier; and
a control circuit that compares the digitized output signal for each electrode in the array to a reference to detect the fill level relative to each electrode in the array.

* * * * *